(12) United States Patent
Tanaka

(10) Patent No.: US 11,825,723 B2
(45) Date of Patent: Nov. 21, 2023

(54) TOUCH PANEL DISPLAY

(71) Applicant: Mikuni Electron Corporation, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 14 days.

(21) Appl. No.: 17/385,429

(22) Filed: Jul. 26, 2021

(65) Prior Publication Data

US 2021/0359022 A1 Nov. 18, 2021

Related U.S. Application Data

(63) Continuation of application No. 16/866,686, filed on May 5, 2020, now Pat. No. 11,093,064, which is a (Continued)

(30) Foreign Application Priority Data

Apr. 18, 2018 (JP) ................................. 2018-079903

(51) Int. Cl.
*G06F 3/041* (2006.01)
*G06F 3/044* (2006.01)
(Continued)

(52) U.S. Cl.
CPC ............. *H10K 59/40* (2023.02); *G06F 3/044* (2013.01); *G06F 3/0412* (2013.01);
(Continued)

(58) Field of Classification Search
CPC ................. H01L 51/5092; H01L 51/56; H01L 2227/323; H01L 2251/5338;
(Continued)

(56) References Cited

U.S. PATENT DOCUMENTS 5,565,658 A * 10/1996 Gerpheide ............ G06F 3/0446
345/174
8,970,539 B2 3/2015 Kwon et al.
(Continued)

FOREIGN PATENT DOCUMENTS

JP 2010-072581 A 4/2010
JP 2010072581 A * 4/2010
(Continued)

OTHER PUBLICATIONS

Japanese Office Action dated Mar. 8, 2022 issued in Japanese Patent Application No. JP-2018-079903.
(Continued)

*Primary Examiner* — Nitin Patel
*Assistant Examiner* — Cory A Almeida
(74) *Attorney, Agent, or Firm* — PEARNE & GORDON LLP

(57) ABSTRACT

A touch panel display includes a pixel including an organic EL element, a first transistor electrically connected to the power supply line and the organic electroluminescence element, and a second transistor electrically connected to the data signal line and the first transistor, a touch sensor overlapping the pixel, and a shield electrode between the pixel and the touch sensor. The shield electrode includes an opening in a region overlapping with the second transistor, the third gate electrode is disposed inside the opening, and the third gate electrode and the fourth gate electrode are electrically connected, the first gate electrode is electrically connected to the shield electrode, and the second gate electrode is connected to a drain of the second transistor, and the shield electrode is grounded.

19 Claims, 50 Drawing Sheets

Related U.S. Application Data continuation of application No. 16/022,516, filed on Jun. 28, 2018, now Pat. No. 10,691,240.

(51) Int. Cl.
| | |
|---|---|
| *H10K 59/40* | (2023.01) |
| *H10K 50/17* | (2023.01) |
| *H10K 59/12* | (2023.01) |
| *H10K 71/00* | (2023.01) |
| *H10K 77/10* | (2023.01) |
| *G09G 3/3225* | (2016.01) |
| *H10K 102/00* | (2023.01) |

(52) U.S. Cl.
CPC ........... *H10K 50/171* (2023.02); *H10K 59/12* (2023.02); *H10K 71/00* (2023.02); *H10K 77/111* (2023.02); *G06F 2203/04102* (2013.01); *G06F 2203/04103* (2013.01); *G06F 2203/04107* (2013.01); *G09G 3/3225* (2013.01); *G09G 2380/02* (2013.01); *H10K 59/1201* (2023.02); *H10K 2102/311* (2023.02)

(58) Field of Classification Search
CPC .............. G09G 3/3225; G09G 2380/02; G06F 2203/04102; G06F 2203/04103; G06F 2203/04107; G06F 3/0412; G06F 3/044; H10K 59/40; H10K 59/12; H10K 59/1201; H10K 59/126; H10K 50/171; H10K 71/00; H10K 77/111; H10K 2102/311

See application file for complete search history.

(56) References Cited

U.S. PATENT DOCUMENTS

| | | | |
|---|---|---|---|
| 10,671,226 | B2 | 6/2020 | Hayashi |
| 2006/0061526 | A1 | 3/2006 | Shirasaki et al. |
| 2010/0136868 | A1* | 6/2010 | Chien ............... G06F 3/0412 |
| | | | 445/24 |
| 2010/0265207 | A1 | 10/2010 | Chen |
| 2012/0075238 | A1 | 3/2012 | Minami et al. |
| 2012/0162275 | A1 | 6/2012 | Park |
| 2014/0131696 | A1 | 5/2014 | Ono et al. |
| 2015/0109231 | A1 | 4/2015 | Shirai et al. |
| 2015/0137103 | A1 | 5/2015 | Hosono et al. |
| 2016/0118416 | A1 | 4/2016 | Yamazaki et al. |
| 2016/0285008 | A1 | 9/2016 | Okubo et al. |

FOREIGN PATENT DOCUMENTS

| | | |
|---|---|---|
| JP | 2011-054962 A | 3/2011 |
| JP | 2012-073783 A | 4/2012 |
| JP | 2014-186537 A | 10/2014 |
| JP | 2018-049154 A | 3/2018 |
| KR | 10-2011-0022375 A | 3/2011 |
| WO | 2014/007314 A1 | 1/2014 |

OTHER PUBLICATIONS

Extended European Search Report for Application No. 19169182.3, dated Sep. 10, 2019.

Ito, et al., "Newly Developed 5.5inch WQHD Display with Hybrid In-cell Capacitive Touch Technology", Japan Display Inc., International Display Workshop (IDW) 2015, p. 1445.

Japanese Office Action issued in Japanese Patent Application No. 2022-127515 dated Sep. 19, 2023.

* cited by examiner

FIG. 43A
FIG. 43B
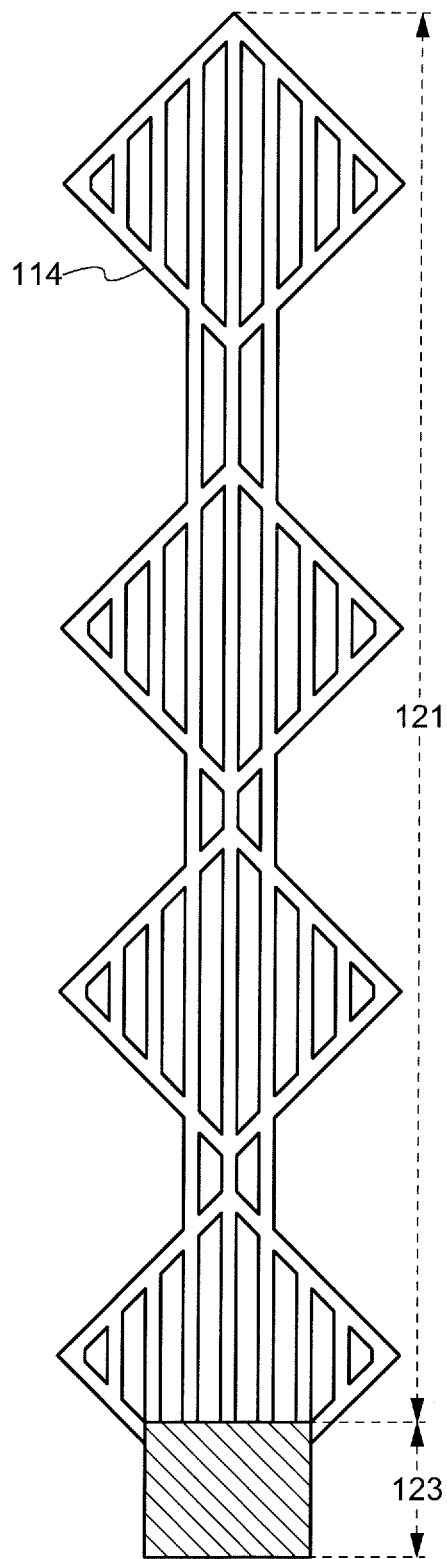
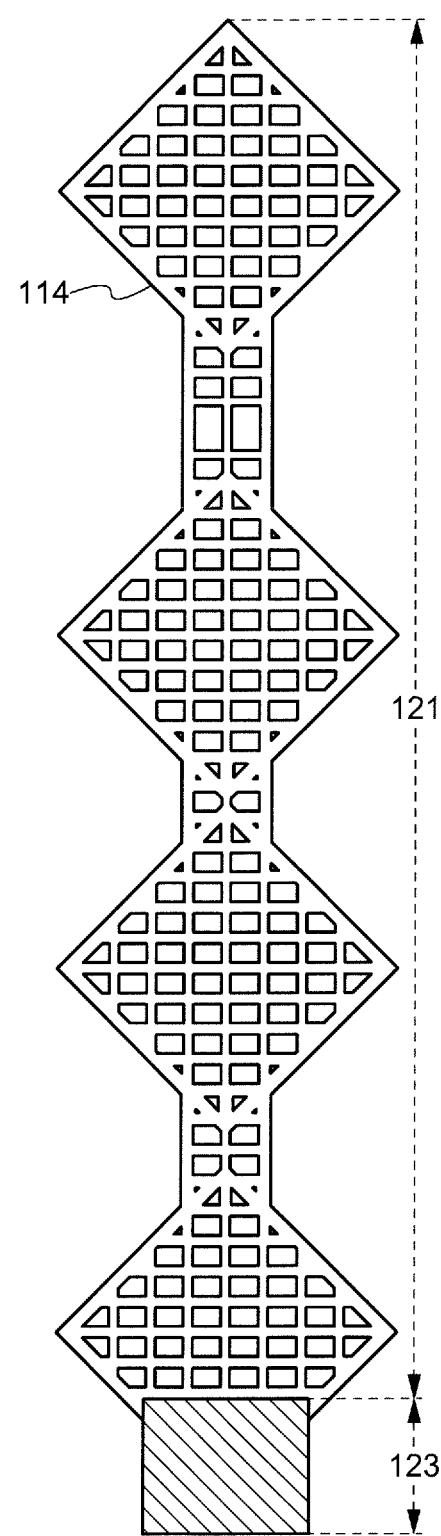

TOUCH PANEL DISPLAY

CROSS REFERENCE TO RELATED APPLICATIONS

This is a continuation of U.S. patent application Ser. No. 16/866,686 filed May 5, 2020, which is a continuation of U.S. patent application Ser. No. 16/022,516 filed on Jun. 28, 2018, which claims the benefit of priority from the prior Japanese Patent Application No. 2018-079903 filed on Apr. 18, 2018, the entire contents of which are incorporated herein by reference.

FIELD

An embodiment of the present invention relates to a touch panel display (also referred to as a "display device having a touch detection function") and a method for manufacturing the same. For example, an embodiment of the present invention relates to a display device that uses an organic electroluminescence element as a display element and includes a built-in touch sensor.

BACKGROUND

A so-called in-cell type touch panel display that uses a liquid crystal display element as a display element and includes a common electrode of a liquid crystal element and an electrostatic capacitance-type touch detection electrode in an integrated manner in a liquid crystal panel is disclosed (see, for example, Japanese Laid-Open Patent Publication No. 2012-073783).

A conventional touch panel display is manufactured as including a glass substrate. Therefore, even if an in-cell system is adopted, there is a limit on reduction of the thickness of the touch panel display. In addition, as long as a glass substrate is used, there is a problem that a display having flexibility (so-called flexible display) is not realized.

SUMMARY

A touch panel display in an embodiment according to the present invention includes a transparent resin substrate; a touch sensor embedded in the transparent resin substrate; pixels each including a first transistor and an organic electroluminescence element electrically connected with the first transistor; a display portion including an array of the pixels; and a shield electrode located between the touch sensor and the display portion. The pixels emitted light toward the transparent resin substrate.

A touch panel display in an embodiment according to the present invention includes a display portion including a video signal line and a scanning signal line; a touch sensor electrode including a first sensor electrode (receiver electrode) and a second sensor electrode (transmitter electrode); and a driving circuit located outer to the display portion and the touch sensor. The driving circuit includes a video signal line driving circuit outputting a video signal to the video signal line, a scanning signal line driving circuit outputting a timing signal, synchronized to the video signal, to the scanning signal line, a sensing circuit receiving a detection signal output from the first sensor electrode (receiver electrode) and outputting a sensing signal, and a scanning circuit outputting a driving signal to the second sensor electrode (transmitter electrode), and the driving circuit includes the video signal line driving circuit, the scanning signal line driving circuit, the sensing circuit and the scanning circuit in an integrated manner.

A method for manufacturing a touch panel display in an embodiment according to the present invention includes forming a transparent resin substrate including a touch sensor including a first sensor electrode extending in a first direction and a second sensor electrode extending in a second direction crossing the first direction; forming a shield electrode covering the touch sensor; and forming, on the transparent resin substrate, a display portion including pixels each including a transistor and an organic electroluminescence element electrically connected with the transistor.

BRIEF DESCRIPTION OF DRAWINGS

FIG. 43A and FIG. 43B are each a plan view showing an example of sensor electrode of a touch panel display in an embodiment according to the present invention;

DESCRIPTION OF EMBODIMENTS

Figure 1:
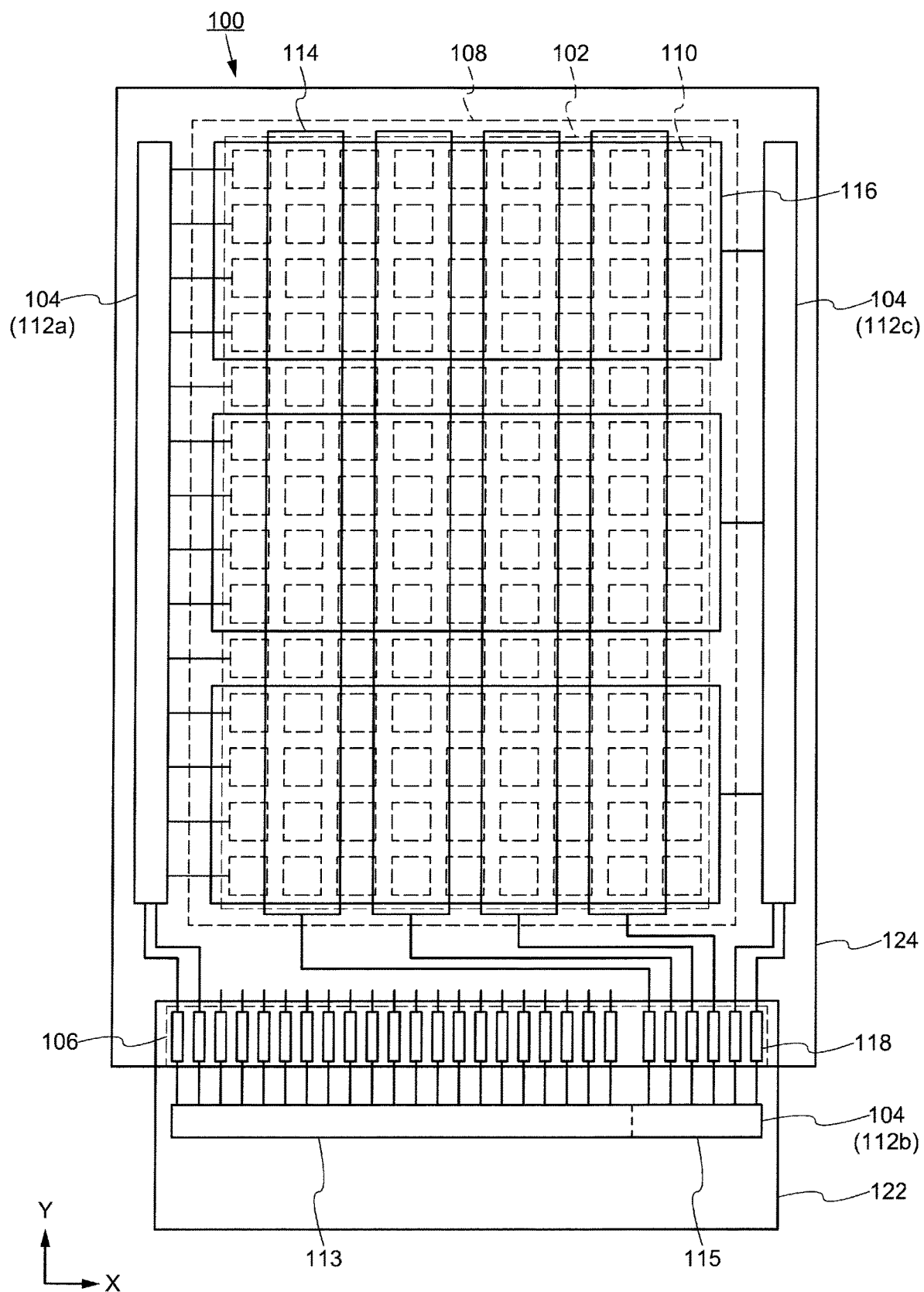
FIG. 1 is a plan view showing a structure of a touch panel display in an embodiment according to the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. Regarding the present invention, in the case where a specific component shown in a drawing and a specific component shown in another drawing are the same as, or correspond to, each other, the components bear the same reference sign (or the same signs followed by letters "a", "b" or the like), and detailed descriptions thereof may be omitted. The terms "first", "second" and the like used for components are merely provided for the sake of convenience, more specifically, for distinguishing the components from each other, and do not have any other significance unless otherwise specified.

In the specification, an expression that a component is "on", "above", or "below" another component encompasses a case where such a component is in direct contact with another component and also a case where such a component is not in direct contact with another component, namely, a case where still another component is provided between such a component and another component, unless otherwise specified.

First Embodiment

In this embodiment, a touch panel display having a touch sensor function of sensing a touch on a screen and a display function of displaying an image on the screen will be described.

1-1. Structured of the Display Device

FIG. 1 shows a structure of a touch panel display 100 in an embodiment according to the present invention. The touch panel display 100 includes a transparent resin substrate 124, and a display portion 102, a driving circuit portion 104, a terminal portion 106 and a touch sensor 108 provided on a first surface of the transparent resin substrate 124. The display portion 102 includes a plurality of pixels 110. The plurality of pixels 110 are arrayed in a first direction (e.g., a Y direction shown in FIG. 1) and a second direction crossing the first direction (e.g., an X direction shown in FIG. 1). The plurality of pixels 110 may be arrayed in any of various patterns, for example, a stripe pattern, a delta pattern, a Bayer arrangement, a PenTile matrix, a diamond PenTile matrix or the like.

The touch sensor 108 includes a first sensor electrode 114 and a second sensor electrode 116. The first sensor electrode 114 has a pattern extending in the first direction. The second sensor electrode 116 has a pattern extending in the second direction crossing the first direction. The first sensor electrode 114 and the second sensor electrode 116 may each have any pattern, for example, a flat plate-like (strip-like) pattern. A plurality of the first sensor electrodes 114 and a plurality of the second sensor electrodes 116 are provided. The plurality of first sensor electrodes 114 are arrayed in the second direction, and the plurality of second sensor electrodes 116 are arrayed in the first direction. The first sensor electrodes 114 and the second sensor electrodes 116 are located to cross each other with an insulating layer being provided between the first sensor electrodes 114 and the second sensor electrodes 116.

The terminal portion 106 includes a plurality of terminal electrodes 118 located along one side of the transparent resin substrate 124. The plurality of terminal electrodes 118 are electrically connected with a flexible printed circuit board 122 and act as terminals to which a signal is input from an external circuit.

The driving circuit portion 104 includes a first driving circuit 112a, a second driving circuit 112b, and a third driving circuit 112c. The first driving circuit 112a, the second driving circuit 112b and the third driving circuit 112c may be located in any manner. For example, the first driving circuit 112a and the third driving circuit 112c may each include a thin film transistor (TFT) and may be formed on the transparent resin substrate 124, whereas the second driving circuit 112b may include a semiconductor integrated circuit (LSI) and may be mounted on the flexible printed circuit board 122 in the form of a bare chip. The semiconductor integrated circuit mounted on the flexible printed circuit board 122 may be referred to also as a "driver IC". The second driving circuit 112b may include a video signal processing circuit 113 outputting a video signal to the plurality of pixels 110 and a sensor signal processing circuit 115 processing a signal from the touch sensor 108 in an integrated manner. In this manner, the cost for mounting the second driving circuit 112b is decreased.

The display portion 102 and the touch sensor 108 may be located so as to partially or entirely overlap each other. The display portion 102 displays an image or a video, and the touch sensor 108 has a function of sensing a touch or an approach of a finger of a human or the like. The touch sensor 108 senses an operation made on a graphic user interface (GUI) such as an icon, a key or the like displayed on the display portion 102.

The touch sensor 108 has a function of sensing a touch or an approach of a finger of a human or the like by use of a change in an electrostatic capacitance. The first sensor electrodes 114 each act as a receiver electrode (Rx electrode), and sequentially output detection signals (Vdet). The second sensor electrodes 116 each act as a transmitter electrode (Tx electrode), and are sequentially supplied with common driving signals (Vcom) from the third driving circuit 112c.

The touch panel display 100 performs an input/output function by the display portion 102 displaying an image and the touch sensor 108 detecting a touch on a screen. The display portion 102 is driven by a scanning signal output from the first driving circuit 112a and a video signal output from the second driving circuit 112b. The touch sensor 108 is driven by a detection signal input to any of the first sensor electrodes 114 via the corresponding terminal electrode 118 and a common driving signal supplied to any of the second sensor electrodes 116 from the third driving circuit 112c. A graphic user interface (GUI) such as an icon or the like is displayed on the display portion 102 and a touch on the screen is sensed by the touch sensor 108, so that it is distinguishable whether or not an operation is made on the GUI.

Figure 2:
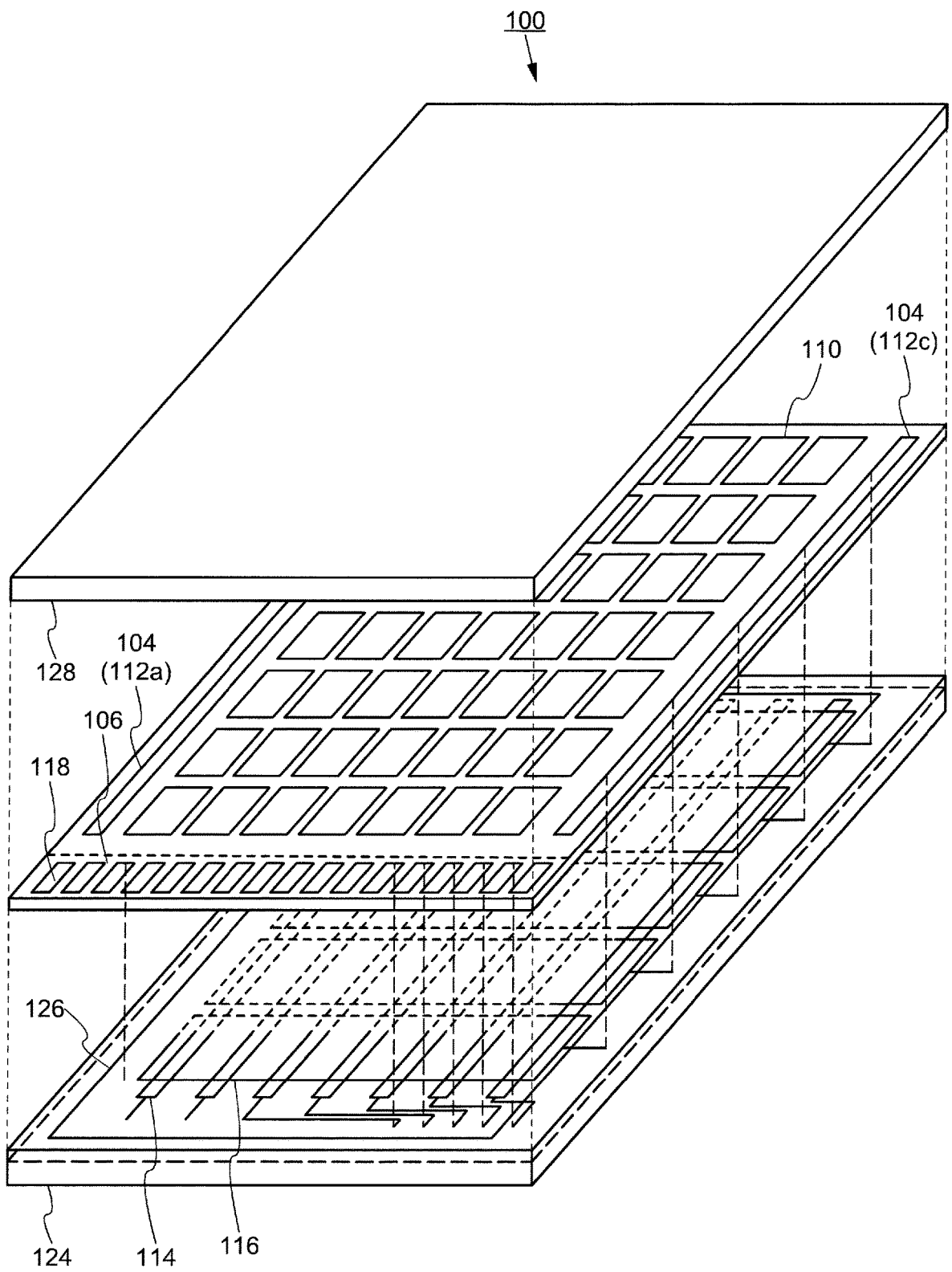
FIG. 2 is a perspective view showing a structure of the touch panel display in an embodiment according to the present invention.

FIG. 2 is a perspective view showing a structure of the touch panel display 100. The touch panel display 100 includes the transparent resin substrate 124 in which the first sensor electrodes 114 and the second sensor electrodes 116 are embedded. The touch sensor 108 includes the first sensor electrodes 114 and the second sensor electrodes 116. The display portion 102 including the array of the pixels 110, the driving circuit portion 104, the terminal portion 106 including an array of the terminal electrodes 118 and the like are provided on the transparent resin substrate 124. The shield electrode 126 is provided between the first sensor electrodes 114/the second sensor electrodes 116 and the display portion 102. A sealing layer 128 may be provided on the display portion 102. The sealing layer 128 is provided to protect the display portion 102 and the driving circuit portion 104. The first sensor electrodes 114 and the second sensor electrodes 116 embedded in the transparent resin substrate 124 are each electrically connected with the corresponding terminal electrode 118 via a contact hole formed in the transparent resin substrate 124.

The pixels 110 each include a light emitting element. As the light emitting element, for example, an organic electroluminescence element (hereinafter, also referred to as an "organic EL element") is used. The touch panel display 100 has a so-called bottom emission structure, by which light emitted from the pixels 110 is output via the transparent resin substrate 124. Therefore, the transparent resin substrate 124 is light-transmissive. The first sensor electrodes 114, the second sensor electrodes 116 and the shield electrode 126 are located as overlapping the pixels 110, and therefore are also light-transmissive. For example, the first sensor electrodes 114, the second sensor electrodes 116 and the shield electrode 126 are each formed of a transparent conductive film. As shown in FIG. 2, the touch panel display 100 has a structure by which an image displayed on the display portion 102 is visually recognizable through the transparent resin substrate 124. Namely, the touch panel display 100 has a structure by which an image displayed on the display portion 102 is visually recognizable via the touch sensor 108.

The sealing layer 128 may have any structure. For example, the sealing layer 128 is formed of an inorganic insulating film such as a silicon oxide film, a silicon nitride film or the like. Alternatively, the sealing layer 128 may be formed of a resin material such as a polyimide resin, an acrylic resin, an epoxy resin or the like. The sealing layer 128 is provided to prevent the light emitting elements provided in the pixels 110 from being deteriorated.

1-2. Equivalent Circuit of the Pixel

Figure 3:
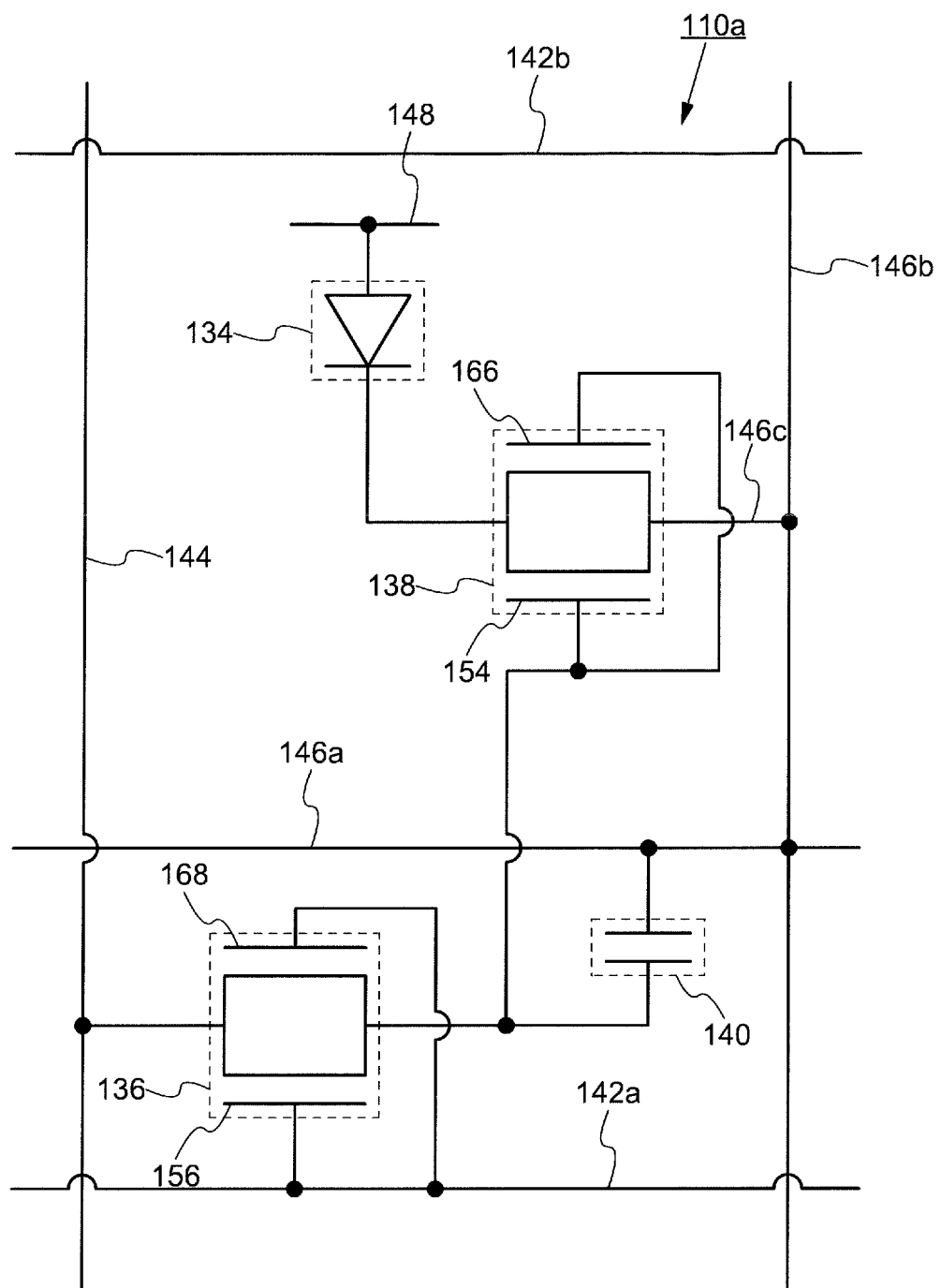
FIG. 3 shows an example of equivalent circuit of a pixel in the touch panel display in an embodiment according to the present invention.

FIG. 3 shows an example of equivalent circuit of one pixel 110a. The pixel 110a includes an organic EL element 134, a selection transistor 136, a driving transistor 138, and a capacitance element 140. The selection transistor 136 and the driving transistor 138 each have a dual-gate structure in which a semiconductor layer (referred to also as an "active layer") is held between two gate electrodes. The driving transistor 138 includes a first gate electrode 154 and a second gate electrode 166, and the selection transistor 136 includes a first gate electrode 156 and a second gate electrode 168.

The selection transistor 136 and the driving transistor 138 are each an insulating gate-type field effect transistor, in which a source and a drain thereof act as signal input/output terminals and gates thereof each act as control terminals controlling the transistor to be on or off. In the equivalent circuit shown in FIG. 3, the selection transistor 136 and the driving transistor 138 are each an n-channel type transistor.

The control terminals of the selection transistor 136 (i.e., the first gate electrode 156 and the second gate electrode 168) are electrically connected with a gate signal line 142a. One of the input/output terminals (first terminal: source or drain) of the selection transistor 136 is electrically connected with a data signal line 144, and the other of the input/output terminals (second terminal: drain or source) of the selection transistor 136 is electrically connected with the control terminals of the driving transistor 138 (the first gate electrode 154 and the second gate electrode 166). One of the input/output terminals (first terminal: source) of the driving transistor 138 is electrically connected with a common line 146 (146a, 146b, 146c), and the other of the input/output terminals (second terminal: drain) of the driving transistor 138 is electrically connected with one of terminals (first terminal) of the organic EL element 134. The capacitance element 140 has one of terminals thereof (first terminal) electrically connected with the control terminals of the driving transistor 138 (the first gate electrode 154 and the second gate electrode 166), and has the other of the terminals thereof (second terminal) electrically connected with the common line 146 (146a, 146b, 146c). The other of the terminals (second terminal) of the organic EL element 134 is electrically connected with a power supply line 148.

The first common line 146a, the second common line 146b and the third common line 146c are supplied with a certain potential (e.g., ground potential). The power supply line 148 is supplied with a power supply potential VDD, which is higher than the potential of the common line 146. One of the terminals (first terminal) of the organic EL element 134 is a cathode electrode (also referred to as a "cathode" or a "negative electrode"), and the other of the terminals (second terminal) of the organic EL element 134 is an anode electrode (also referred to as an "anode" or a "positive electrode"). When a voltage higher than, or equal to, a threshold voltage is applied to the control terminals of the driving transistor 138, an electric current flows in the organic EL element 134 connected between the power supply line 148 and the common line 146. The intensity of light emitted by the organic EL element 134 is controlled by a drain current in the driving transistor 138.

1-3. Structure of the Pixel

Figure 4:
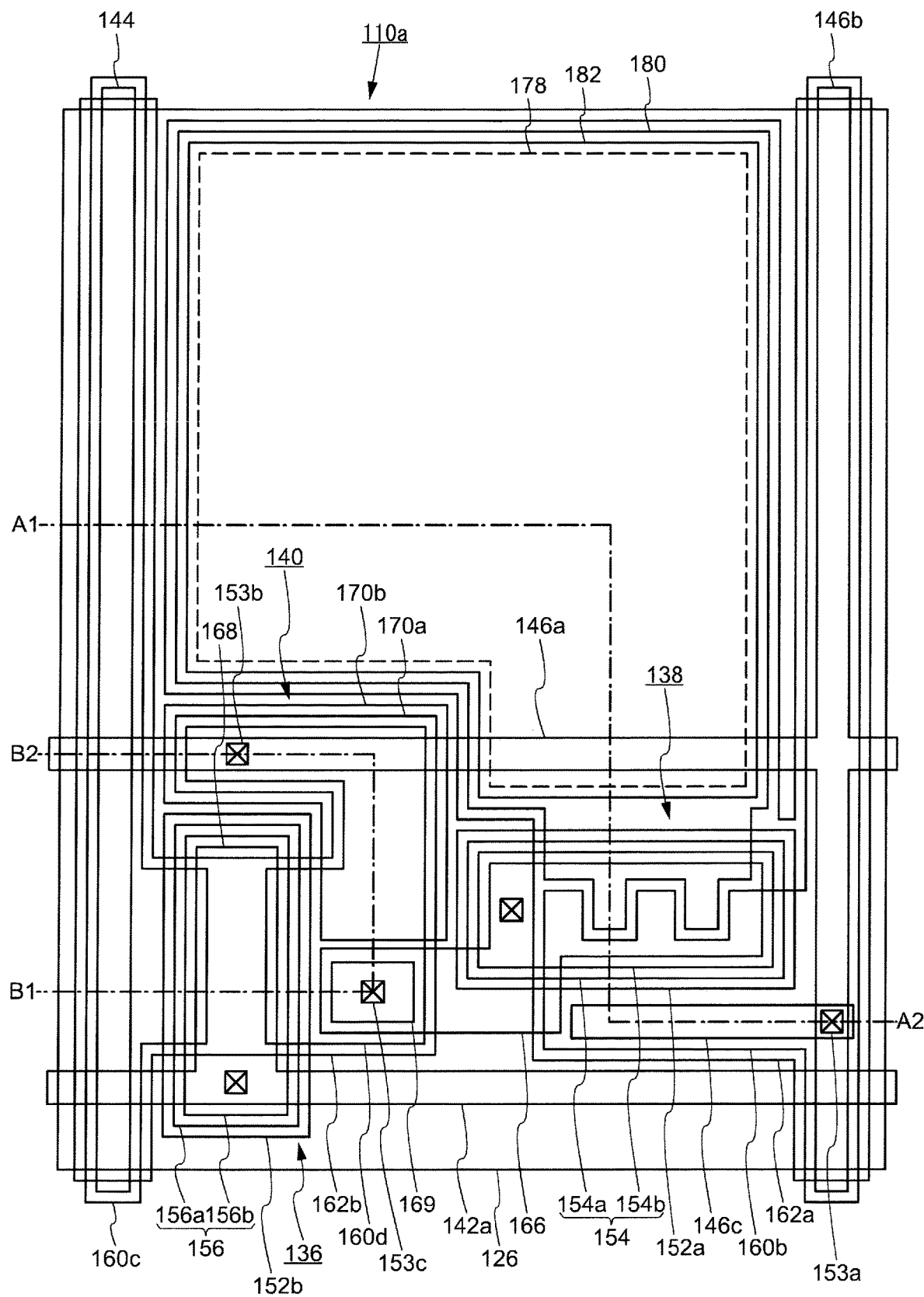
FIG. 4 is a plan view showing a structure of the pixel in the touch panel display in an embodiment according to the present invention.
Figure 5A:
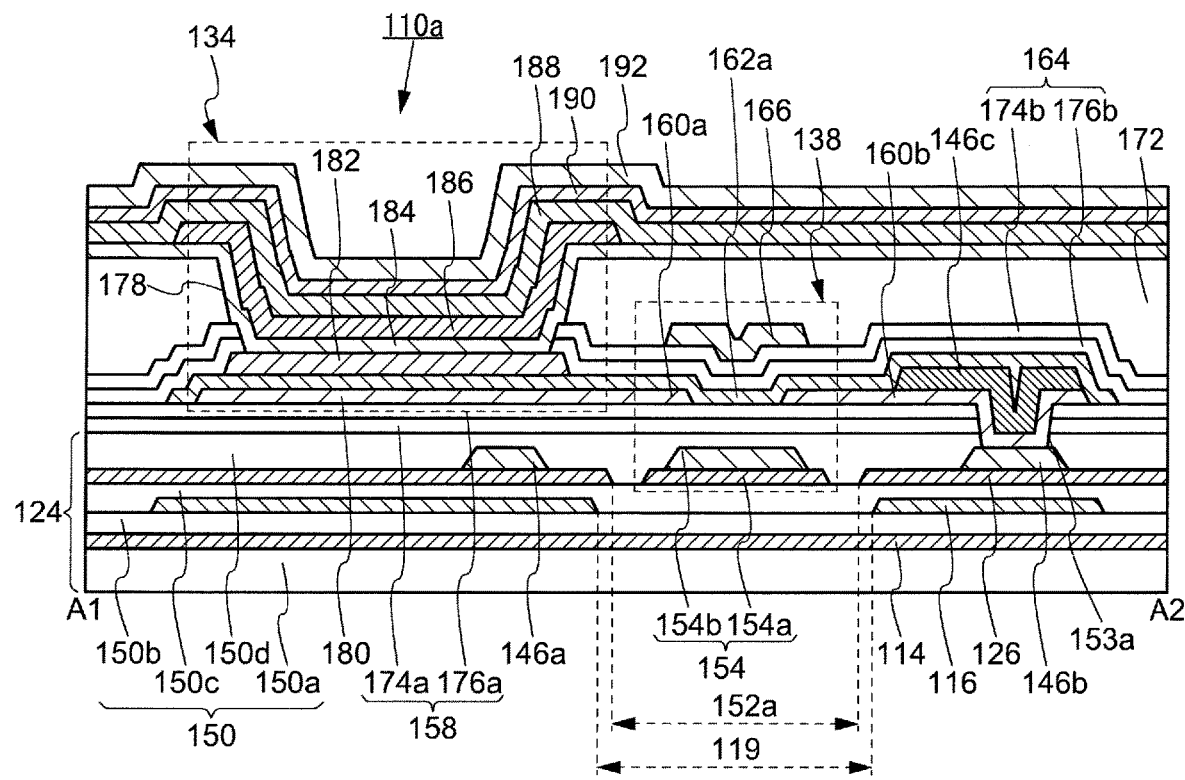
FIG. 5A and FIG. 5B are each a cross-sectional view showing a structure of the pixel in the touch panel display in an embodiment according to the present invention.
Figure 5B:
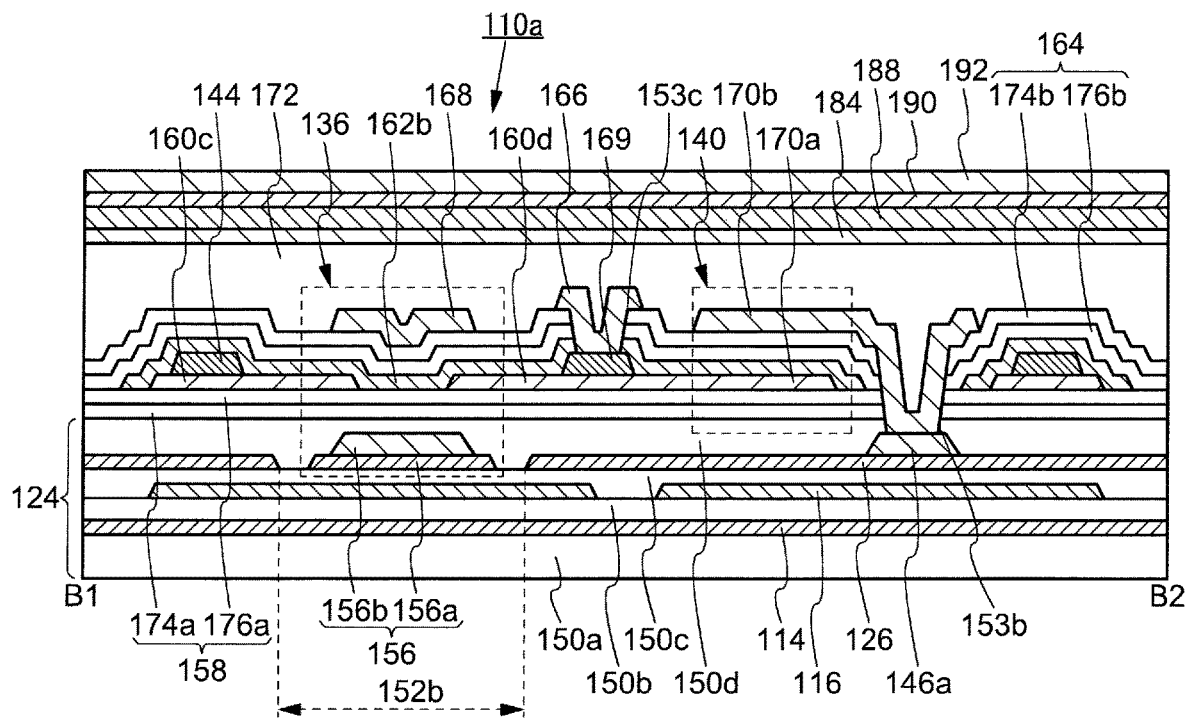

FIG. 4 shows an example of planar structure of the pixel 110a corresponding to the equivalent circuit shown in FIG. 3. FIG. 5A shows a cross-sectional structure of the pixel 110a taken along line A1-A2 shown in FIG. 4. FIG. 5B shows a cross-sectional structure of the pixel 110a taken along line B1-B2 shown in FIG. 4. FIG. 5B shows a cross-sectional structure of the selection transistor 136 and the capacitance element 140. FIG. 5A shows a cross-sectional structure of the driving transistor 138 and the organic EL element 134. In the following description, FIG. 4, FIG. 5A and FIG. 5B will be referred to, as necessary. In the plan view of the pixel 110a shown in FIG. 4, the first sensor electrode 114, the second sensor electrode 116 and the organic EL element 134 are omitted.

As shown in FIG. 4, the pixel 110a includes the driving transistor 138, the selection transistor 136 and the capacitance element 140. In the pixel 110a, the gate signal line 142a, the data signal line 144 and the common line 146 connected with these components are located.

As shown in FIG. 5A and FIG. 5B, the first sensor electrode 114 and the second sensor electrode 116 are embedded in the transparent resin substrate 124. The first sensor electrode 114 and the second sensor electrode 116 form the touch sensor 108. The driving transistor 138, the selection transistor 136, the capacitance element 140 and the organic EL element 134 are provided on the transparent resin substrate 124. The shield electrode 126 is located between the first sensor electrode 114/the second sensor electrode 116, and the driving transistor 138/the selection transistor 136/the capacitance element 140/the organic EL element 134.

The second sensor electrode 116 have an opening 119 in a region overlapping the first gate electrode 154. The second sensor electrode 116 as the transmitter electrode (Tx electrode) is supplied with a common driving signal (Vcom). Only a third transparent resin layer 150c is provided between the second sensor electrode 116 and the first gate electrode 154, and thus the second sensor electrode 116 and the first gate electrode 154 are located relatively close to each other. In this case, when a driving signal is applied to the second sensor electrode 116 while the first gate electrode 154 is in a floating state, an electric field is generated by the driving signal and may act on the first gate electrode 154 to destabilize the operation of the driving transistor 138. As a result, the driving transistor 138 may malfunction. It is preferred that a fourth transparent resin layer 150d is made thick in order to put the first gate electrode 154 far from the second sensor electrode 116. For example, the fourth transparent resin layer 150d may have a thickness of 10 μm or greater, preferably 15 μm or greater. It is further preferred that the second sensor electrode 116 has the opening 119. The opening 119 formed in the second sensor electrode 116 prevents the common driving signal (Vcom) from influencing the first gate electrode 154.

In the meantime, in a region where the selection transistor 136 is located, it is preferred that the second sensor electrode 116 covers the first gate electrode 156. The first gate electrode 156 is supplied with a scanning signal from the gate signal line 142a. The scanning signal applied to the first gate electrode 156 is at least a two-level signal voltage having a voltage that turns on the selection transistor 136 and a voltage that turns off the selection transistor 136. The second sensor electrode 116 is located as overlapping the first gate electrode 156, and as a result, shields the electric field generated by the signal voltage. With such a structure, the signal voltage applied to the first gate electrode 156 is prevented from acting on the first sensor electrode 114. This stabilizes the operation of the touch sensor 108 and prevents the touch sensor from malfunctioning.

1-3-1. Transparent Resin Substrate

The transparent resin substrate 124 has a structure in which a plurality of transparent resin layers 150 are stacked. The first sensor electrode 114 and the second sensor electrode 116 are held between the plurality of transparent resin layers 150. For example, as shown in FIG. 5A and FIG. 5B, the first sensor electrode 114 is provided between a first transparent resin layer 150a and a second transparent resin layer 150b. The second sensor electrode 116 is provided between the second transparent resin layer 150b and the third transparent resin layer 150c. In this manner, the transparent resin substrate 124 includes the plurality of transparent resin layers 150, so that the first sensor electrode 114 and the second sensor electrode 116 are embedded in the transparent resin substrate 124.

The transparent resin substrate 124 further includes the shield electrode 126 provided on a top surface of the third transparent resin layer 150c. The shield electrode 126 is provided to spread in substantially the entirety of the pixel 110a in a planar direction. In this embodiment, the shield electrode 126 has a first opening 152a in a region overlapping the driving transistor 138 and a second opening 152b in a region overlapping the selection transistor 136. The shield electrode 126 is supplied with a certain potential. For example, the shield electrode 126 is supplied with the ground potential. The first opening 152a and the second opening 152b provided in the shield electrode 126 prevent the potential of the shield electrode 126 from acting directly on the gates of the transistors.

The shield electrode 126 is light-transmissive. The shield electrode 126 is formed of, for example, a transparent conductive film. The transparent conductive film may be formed of a conductive metal oxide such as indium tin oxide (ITO), zinc oxide (ZnO), indium zinc oxide (IZO), tin oxide (SnO$_2$) or the like; a transparent conductive film of, for example, a metal nitride or a metal oxide nitride such as titanium nitride (TiN$_x$), titanium oxynitride (TiON) or the like; or a conductive organic material such as polyaniline, graphene or the like. Alternatively, the shield electrode 126 may be formed of a metal material such as aluminum, titanium, copper or the like and may have an opening in positional correspondence with the pixel 110a such that light is transmitted through the opening.

A fourth transparent resin layer 150d is provided on the shield electrode 126. The fourth transparent resin layer 150d forms an insulating surface of the transparent resin substrate 124. It is preferred that the fourth transparent resin layer 150d has a flat surface because components such as transistors and the like that are included in the pixel 110a are provided on the fourth transparent resin layer 150d.

The transparent resin substrate 124 is formed of a resin material and thus is flexible. Usable as the resin material are, for example, a transparent polyimide resin, a transparent polyethylenenaphthalate resin, a transparent para-polyamide resin, or the like. In the case where a transparent polyimide resin or a transparent polyethylenenaphthalate resin is used, a gas barrier film formed of silicon nitride or the like may further be provided because these resins are inferior to glass in gas barrier property. By contrast, a transparent para-polyamide resin is high in transparency, heat resistance and gas barrier property, and thus is preferably usable for the transparent resin layers 150. The first transparent resin layer 150a, the second transparent resin layer 150b, the third transparent resin layer 150c and the fourth transparent resin layer 150d may be formed of the same resin material as each other, at least a part of the layers may be formed of a different resin material, or all the layers may be formed of different resin materials from each other. Since the plurality of transparent resin layers are included in the transparent resin substrate 124, the electrodes of the touch sensor 108 may be provided in the transparent resin substrate 124.

It is preferred that the transparent resin substrate 124 has a heat resistance against a temperature of 150° C. to 400° C. In the case where, for example, the highest process temperature (heating temperature) at which the pixel 110a is formed is 250° C. or lower, a para-polyamide resin is usable as the resin material. Use of the para-polyamide resin improves the gas barrier property of the transparent resin substrate 124. In the case where, for example, the highest process temperature (heating temperature) at which the pixel 110a is formed is more than 250° C., it is preferred to use a transparent polyimide resin from the point of view of heat resistance.

Cellulose nanofiber (CNF) may be mixed with a transparent polyimide resin or a transparent para-polyamide resin. Mixture of the cellulose nanofiber (CNF) with the transparent polyimide resin or the transparent para-polyamide resin provides advantages of improving the rigidity and suppressing the contraction to improve the size stability. In order to provide such advantages, the cellulose nanofiber (CNF) may be contained in any of the first transparent resin layer 150a, the second transparent resin layer 150b, the third transparent resin layer 150c and the fourth transparent resin layer 150d. It is preferred that the mixing ratio of the cellulose nanofiber (CNF) is 1% by weight to 10% by weight.

It is preferred that the first transparent resin layer 150a, the second transparent resin layer 150b, the third transparent resin layer 150c and the fourth transparent resin layer 150d each have a thickness of 3 μm to 10 μm in order to realize a function of a structure that maintains the shape of the transparent resin substrate 124 and a function of a flattening film that embeds the first sensor electrode 114 and the second sensor electrode 116.

As described above, the touch panel display 100 in this embodiment includes the touch sensor 108 embedded in the transparent resin substrate 124, and thus is decreased in thickness and weight.

Figure 6:
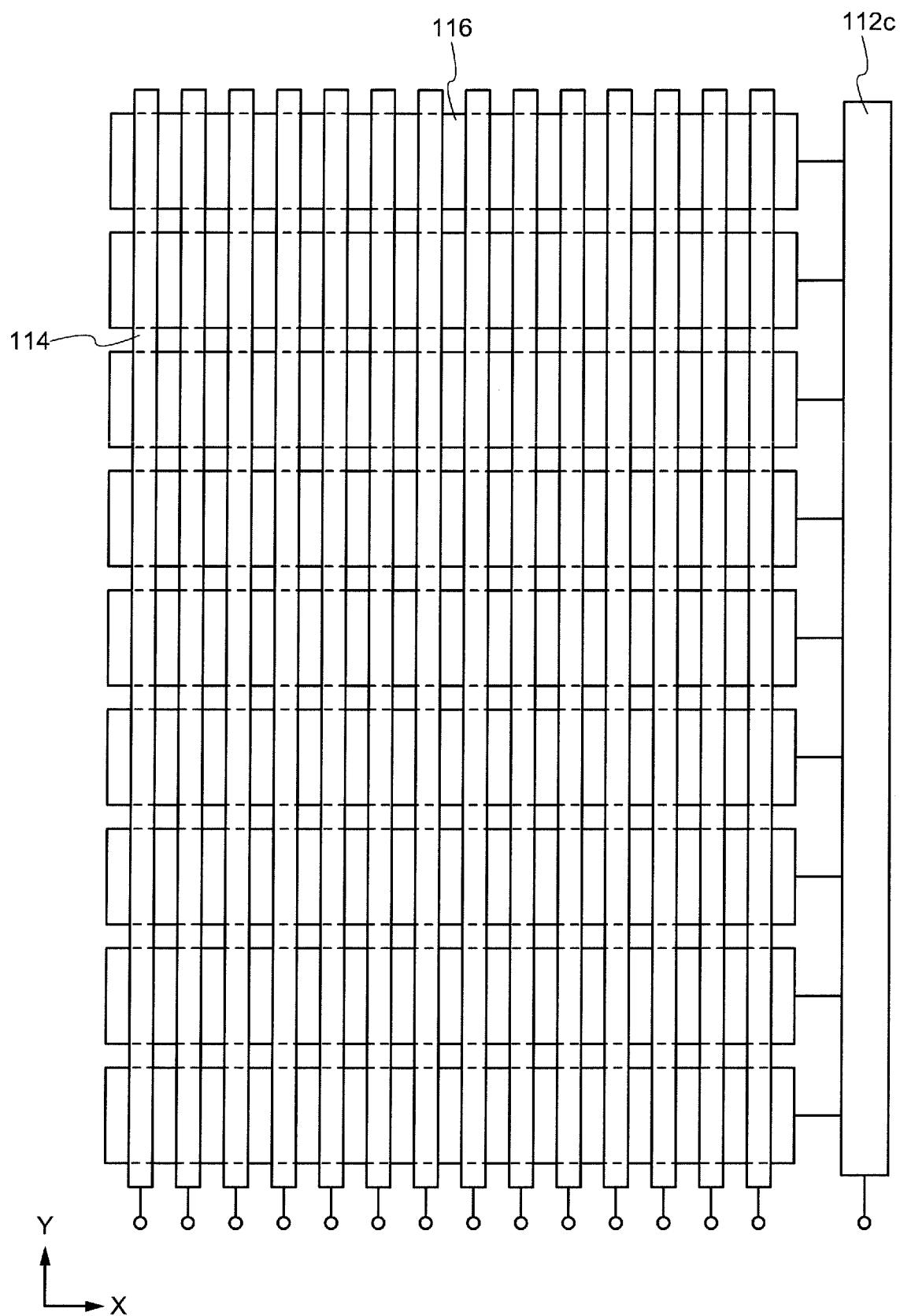
FIG. 6 is a plan view showing a structure of a touch sensor included in the touch panel display in an embodiment according to the present invention.

FIG. 6 is a plan view showing the positional arrangement of the first sensor electrodes 114 and the second sensor electrodes 116 included in the touch sensor 108. The first sensor electrodes 114 are of a flat plate-like (strip-like) conductive pattern extending in the Y direction. The second sensor electrodes 116 are of a flat plate-like (strip-like) conductive pattern extending in the X direction. The plurality of first sensor electrodes 114 are arrayed in the X direction, and the plurality of second sensor electrodes 116 are arrayed in the Y direction. The plurality of first sensor electrodes 114 and the plurality of second sensor electrodes 116 are located as crossing each other with the second transparent resin layer 150b being located between the plurality of first sensor electrodes 114 and the plurality of second sensor electrodes 116. The first sensor electrodes 114 and the second sensor electrodes 116 are located at a plane through which the light emitted from the pixels 110a is output, and therefore are each formed of a transparent conductive film. The first sensor electrodes 114 and the second sensor electrodes 116 are provided with the second transparent resin layer 150b being located between the first sensor electrodes 114 and the second sensor electrodes 116. The second transparent resin layer 150b acts as a dielectric film, so that an electrostatic capacitance is formed between the first sensor electrodes 114 and the second sensor electrodes 116.

The first sensor electrodes 114 are each supplied with a detection signal (Vdet) and used as a receiver electrode (Rx electrode). The second sensor electrodes 116 are each supplied with a common driving signal (Vcom) and used as a transmitter electrode (Tx electrode). In the transparent resin substrate 124, the first sensor electrodes 114 and the second sensor electrodes 116 form the touch sensor 108. The touch sensor 108 has the electrostatic capacitance thereof changed when a finger of a human or the like touches or approaches the touch sensor 108. The touch sensor 108 using such a characteristic is formed in the transparent resin substrate 124.

The first sensor electrodes 114 and the second sensor electrodes 116 are located in a part of, or in the entirety of, the display portion 102. The first sensor electrodes 114 and the second sensor electrodes 116 are light-transmissive. The first sensor electrodes 114 and the second sensor electrodes 116 are each formed of, for example, a transparent conductive film. The transparent conductive film may be formed of a conductive metal oxide such as indium tin oxide (ITO), zinc oxide (ZnO), indium zinc oxide (IZO), tin oxide (SnO$_2$) or the like; a transparent conductive film of, for example, a metal nitride or a metal oxide nitride such as titanium nitride (TiN$_x$), titanium oxynitride (TiON) or the like; or a conductive organic material such as polyaniline, graphene or the like. Alternatively, the first sensor electrodes 114 and the second sensor electrodes 116 may be formed of a metal material such as aluminum, titanium, copper or the like and each have an opening in positional correspondence with the pixel 110a such that light is transmitted through the opening.

The plurality of first sensor electrodes 114 and the plurality of second sensor electrodes 116 may be provided in any number. The first sensor electrodes 114 and the second sensor electrodes 116 merely need to distinguish, for example, a range in which a finger of a human touches the first sensor electrodes 114 and the second sensor electrodes 116. Therefore, the first sensor electrodes 114 and the second sensor electrodes 116 are provided in a number significantly smaller than the number of the pixels 110a. In the case where, for example, the display portion 102 has an area size (screen size) of 5 inches, the diagonal line of the display portion 102 has a length of 125 mm. In this case, for example, 1080×1920 pixels 110a may be provided. The number of the first sensor electrodes 114 may be 12 (pitch: 5 mm; electrode width: 1.0 mm to 1.5 mm) or 25 (pitch: 2.5 mm: electrode width: 0.5 mm to 0.7 mm). The number of the second sensor electrodes 116 may be 22 (pitch: 5 mm; electrode width: 4.9 mm) or 45 (pitch: 2.5 mm; electrode width: 2.4 mm).

1-3-2. Structure of the Circuit Elements

As shown in FIG. 5A and FIG. 5B, the driving transistor 138, the selection transistor 136, the capacitance element 140 and the organic EL element 134 are provided on the transparent resin substrate 124. In this embodiment, the driving transistor 138 and the selection transistor 136 each have a dual-gate structure, and the organic EL element 134 has a so-called inverse stack structure, in which organic electroluminescence layers are stacked from the cathode electrode side.

1-3-2-1. Driving Transistor

The driving transistor 138 has a structure in which the first gate electrode 154, a first insulating layer 158, a first oxide semiconductor layer 162a, a second insulating layer 154, and the second gate electrode 166 are stacked. The first gate electrode 154 is located to overlap the first oxide semiconductor layer 162a with the first insulating layer 158 being located between the first gate electrode 154 and the first oxide semiconductor layer 162a. The second gate electrode 116 is located to overlap the first oxide semiconductor layer 162a with the second insulating layer 164 being located between the second gate electrode 166 and the first oxide semiconductor layer 162a. The first gate electrode 154, the second gate electrode 166 and the first oxide semiconductor layer 162a have a common overlapping region. The driving transistor 138 includes a channel region where the first oxide semiconductor layer 162a overlaps the first gate electrode 154 and the second gate electrode 166. The first gate electrode 154 is located in the opening 152a, and is embedded by the fourth transparent resin layer 150d. The second gate electrode 166 is located on the second insulating layer 164 (on the side opposite to the transparent resin substrate 124).

A first transparent conductive layer 160a and a second transparent conductive layer 160b are located between the first insulating layer 158 and the first oxide semiconductor layer 162a. As seen in a plan view, the first transparent conductive layer 160a and the second transparent conductive layer 160b are located to hold the first gate electrode 154 and the second gate electrode 166 from both of two sides in a horizontal direction. The first transparent conductive layer 160a and the second transparent conductive layer 160b may be located such that tip portions thereof overlap the first gate electrode 154 and the second gate electrode 166. The first transparent conductive layer 160a and the second transparent conductive layer 160b are located to contact the first oxide semiconductor layer 162a. The driving transistor 138 includes a drain region where the first transparent conductive layer 160a is in contact with the first oxide semiconductor layer 162a, and includes a source region where the second transparent conductive layer 160b is in contact with the first oxide semiconductor layer 162a.

The first oxide semiconductor layer 162a is formed of a metal oxide material. The metal oxide material may be a four-component oxide material, a three-component oxide material, a two-component oxide material or a one-component oxide material. Such metal oxide materials may be in an amorphous state, a crystalline state, or a mixed state of the amorphous state and the crystalline state.

Examples of the four-component oxide material include an In$_2$O$_3$—Ga$_2$O$_3$—SnO$_2$—ZnO-based oxide material. Examples of the three-component oxide material include an In$_2$O$_3$—Ga$_2$O$_3$—SnO$_2$-based oxide material, an In$_2$O$_3$—Ga$_2$O$_3$—ZnO-based oxide material, an In$_2$O$_3$—SnO$_2$—ZnO-based oxide material, an In$_2$O$_3$—Al$_2$O$_3$—ZnO-based oxide material, a Ga$_2$O$_3$—SnO$_2$—ZnO-based oxide material, a Ga$_2$O$_3$—Al$_2$O$_3$—ZnO-based oxide material, an $SnO_2$—$Al_2O_3$—ZnO-based oxide material. Examples of the two-component oxide material include an $In_2O_3$—ZnO-based oxide material, an $SnO_2$—ZnO-based oxide material, an $Al_2O_3$—ZnO-based oxide material, an MgO—ZnO-based oxide material, an $SnO_2$—MgO-based oxide material, and an $In_2O_3$—MgO-based oxide material. Examples of the one-component oxide material include an $In_2O_3$-based oxide material, an $SnO_2$-based oxide material, and a ZnO-based oxide material. The above-described oxide semiconductors may each contain silicon (Si), nickel (Ni), tungsten (W), hafnium (Hf) or titanium (Ti). For example, the In—Ga—Zn—O-based oxide material identified above is an oxide material containing at least In, Ga and Zn with no specific limitation on the composition ratio. In other words, the oxide semiconductor layer 162 may be a thin film represented by chemical formula $InMO_3(ZnO)_m$ (m>0). In the chemical formula, M is one or a plurality of metal elements selected from Ga, Al, Mg, Ti, Ta, W, Hf and Si. The four-component oxide material, the three-component oxide material, the two-component oxide material, and the one-component oxide material described above are not limited to containing an oxide having a stoichiometric composition, and may be an oxide material having a composition shifted from the stoichiometric composition. Such a metal oxide semiconductor material has a bandgap of 3.0 eV or larger and is visible light-transmissive.

The first transparent conductive layer 160a and a second transparent conductive layer 160b are formed of a conductive metal oxide material, a conductive metal nitride material or a conductive metal oxide nitride material. Examples of the metal oxide material include indium tin oxide (ITO), zinc oxide (ZnO), indium zinc oxide (IZO), tin oxide ($SnO_2$), niobium-containing titanium oxide ($TiNbO_x$), and the like. Such a metal oxide material may form a good ohmic contact with the oxide semiconductor layer 162. A transparent and conductive metal nitride or a transparent and conductive metal oxide nitride such as titanium nitride ($TiN_x$), titanium oxynitride (TiON) or the like is also usable.

As shown in FIG. 5A, the driving transistor 138 is electrically connected with the second common line 146b. The first oxide semiconductor layer 162a and the second transparent conductive layer 160b extend to a region where the third common line 146c is located, and are electrically connected with the third common line 146c. The first oxide semiconductor layer 162a is above, and contacts, the third common line 146c, whereas the second transparent conductive layer 160b is below, and contacts, the third common line 146c. The second common line 146b is provided in contact with the shield electrode 126, and is supplied with the same potential as that of the shield electrode 126. The third common line 146c is electrically connected with the second common line 146b via a contact hole 153a provided in the first insulating layer 158 and the fourth transparent resin layer 150d. As shown in FIG. 4, in a planar layout, the third common line 146c is electrically connected with the second common line 146b extending in the first direction (the Y direction shown in FIG. 4). The first common line 146a, the second common line 146b and the third common line 146c are formed of a metal material such as titanium, aluminum, molybdenum, copper or the like.

The first insulating layer 158 has a structure in which a first silicon nitride film 174a and a first silicon oxide film 176a are stacked from the side of the first gate electrode 154. The second insulating layer 164 has a structure in which, for example, a second silicon oxide film 176b and a second silicon nitride film 174b are stacked from the side of the first oxide semiconductor layer 162a. The first oxide semiconductor layer 162a is provided in contact with the first silicon oxide film 176a and the second silicon oxide film 176b. The first oxide semiconductor layer 162a is provided in contact with these silicon oxide films, and thus is expected to suppress generation of oxygen deficiency. It is preferred that the first silicon oxide film 176a and the second silicon oxide film 176b provided in contact with a channel region of the first oxide semiconductor layer 162a have no oxygen deficiency and contain an excessive amount of oxygen. The first silicon oxide film 176a and the second silicon oxide film 176b, when containing an excessive amount of oxygen, may each be an oxygen supply source for the first oxide semiconductor layer 162a. The "silicon oxide film containing an excessive amount of oxygen" encompasses a film containing a larger amount of oxygen than the stoichiometric composition. The silicon oxide film containing an excessive amount of oxygen may contain an excessive amount of oxygen in a lattice. The first insulating layer 158 and the second insulating layer 164 may contain a silicon oxide nitride film or an aluminum oxide film instead of the silicon oxide film.

The first gate electrode 154 and the second gate electrode 166 are formed of a metal material such as aluminum (Al), molybdenum (Mo), tungsten (W), zirconium (Zr), copper (Cu) or the like. Example of aluminum alloy include an aluminum-neodymium alloy (Al—Nd), an aluminum-neodymium-nickel alloy (Al—Nd—Ni), an aluminum-carbon-nickel alloy (Al—C—Ni), a copper-nickel alloy (Cu—Ni), and the like. For example, the first gate electrode 154 and the second gate electrode 166 may each be formed of a film of aluminum or a molybdenum-tungsten (MoW) alloy or the like. The first gate electrode 154 may include a first gate electrode layer 154a formed of the same transparent conductive film as that of the shield electrode 126 and a first gate electrode layer 154b formed of any of the above-described metal films.

The driving transistor 138 is covered with a flattening layer 172. The flattening layer 172 is formed of, for example, an organic resin material such as an acrylic resin, a polyimide resin, an epoxy resin, a polyamide resin or the like. The flattening layer 172 has a surface thereof flattened when being coated with a composition containing a precursor of an organic resin material during the manufacturing of the touch panel display 100, by the leveling action of the coating film. Alternatively, the flattening film 172 may be formed of an inorganic insulating film such as a silicon oxide film, a silicon nitride film or the like.

The driving transistor 138 in this embodiment has a dual-gate structure in which the first oxide semiconductor layer 162a is held between the two gate electrodes (the first gate electrode 154 and the second gate electrode 166). It is preferred that the first gate electrode 154 and the second gate electrode 166 are electrically connected with each other and are of the same potential. With such an arrangement, the driving transistor 138 has a current driving capability thereof improved, and thus provides a sufficient level of current to drive the organic EL element 134. For example, even if the operation point of the organic element 134 is fluctuated, the driving transistor 138 may perform constant current driving in accordance with the fluctuation in the operation point.

1-3-2-2. Selection Transistor

The selection transistor 136 has a structure in which the first gate electrode 156, the first insulating layer 158, a second oxide semiconductor layer 162b, the second insulating layer 164, and the second gate electrode 168 are stacked. The selection transistor 136 includes a channel region where the second oxide semiconductor layer 162b overlaps the first gate electrode 156 and the second gate electrode 168. The first gate electrode 156 is located in the opening 152b of the shield electrode 126. The first gate electrode 156 may have a structure in which, in the second opening 152b, a first gate electrode layer 156a formed of the same transparent conductive film as that of the shield electrode 126 and a first gate electrode layer 156b formed of a metal film are stacked on each other. A third transparent conductive layer 160c and a fourth transparent conductive layer 160d are provided between the first insulating layer 158 and the second oxide semiconductor layer 162b. The third transparent conductive layer 160c and the fourth transparent conductive layer 160d are provided in contact with the second oxide semiconductor layer 162b, and thus act as a source region and a drain region respectively. As seen in a plan view, the third transparent conductive layer 160c and the fourth transparent conductive layer 160d are provided to hold the first gate electrode 156 and the second gate electrode 168 from both of two sides in the horizontal direction.

The third transparent conductive layer 160c is electrically connected with the data signal line 144. The data signal line 144 is in direct contact with a top surface of the third transparent conductive layer 160c. The second oxide semiconductor layer 162b is provided to extend to a region where the data signal line 144 is provided and to cover the data signal line 144. The data signal line 144 is in direct contact with the third transparent conductive layer 160c, and thus has a larger contact area size, and a lower contact resistance, than in the case where the data signal line 144 is connected with the third transparent conductive layer 160c via a contact hole. The data signal line 144 has the top surface and a side surface be covered with the second oxide semiconductor layer 162b, and thus is not exposed to an oxidizing atmosphere or a reducing atmosphere during the manufacturing of the touch panel display 100. Therefore, the data signal line 144 is capable of suppressing the surface thereof from having a high resistance.

The fourth transparent conductive layer 160d is electrically connected with a drain electrode 169. The second oxide semiconductor layer 162b is provided on a top surface of the fourth transparent conductive layer 160d to cover the drain electrode 169. The drain electrode 169 is electrically connected with the second gate electrode 166 of the driving transistor 138. The selection transistor 136 has a dual-gate structure in which the second oxide semiconductor layer 162b is held between the first gate electrode 156 and the second gate electrode 168. This improves the switching characteristics of, and decreases the off-current of, the selection transistor 136.

1-3-2-3. Capacitance Element

As shown in FIG. 5B, the capacitance element 140 has a structure in which a first capacitance electrode 170a, the first insulating layer 158 and a second capacitance electrode 170b are stacked. The first capacitance element 170a is formed in a region where the fourth transparent conductive layer 160d and the second oxide semiconductor layer 162b are extended to be outer to the drain electrode 169. The first capacitance element 170a has a structure in which the fourth transparent conductive layer 160d and the second oxide semiconductor layer 160b are stacked on each other. The first capacitance element 170a is electrically connected with the drain of the selection transistor 136. The second first capacitance element 170b is formed in the same layer as that of the second gate electrode 168, and is electrically connected with the first common line 146a via a contact hole 153b provided in the first insulating layer 158 and the fourth transparent resin layer 150d.

1-3-2-4. Organic EL Element

As shown in FIG. 5A, the organic EL element 134 has a structure in which a first electrode 180 corresponding to a cathode electrode, an electron transfer layer 182, an electron injection layer 184, a light emitting layer 186, a hole transfer layer 188, a hole injection layer 190, and a second electrode 192 corresponding to an anode electrode are stacked from the side of the transparent resin substrate 124.

In a region where the organic EL element 134 is provided, the flattening layer 172 and the second insulating layer 164 has an opening 178. The first electrode 180 as the cathode electrode of the organic EL element 134 is located as overlapping the opening 178. The opening 178 exposes a top surface of the electron transfer layer 182 located on the first electrode 180. The electron injection layer 184, the light emitting layer 186, the hole transfer layer 188, the hole injection layer 190 and the second electrode 192 as the anode electrode are stacked on the electron transfer layer 182 in positional correspondence with the opening 178. A region where these stacked layers and the first electrode 180 overlap each other is a light emitting region of the organic EL element 134. Hereinafter, each of the layers included in the organic EL element 134 will be described in detail.

1-3-2-4-1. Cathode Electrode

The first electrode 180 acting as the cathode electrode is formed of a transparent conductive film. Specifically, the first transparent conductive layer 160 is extended to the region of the organic EL element 134 to form the first electrode 180. The first transparent conductive layer 160a and the first electrode 180 are formed of one continuous conductive film, so that the driving transistor 138 and the organic EL element 134 are electrically connected with each other. The organic EL element 134 and the driving transistor 138 are directly connected with each other, not via a contact hole. Such an arrangement simplifies the structure of the pixel 110a.

The first electrode 180 acting as the cathode electrode is formed of the same conductive film as that of the first transparent conductive layer 160a. The first transparent conductive layer 160a is formed of a conductive metal oxide material, a conductive metal nitride material or a conductive metal oxide nitride material. A conductive film formed of such a material has a bandgap of 2.8 eV or larger, preferably 3.0 eV or larger, and thus transmits substantially all the light of a visible range. Therefore, the first electrode 180 is usable as an electrode of the organic EL element 134 on the light output side.

On the first electrode 180, the first oxide semiconductor layer 162a may be provided as extending from the driving transistor 138. The first oxide semiconductor layer 162a has a bandgap of 3.0 eV or larger and thus is visible light-transmissive. As described below, the electron transfer layer 182 is formed of a metal oxide. Therefore, the first oxide semiconductor layer 162a, which is formed of the same material or the same type of material as that of the electron transfer layer 182, is provided between the first electrode 180 acting as the cathode electrode and the electron transfer layer 182, so that formation of an electron injection barrier is prevented. In other words, the first oxide semiconductor layer 162a extending from the channel region of the driving transistor 138 is usable as a part of the electron transfer layer 182, which is in contact with the first electrode 180.

1-3-2-4-2. Electron Transfer Layer

The electron transfer layer 182 is formed of a metal oxide material. The metal oxide material may be substantially the same four-component oxide material, three-component oxide material, two-component oxide material or one-component oxide material as that of the oxide semiconductor layer 162. Such metal oxide materials may be in an amorphous state, a crystalline state, or a mixed state of the amorphous state and the crystalline state.

For example, the electron transfer layer 182 may be formed to contain one or a plurality of substances selected from an indium oxide, a zinc oxide, a gallium (Ga) oxide, a tin (Sn) oxide, a magnesium (Mg) oxide, a silicon (Si) oxide, a hafnium (Hf) oxide, a tantalum (Ta) oxide and a niobium (Nb) oxide. These metal oxide materials have a bandgap of 3.0 eV or larger and is visible light-transmissive. It is preferred that the electron transfer layer 182 has a thickness of 50 nm to 100 nm. The electron transfer layer 182 may be as thick as possible, so that the effect of preventing the short-circuiting between the first electrode 180 and the second electrode 192 is improved. The electron transfer layer 182 is formed by sputtering, vacuum vapor deposition, coating or the like.

It is preferred that the electron transfer layer 182 has a carrier concentration that is $1/10$ or less, preferably $1/100$ or less, of that of the first oxide semiconductor layer 162a. In other words, it is preferred that the first oxide semiconductor layer 162a has a carrier concentration, in a region in contact with the electron transfer layer 182, that is 10 times or greater, preferably 100 times or greater, the carrier concentration of the electron transfer layer 182. Specifically, it is preferred that the carrier concentration of the electron transfer layer 182 is $10^{13}/cm^3$ to $10^{17}/cm^3$, whereas the carrier concentration of the first oxide semiconductor layer 162a is $10^{15}/cm^3$ to $10^{19}/cm^3$, and that the difference in the carrier concentration between the layers is one digit or greater, preferably two digits or greater. The first oxide semiconductor layer 162a has a carrier concentration of $10^{15}/cm^3$ to $10^{19}/cm^3$, so that the resistance loss is decreased in the electrical connection between the driving transistor 138 and the organic EL element 134 and thus the driving voltage is suppressed from increasing. If the carrier concentration of the electron transfer layer 182 is $10^{20}/cm^3$ or greater, the excited state in the light emitting layer 186 is deactivated and thus the light emission efficiency is decreased. By contrast, if the carrier concentration of the electron transfer layer 182 is $10^{13}/cm^3$ or less, the number of the carriers supplied to the light emitting light 186 is decreased and thus a sufficient level of luminance is not provided. As described above, the first oxide semiconductor layer 162a extending from the driving transistor 138 is provided in contact with the light transfer layer 182 and the carrier concentrations of the layers are made different from each other, so that the driving voltage is prevented from increasing and the light emission efficiency of the organic EL element 134 is increased.

The carrier concentration of the electron transfer layer 182 may be controlled by controlling the concentration of the oxygen deficiency in an oxide semiconductor film. The oxygen deficiency in the oxide semiconductor film acts as a donor. When the density of the oxygen deficiency in the oxide semiconductor film is increased, the carrier concentration is increased, whereas when the density of the oxygen deficiency in the oxide semiconductor film is decreased, the carrier concentration is decreased. The oxygen deficiency in the oxide semiconductor film may be increased by, for example, causing hydrogen to act thereon, and may be decreased by supplying oxygen.

1-3-2-4-3. Electron Injection Layer

In the organic EL element 134, the electron injection layer 184 is used to lower the energy barrier and thus to promote the injection of electrons into the electron transfer layer 182 from the cathode electrode. It is preferred that the electron injection layer 184 is provided to make it easier for the electrons to be injected from the electron transfer layer 182 formed of an oxide semiconductor into the light emitting layer 186. Therefore, in the organic EL element 134, the electron injection layer 184 is provided between the electron transfer layer 182 and the light emitting layer 186.

It is desired that the electron injection layer 184 is formed of a material having a small work function in order to inject electrons into the light emitting layer 186. The electron injection layer 184 is formed to contain a calcium (Ca) oxide and an aluminum (Al) oxide. It is preferred that, for example, C12A7 ($12CaO \cdot 7Al_2O_3$) electride for the electron injection layer 184. C12A7 electride has semiconductor characteristics and is controllable to have any resistance between a high resistance and a low resistance. C12A7 electride also has a work function of 2.4 eV to 3.2 eV, which is substantially equal to that of an alkaline metal material. Therefore, C12A7 electride is preferably usable for the electron injection layer 184.

The electron injection layer 184 formed of C12A7 electride is formed by sputtering with polycrystalline C12A7 electride being used as a target. Since C12A7 electride has semiconductor characteristic, it is preferred that the electron injection layer 184 has a thickness of 1 nm to 100 nm. If the thickness of the electron injection layer 184 is less than this range, an interface having a small energy barrier cannot be formed between the electron injection layer 184 and the light emitting layer 186. If the thickness of the electron injection layer 184 is greater than this range, the resistance is too high and thus the driving voltage is increased. It is preferred that C12A7 electride has a Ca:Al molar ratio of 13:13 to 11:16. Since the electron injection layer 184 is formed by sputtering, it is preferred that C12A7 electride is amorphous. C12A7 electride may be crystalline.

C12A7 electride is stable in the air, and thus has an advantage of being easier to handle than an alkaline metal compound conventionally used for an electron injection layer, for example, lithium fluoride (LiF), lithium oxide ($Li_2O$), sodium chloride (NaCl), potassium chloride (KCl) or the like. With such an advantage, it is made unnecessary to perform operations in dry air or in an inert gas during the formation of the organic EL element 134, which alleviates the manufacturing conditions.

C12A7 electride has a high ionization potential, and thus is usable for a hole blocking layer when being provided on the side opposite to the hole transfer layer 188 with the light emitting layer 186 being held between the hole blocking layer and the hole transfer layer 188. Namely, the electron injection layer 184 formed of C12A7 electride is provided between the electron transfer layer 182 and the light emitting layer 186, so that holes injected into the light emitting layer 186 are suppressed from moving to reach the first electrode 180 acting as the cathode electrode. As a result, the light emission efficiency is improved.

1-3-2-4-4. Light Emitting Layer

The light emitting layer 186 may be formed of any of various materials. Examples of the material usable for the light emitting layer 186 include a fluorescent compound that emits fluorescence and a phosphorescent compound that emits phosphorescence. For example, a light emitting layer corresponding to red and a light emitting layer corresponding to green may each be formed of a phosphorescent compound, whereas a light emitting layer corresponding to blue may be formed of a fluorescent compound. In the case of being formed of a white light emitting layer, the light emitting layer 186 may have a structure in which a blue light emitting layer and a yellow light emitting layer are stacked on each other. The light emitting layer 186 may be formed by vapor deposition, transfer, spin-coating, spray-coating, gravure printing or the like. The light emitting layer 186 may have an optionally selected thickness, for example, a thickness in the range of 10 nm to 100 nm.

1-3-2-4-5. Hole Transfer Layer

The hole transfer layer 188 is formed of a material having a hole transfer property. The hole transfer layer 188 may be formed of, for example, an arylamine-based compound. an amine compound containing a carbazole group, an amine compound containing a fluorene derivative, or the like. The hole transfer layer 188 is formed by vacuum vapor deposition, coating or the like. The hole transfer layer 188 may be formed by such a method to have a thickness of 10 nm to 500 nm. The hole transfer layer 188 may be omitted.

1-3-2-4-6. Hole Injection Layer

The hole injection layer 190 contains a substance having a high level of property of injecting holes into an organic layer. Examples of substance having such a high level of property of injecting holes include a metal oxide such as a molybdenum oxide, a vanadium oxide, a ruthenium oxide, a tungsten oxide, a manganese oxide, or the like. Alternatively, phthalocyanine ($H_2PC$), copper (II) phthalocyanine (CuPC), hexaazatriphenylenehexacarbonnitrile (HAT-$(CN)_6$) or the like may be used. The hole injection layer 190 of such a material is formed by vacuum vapor deposition, coating or the like. The hole injection layer 190 is formed by such a method to have a thickness of 1 nm to 100 nm.

1-3-2-4-7. Anode Electrode

The second electrode 192 acting as the anode electrode is formed of a metal material, an alloy or a conductive compound having a large work function (specifically. 4.0 eV or larger). The second electrode 192 is formed of, for example, indium tin oxide (ITO), indium zinc oxide (IZO), indium oxide containing tungsten oxide and zinc oxide (IWZO), or the like. The second electrode 192 acting as the anode electrode formed of such a conductive metal oxide material is formed by vacuum vapor deposition or sputtering. Since the organic EL element 134 is of a bottom emission-type, it is preferred that the second electrode 192 acting as the anode electrode is light-reflective or has a light-reflecting surface. Since a film of a conductive metal oxide such as indium tin oxide (ITO), indium zinc oxide (IZO) or the like is light-transmissive, a metal film of aluminum (Al), silver (Ag) or the like may be stacked on a surface of the second electrode 192 that is opposite to the hole injection layer 190. Although being omitted in FIG. 4, FIG. 5A and FIG. 5B, a passivation layer blocking the transmission of oxygen ($O_2$) or moisture ($H_2O$) may be provided on the second electrode 192.

As described above, the pixel 110a in this embodiment has a structure in which the driving transistor 138 having an n-channel conductivity and the organic EL element 134 are electrically connected with each other. The organic EL element 134 are of a bottom emission-type, and emitted light toward the shield electrode 126. The electron transfer layer 182 and the electron injection layer 184, which are lower layers of the organic EL element 134, are formed of an inorganic insulating material. Therefore, the organic EL element 134 suppresses the characteristics thereof from being deteriorated and stabilizes the characteristics thereof.

1-4. Structure of the Touch Sensor

Figure 7:
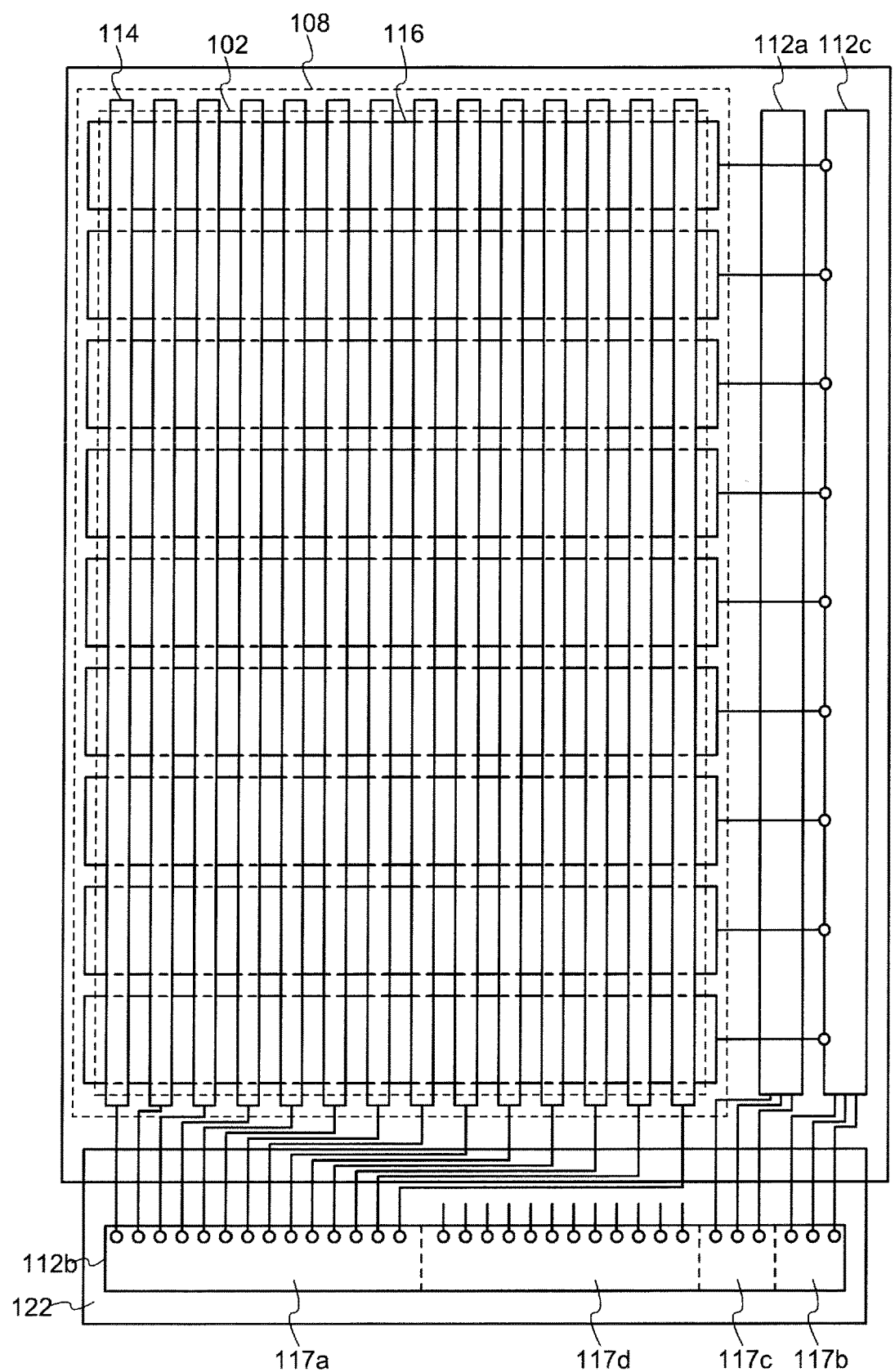
FIG. 7 is a plan view showing a structure of the touch sensor included in the touch panel display in an embodiment according to the present invention.

As described above with reference to FIG. 6, the first sensor electrodes 114 and the second sensor electrodes 116 are located to cross each other so as to form a matrix. FIG. 7 shows a structure of the touch sensor 108 and the driving circuit 112 located as overlapping the display portion 102.

FIG. 7 shows the touch sensor 108 including the first sensor electrodes 114 and the second sensor electrodes 116, and the first driving circuit 112a, the second driving circuit 112b and the third driving circuit 112c located outer to the touch sensor 108. The first driving circuit 112a has a function of sequentially selecting scanning signal lines located in the display portion 102 and outputting the scanning signals. The third driving circuit 112c is a scanning circuit for the touch sensor 108, and has a function of sequentially selecting the second sensor electrodes 116 and outputting the common driving signals (Vcom). The first driving circuit 112a and the third driving circuit 112c each include a sequential logic circuit such as a shift register or the like.

By contrast, the second driving circuit 112b includes circuit blocks having different functions form each other. The circuit blocks include a touch sensor sensing circuit block 117a, a touch sensor scanning circuit block 117b, a scanning signal line driving circuit block 117c, and a video signal line driving circuit block 117d. It is preferred that the second driving circuit 112b including these circuit blocks 117 is realized by one semiconductor chip (integrated circuit). FIG. 7 shows a form in which the second driving circuit 112b including the plurality of circuit blocks is realized by one bare chip and is mounted on the flexible printed circuit board 122 by COF (Chip on Film). One semiconductor chip is provided to have such a plurality of functions in this manner, so that the cost for mounting is decreased.

In the second driving circuit 112b, the touch sensor sensing circuit block 117a is connected with the first sensor electrodes 114. The touch sensor sensing circuit block 117a has a function of sequentially outputting sensing signals (Vdet) to the first sensor electrodes 114. The touch sensor scanning circuit block 117b has a function of outputting a timing signal and the common driving signal (Vcom) to the third driving circuit 112c. The scanning signal line driving circuit block 117c has a function of outputting a timing signal, synchronized to a video signal, to the first driving circuit 112a. The video signal line driving circuit block 117d is connected with video signal lines located in the display portion 102, and has a function of outputting a video signal to the video signal lines.

Figure 8:
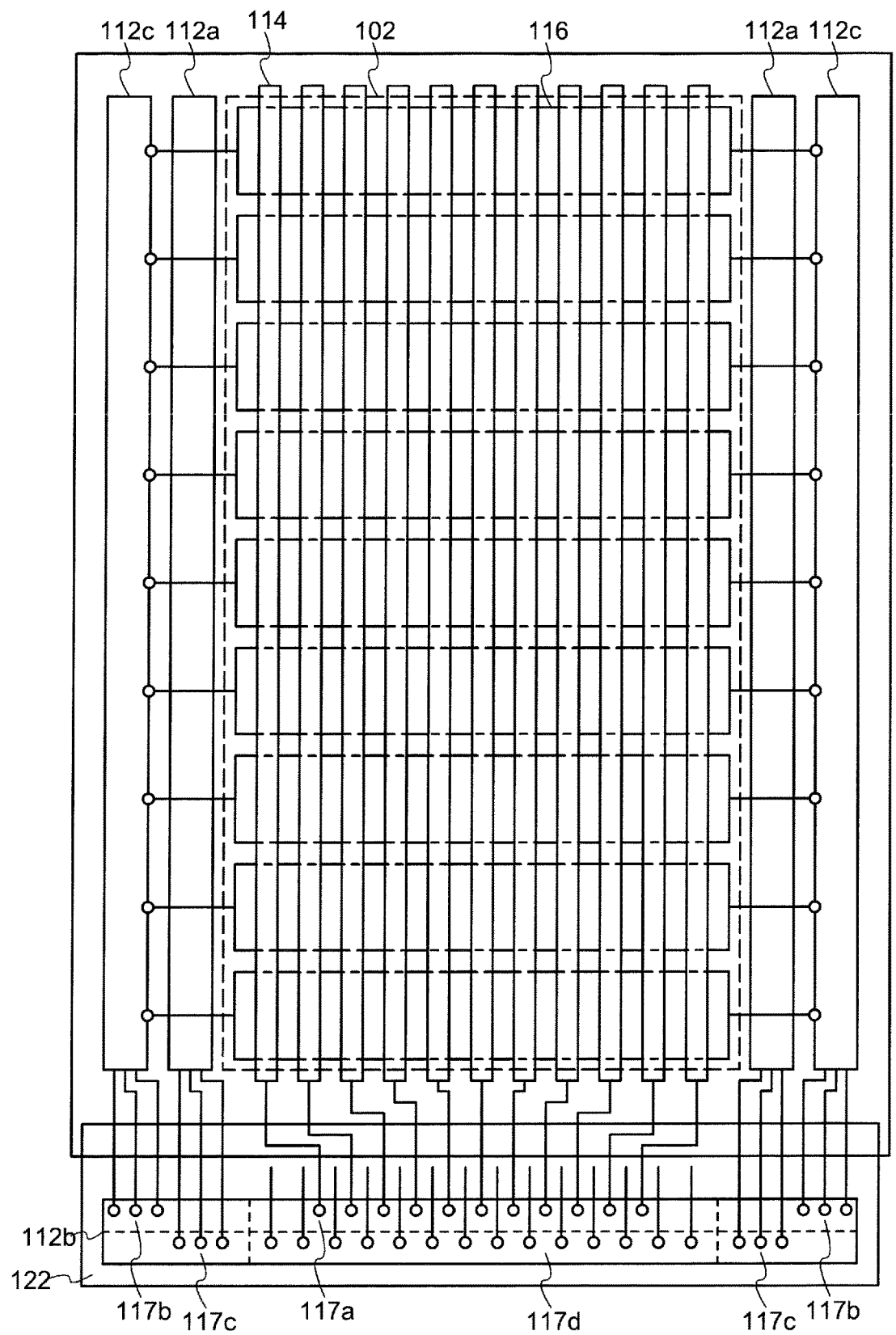
FIG. 8 is a plan view showing a structure of the touch sensor included in the touch panel display in an embodiment according to the present invention.

FIG. 8 shows a form in which the first driving circuit 112a and the third driving circuit 112c are located on both of two sides of the display portion 102. In this circuit layout, the scanning signal lines (not shown) located in the display portion 102 are supplied with the same scanning signal from both of the two sides, and the second sensor electrodes 116 are supplied with the same common driving signal (Vcom) from both of the two sides. With such a circuit layout, even in the case of having a large load capacitance, the scanning signal lines and the second sensor electrodes 116 may be driven at high speed. In the second driving circuit 112b, the touch sensor sensing circuit block 117a, the touch sensor scanning circuit block 117b, the scanning signal line driving circuit block 117c and the video signal line driving circuit block 117d are integrated into one semiconductor chip (integrated circuit). Such an arrangement decreases the number of steps of mounting the semiconductor chip (integrated circuit) on the flexible printed circuit board 122 as compared with the case where the circuit blocks are realized by individual semiconductor chips (integrated circuits).

In the case where a semiconductor chip (integrated circuit) that controls the touch sensor 108 and a semiconductor chip (integrated circuit) that drives the display portion 102 are realized by individual semiconductor chips, these two semiconductor chips need to be mounted. In this case, the same mounting steps are repeated twice, which decreases the productivity. By contrast, in this embodiment, only one mounting step is needed. This improves the manufacturing yield and decreases the manufacturing cost.

In the example shown in FIG. 7, the second driving circuit 112b is realized by one semiconductor chip. The present invention is not limited to this, and the circuit blocks may be realized by individual semiconductor chips.

Figure 9:
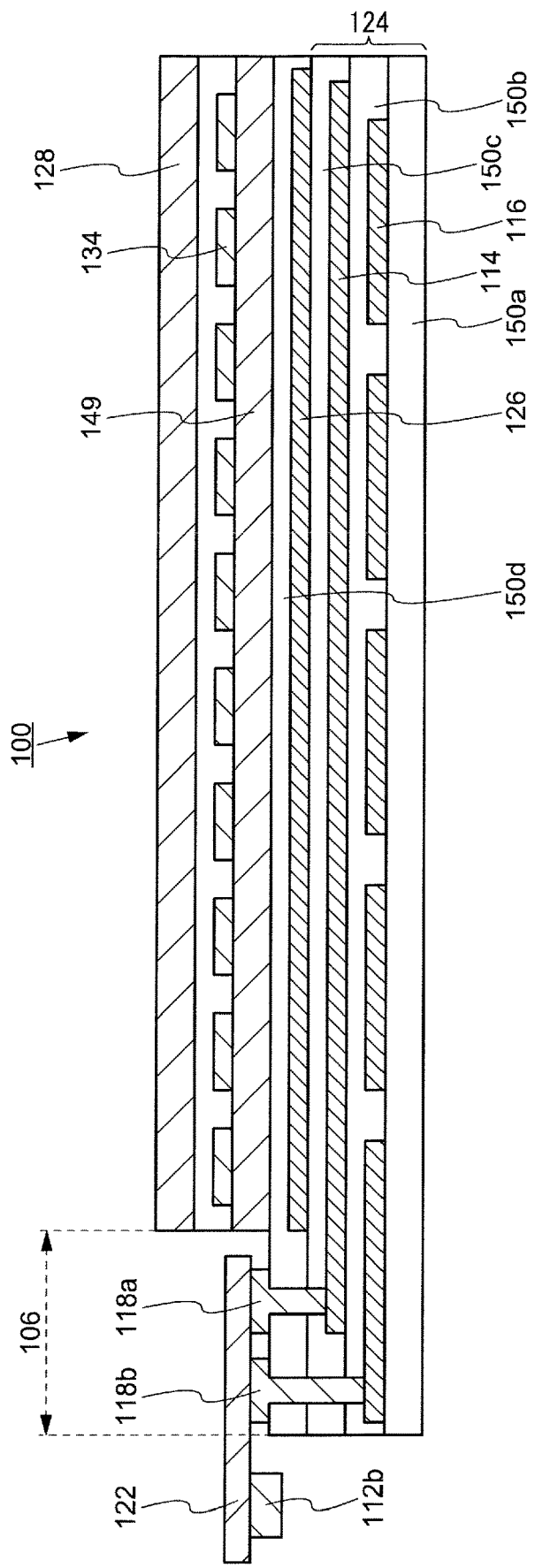
FIG. 9 schematically shows a cross-sectional structure of the touch panel display in an embodiment according to the present invention.

FIG. 9 schematically shows a cross-sectional structure of the touch panel display 100. The touch panel display 100 includes the transparent resin substrate 124 including the first sensor electrodes 114, the second sensor electrodes 116 and the shield electrode 126, and also includes the terminal portion 106, a circuit element layer 149, the organic EL elements 134, and the sealing layer 128 provided on the transparent resin substrate 124. The circuit element layer 149 includes circuit elements such as the driving transistor 138, the selection transistor 136, the capacitance element 140, and the like.

In the terminal portion 106, terminal electrodes 118a and 118b are formed in the same layer as that of the circuit element layer 149. Namely, the terminal electrodes 118a and 118b are provided on the fourth transparent resin layer 150d. In this case, the first sensor electrodes 114 are each connected with the terminal electrode 118b via a contact hole running through the fourth transparent resin layer 150d, the third transparent resin layer 150c and the second transparent resin layer 150b. The second sensor electrodes 116 are each connected with the terminal electrode 118a via a contact hole running through the fourth transparent resin layer 150d and the third transparent resin layer 150c. The terminal electrodes 118a and 118b are electrically connected with the flexible printed circuit board 122, on which the second driving circuit 112b is mounted. In this manner, the terminal electrodes located in the same layer and the sensor electrodes are connected with each other via contact holes having different depths, so that the terminal portion 106 has a high density.

In this embodiment, the sensor electrodes 114 and 116 forming the touch sensor 108 are embedded in the transparent resin substrate 124, so that the touch panel display 100 is thinned and is made flexible.

1-5. Method for Manufacturing the Touch Panel Display

An example of method for manufacturing the touch panel display 100 in an embodiment according to the present invention will be described with reference to the drawings. Hereinafter, the manufacturing method in this embodiment will be described by way of the structures of various manufacturing steps corresponding to the structure of the pixel 110a shown in FIG. 5A and FIG. 5B.

Figure 10A:
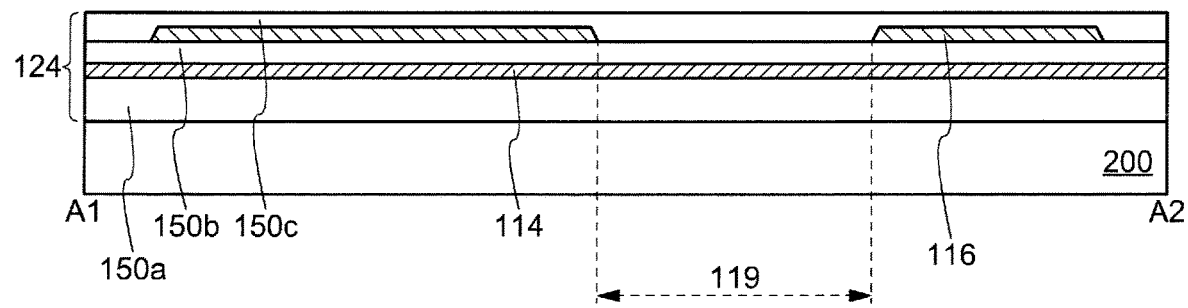
FIG. 10A and FIG. 10B are each a cross-sectional view of the pixel showing a manufacturing step of the touch panel display in an embodiment according to the present invention.
Figure 10B:
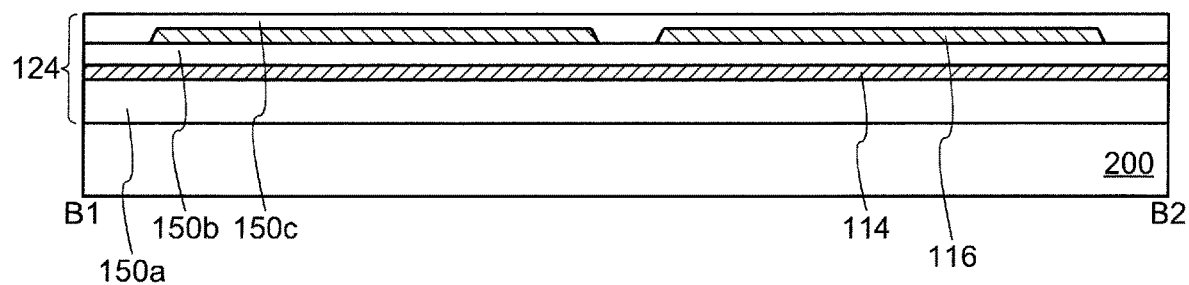

FIG. 10A and FIG. 10B show a stage of forming the transparent resin substrate 124. For manufacturing the touch panel display 100 in this embodiment, a support substrate 200 is used. The support substrate 200 may be a plate-like glass substrate having a first surface and a second surface opposite to the first surface. It is desired that the glass substrate has a high level of heat resistance. It is preferred that, for example, an alkali-free glass substrate having a strain point of 500° C., preferably 550° C. is used.

The first transparent resin layer 150a is formed on the first surface of the support substrate 200. The first transparent resin layer 150a is formed of an insulating resin material. Examples of the insulating resin material include a transparent polyimide resin, a transparent polyethylenenaphthalate resin, a transparent para-polyamide resin, and the like. In the case where the transparent polyimide resin is used, the first transparent resin layer 150a is formed as follows, for example. Diamine and acid anhydride are polymerized in the presence of a solvent to form a polyimide precursor resin. Then, the polyimide precursor resin is applied to the first surface of the support substrate 200 and is imidized by heat treatment. As a result, the first transparent resin layer 150a is formed. In the case where the transparent para-polyamide resin is used, the first transparent resin layer 150a is formed as follows. The transparent para-polyamide resin is copolymerized to have a better solubility in an organic solvent. The resultant transparent para-polyamide resin is applied to the first surface of the support substrate 200, and is heat-treated to vaporize the solvent and thus is cured. As a result, the first transparent resin layer 150a is formed. The first transparent resin layer 150a is formed to have a thickness of 3 μm to 30 μm.

The first sensor electrodes 114 are formed on the first transparent resin layer 150a. The first sensor electrodes 114 are formed of a transparent conductive film. The transparent conductive film is formed of a conductive metal oxide such as indium tin oxide (ITO), zinc oxide (ZnO), indium zinc oxide (IZO), tin oxide ($SnO_2$), niobium-containing titanium oxide ($TiNbO_x$), or the like; a conductive transparent film of a metal nitride or a metal oxide nitride such as titanium nitride ($TiN_x$), titanium oxynitride (TiON) or the like; a metal nanowire of silver (Ag) or the like; or a conductive organic material such as polyaniline, graphene, carbon nanotube or the like. The first sensor electrodes 114 are formed as follows. The transparent conductive film is formed on the entirety of a first surface of the first transparent resin layer 150a. Then, a resist mask is formed by lithography and etching is performed, so that the first sensor electrodes 114 are formed. The transparent conductive film formed on the first transparent resin layer 150a is patterned to be, for example, flat plate-like (strip-like) as shown in FIG. 6. Alternatively, the first sensor electrodes 114 may be formed of a metal film and patterned to be meshed with throughholes being located in positional correspondence with the pixels 110a as described in another embodiment. The first sensor electrodes 114 are formed to have a thickness of 50 nm to 1000 nm.

The second transparent resin layer 150b is formed on the first sensor electrodes 114. The second transparent resin layer 150b is formed in substantially the same manner as that of the first transparent resin layer 150a. It is preferred that the second transparent resin layer 150b is formed to embed the steps caused by the pattern of the first sensor electrodes 114 and thus to provide a flat surface. The second sensor electrodes 116 are formed on the second transparent resin layer 150b. The second sensor electrodes 116 are formed in substantially the same manner as that of the first sensor electrodes 114. The second sensor electrodes 116 are formed to be patterned to be, for example, flat plate-like (strip-like) as shown in FIG. 6. In the second sensor electrodes 116, an opening 119 is formed in positional correspondence with the first gate electrode 154 of the driving transistor 138. The third transparent resin layer 150c is formed on the second sensor electrodes 116. The third transparent resin layer 150c is formed in substantially the same manner as that of the first transparent resin layer 150a. It is preferred that the third transparent resin layer 150c is formed to embed the steps caused by the pattern of the second sensor electrodes 116 and thus to provide a flat surface.

Figure 11A:
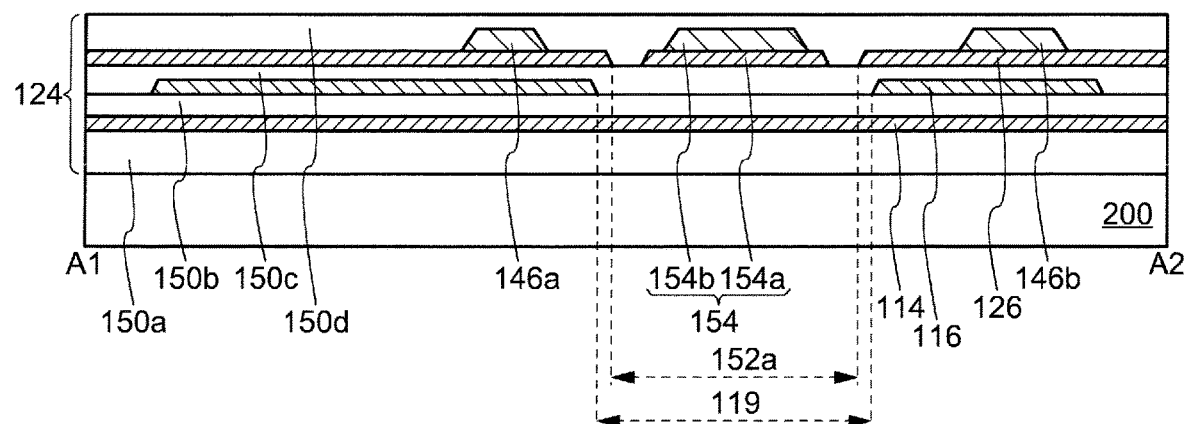
FIG. 11A and FIG. 11B are each a cross-sectional view of the pixel showing a manufacturing step of the touch panel display in an embodiment according to the present invention.
Figure 11B:
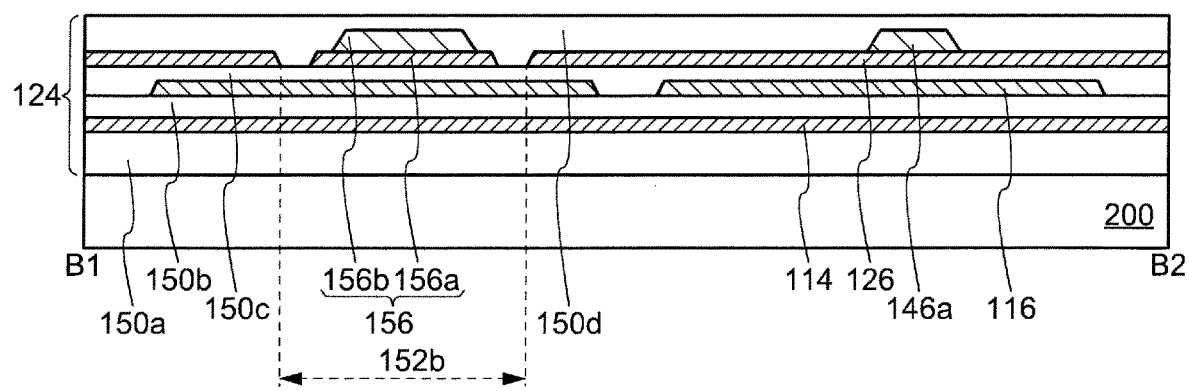

FIG. 11A and FIG. 11B show a stage of forming the shield electrode 126 and the fourth transparent resin layer 150d on the third transparent resin layer 150c. The shield electrode 126 is formed to cover substantially the entirety of the third transparent resin layer 150c. The shield electrode 126 is formed of a transparent conductive film. The transparent conductive film is formed of a conductive metal oxide such as indium tin oxide (ITO), zinc oxide (ZnO), tin oxide (SnO$_2$), niobium-containing titanium oxide (TiNbO$_x$) or the like. The shield electrode 126 is formed by sputtering. The shield electrode 126 may have a thickness of about 50 nm to about 500 nm. In the case where the shield electrode 126 is formed of silver (Ag) nanowire, carbon nanotube, graphene or the like, a solution having silver (Ag) nanowire dispersed therein, a solution having carbon nanotube dispersed therein, or a solution having graphene dispersed therein may be applied to the surface of the third transparent resin layer 150c. Thus, the shield electrode 126 is formed.

In the shield electrode 126, the first opening 152a is formed in positional correspondence with the first gate electrode 154 of the driving transistor 138, and the second opening 152b is formed in positional correspondence with the first gate electrode 156 of the selection transistor 136. The common line 146 is formed on the shield electrode 126. The common line 146 is formed of a metal film of titanium (Ti), aluminum (Al), molybdenum (Mo), copper (Co) or the like.

The first gate electrode 154 is formed in the first opening 152a. The first gate electrode 154 is formed to have a structure in which the first gate electrode layer 154a formed of the same transparent conductive film as that of the shield electrode 126 and the first gate electrode layer 154b formed of the same metal film as that of common line 146 are stacked on each other. The first gate electrode 156 is formed in the second opening 152b. The first gate electrode 156 has substantially the same structure as that of the first gate electrode 154. The first gate electrode 154 and the first gate electrode 156 are formed in the same conductive layer as that of the shield electrode 126 and the common line 146, so that the structure and the manufacturing procedure are simplified. The openings 152, the common line 146 and the first gate electrodes 154 and 156 in the shield electrode 126 are formed by multiple tone exposure. This step will be described in detail with reference to FIG. 12A to FIG. 12E.

FIG. 12A to FIG. 12E each show a cross-sectional structure of a region where the driving transistor 138 is located (corresponding to the cross-sectional view of FIG. 11A) in a lithography step of forming the shield electrode 126, the first common line 146a, the second common line 146b and the first gate electrode 154. FIG. 12A to FIG. 12E omit the components below the third transparent resin layer 150c.

Figure 12A:
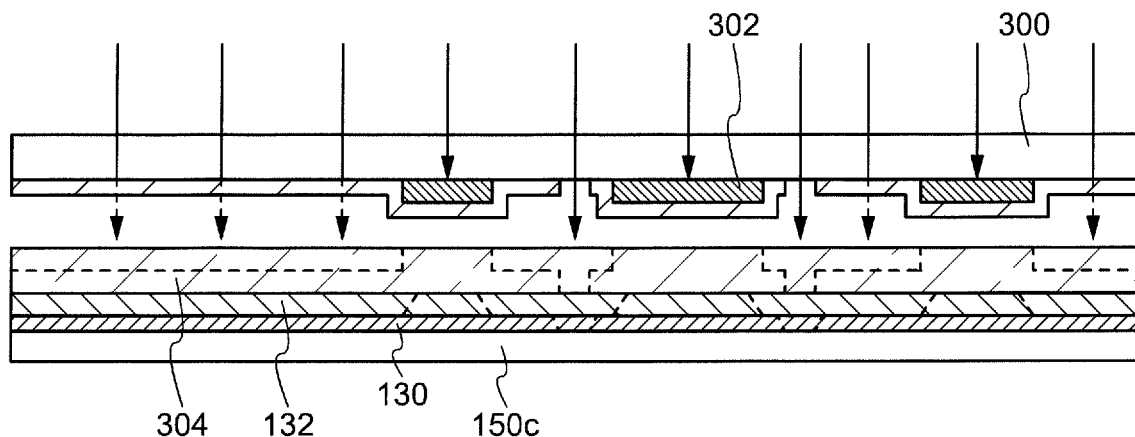
FIG. 12A to FIG. 12E are each a cross-sectional view of the pixel showing a manufacturing step of the touch panel display in an embodiment according to the present invention, specifically, a step of patterning by use of multiple tone exposure.

FIG. 12A shows a stage of forming a transparent conductive film 130 and a metal film 132 on the third transparent resin layer 150c and exposing a photoresist film 304 formed on the metal film 132. In this step, multiple tone exposure (half-tone exposure) is adopted to form the first opening 152a in the shield electrode 126 and also to form the first common line 146a, the second common line 146b and the first gate electrode 154 (including the first gate electrode layer 154a and the second gate electrode layer 154b) on the shield electrode 126 as shown in FIG. 12E, by use of one photomask. Hereinafter, the steps of the procedure will be described with reference to FIG. 12A to FIG. 12E.

In FIG. 12A, the photoresist film 304 is positive. As a result of development, a non-exposed region of the photoresist film 304 is left and an exposed region of the photoresist film 304 is removed. For exposing the photoresist film 304, a multiple tone mask 300 is used. The multiple tone mask 300 has a multiple tone mask pattern 302. As a multiple tone mask, a gray-tone mask and a half-tone mask are generally known. The gray-tone mask has slits of the resolution of the exposure device or less, and the slits block a part of the light to realize multiple tone exposure. The half-tone mask uses a semi-transmissive film to realize multiple tone exposure. In this embodiment, the half-tone mask is used. The multiple tone mask pattern 302 includes an exposed region, a semi-exposed region and a non-exposed region. In the example shown in FIG. 12A, a region corresponding to the first opening 152a is the exposed region except for the region where the first gate electrode 154 is to be formed, a region corresponding to the shield electrode 126 is the semi-exposed region, and a region corresponding to the first common line 146a, the second common line 146b and the first gate electrode layer 154b is the non-exposed region.

Figure 12B:
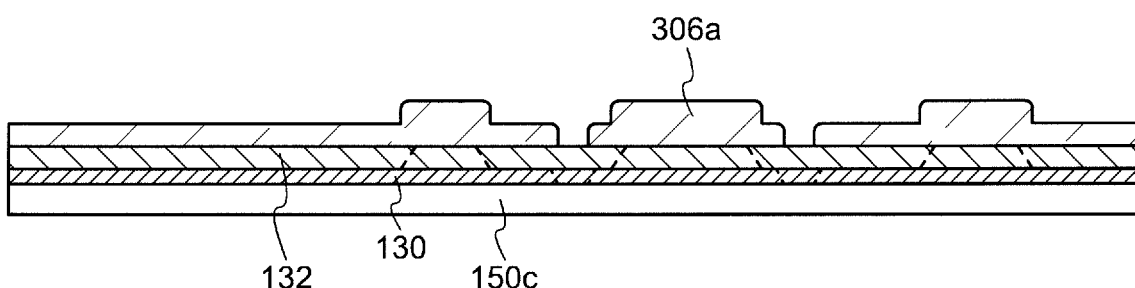

FIG. 12B shows a stage of exposing the photoresist mask 304 through the multiple tone mask 300 and developing the photoresist mask 304. As a result of developing the photoresist mask 304, a resist mask pattern 306a including regions having different thicknesses in accordance with the amount of light used for the exposure is formed. FIG. 12B shows a form in which the resist mask pattern 306a formed of a positive resist is thin in a region corresponding to the region where the first common line 146a, the second common line 146b and the first gate electrode layer 154b are to be formed, and is thick in a region corresponding to the region where the shield electrode 126 is to be formed.

Figure 12C:
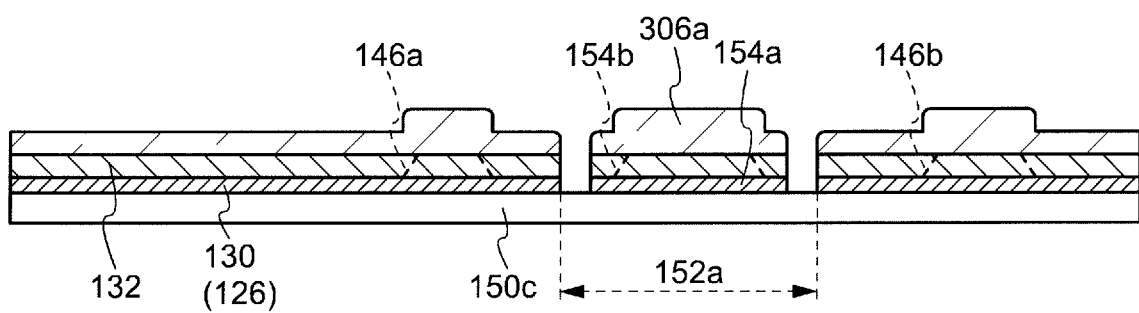

FIG. 12C shows a stage of etching the metal film 132 and the transparent conductive film 130 to form the shield electrode 126, the first opening 152a and the first gate electrode layer 154a. In the case where the metal film 132 is formed of a metal material such as titanium (Ti), molybdenum (Mo) or the like, dry etching using a fluorine-based etching gas such as CF$_4$ or the like may be performed. In the case where the transparent conductive film 130 is formed of a metal oxide such as ITO or the like, dry etching using a chlorine-based etching gas such as BCl$_3$ or the like may be performed. The transparent conductive film 130 is difficult to be etched by a fluorine-based etching gas such as CF$_4$ or the like. Therefore, the metal film 132 may be selectively etched on the transparent conductive film 130. The metal film 132, which may be selectively etched, and the transparent conductive film 130 are stacked on each other as described above, so that a complex shape is formed by use of one multiple tone mask 300.

Figure 12D:
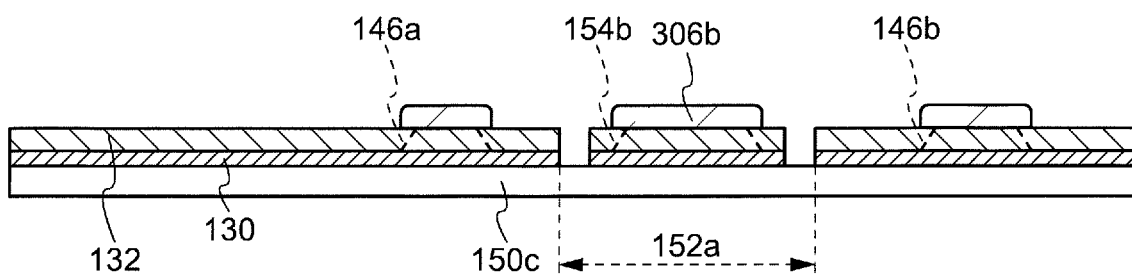
Figure 12E:
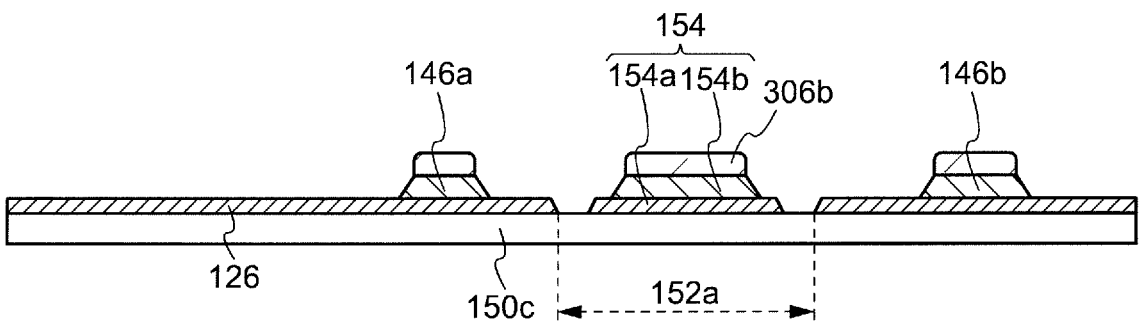

Then, as shown in FIG. 12D, the resist pattern 306a is treated with oxygen plasma or the like to remove a portion corresponding to the semi-exposed region, so that a resist mask pattern 306b is formed. The resist mask pattern 306b is used to selectively etch the metal film 132. As a result, as shown in FIG. 12E, the first common line 146a and the second common line 146b are formed on the shield electrode 126, and the first gate electrode layer 154b is formed on the first gate electrode layer 154a. Then, the resist pattern 306b is removed by ashing or the like.

In this manner, the shield electrode 126 having the first opening 152a, the first common line 146a, the second common line 146b and the first gate electrode 154 (including the first gate electrode layer 154a and the second gate electrode layer 154b) are formed by use of one photomask and one exposure step. Although not shown in FIG. 12A to FIG. 12E, the second opening 152g and the first gate electrode 156 (including the first gate electrode layer 156a and the second gate electrode layer 156b), are formed in substantially the same manner.

The fourth transparent resin layer 150d is formed on the shield electrode 126. The fourth transparent resin layer 150d is formed in substantially the same manner as that of the first transparent resin layer 150a. The fourth transparent resin layer 150d flattens the top surface of the transparent resin substrate 124.

Figure 13A:
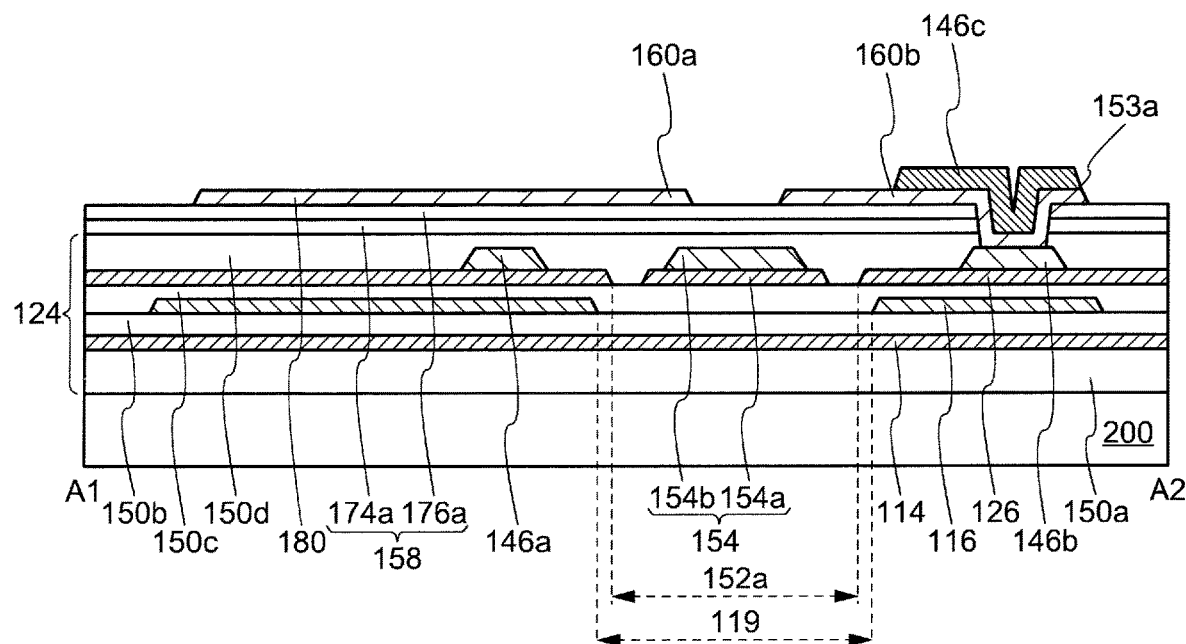
FIG. 13A and FIG. 13B are each a cross-sectional view of the pixel showing a manufacturing step of the touch panel display in an embodiment according to the present invention.
Figure 13B:
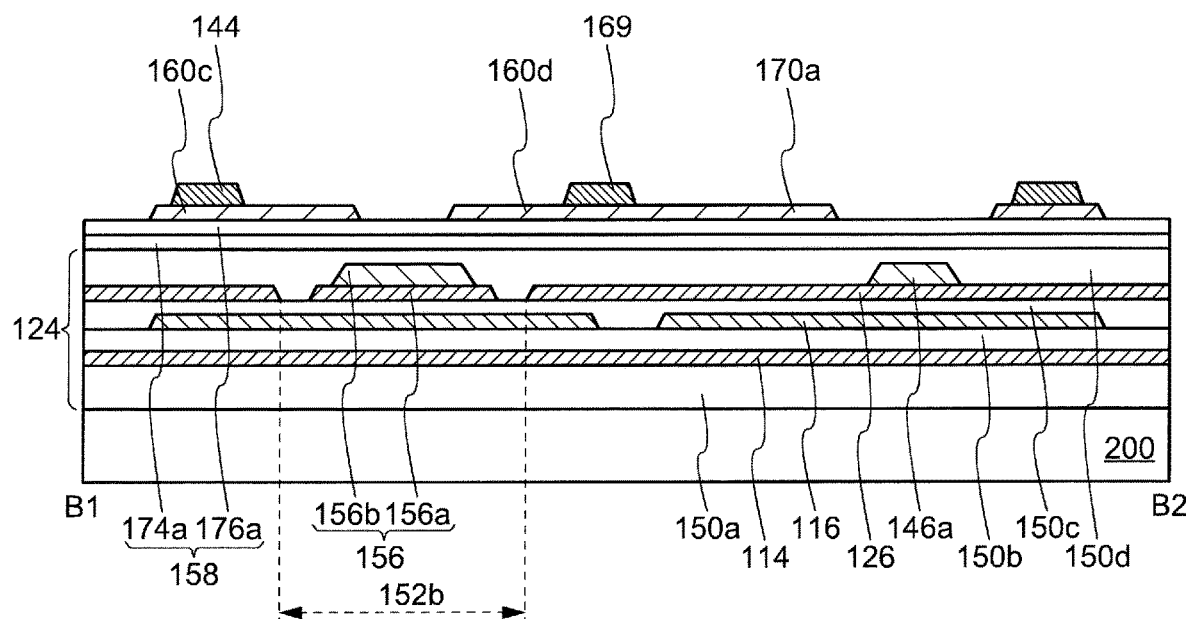

FIG. 13A and FIG. 13B show a stage of forming the first insulating layer 158, the transparent conductive layer 160, the common line 146. The first insulating layer 158 is formed by stacking the first silicon nitride film 174a and the first silicon oxide film 176a from the side of the fourth transparent resin layer 150d. The first silicon nitride film 174a is formed by plasma CVD using, as a source gas, a gas such as $SiH_4$, $HN_3$, $N_2$ or the like. Similarly, the first silicon oxide film 176a is formed by plasma CVD, optionally using $SiH_4$, $N_2O$, $Si(OC_2H_5)_4$ (tetraethoxysilane), $Si(OCH_3)_4$ (tetramethoxysilane), or the like. The first insulating layer 158 is formed to cover substantially the entirety of the fourth transparent resin layer 150d.

After the first insulating layer 158 is formed, the contact hole 153a exposing the second common line 146b is formed. The contact hole 153a runs through the first insulating layer 158 and the fourth transparent resin layer 150d.

The transparent conductive layer 160 (the first transparent conductive layer 160a, the second transparent conductive layer 160b, the third transparent conductive layer 106c and the fourth transparent conductive layer 160d), the first capacitance electrode 170a, the data signal line 144, the drain electrode 169 and the third common line 146c are formed on the first insulating layer 158. The transparent conductive layer 160 and the first capacitance electrode 170a are formed of a metal oxide material. Examples of the metal oxide material include indium tin oxide (ITO), zinc oxide (ZnO), indium zinc oxide (IZO), tin oxide ($SnO_2$), niobium-containing titanium oxide ($TiNbO_x$), and the like. The data signal line 144, the drain electrode 169 and the third common line 146c are formed of a metal material. Examples of the metal material include titanium (Ti), aluminum (Al), molybdenum (Mo), copper (Co), and the like. Such a line and such an electrode each have a structure in which aluminum (Al) or a core metal mainly formed of aluminum (Al) is covered with a high melting point metal material such as titanium (Ti), molybdenum (Mo), copper (Co) or the like provided above or below aluminum (Al) or the core metal.

The transparent conductive layer 160 (the first transparent conductive layer 160a, the second transparent conductive layer 160b, the third transparent conductive layer 106c and the fourth transparent conductive layer 160d), the first capacitance electrode 170a, and the third common line 146c are formed as follows. The corresponding transparent conductive films and metal film are formed on the first insulating layer 158, and then are patterned by multiple tone exposure in substantially the same manner as described above with reference to FIG. 12A to FIG. 12E. As a result of this step, the second common line 146b and the third common line 146c are electrically connected with each other via the fourth transparent resin layer 150d in the region where the contact hole 153a is formed. The data signal line 144 is formed on the third transparent conductive layer 160c, and the drain electrode 169 is formed on the fourth transparent conductive layer 160d.

Figure 14A:
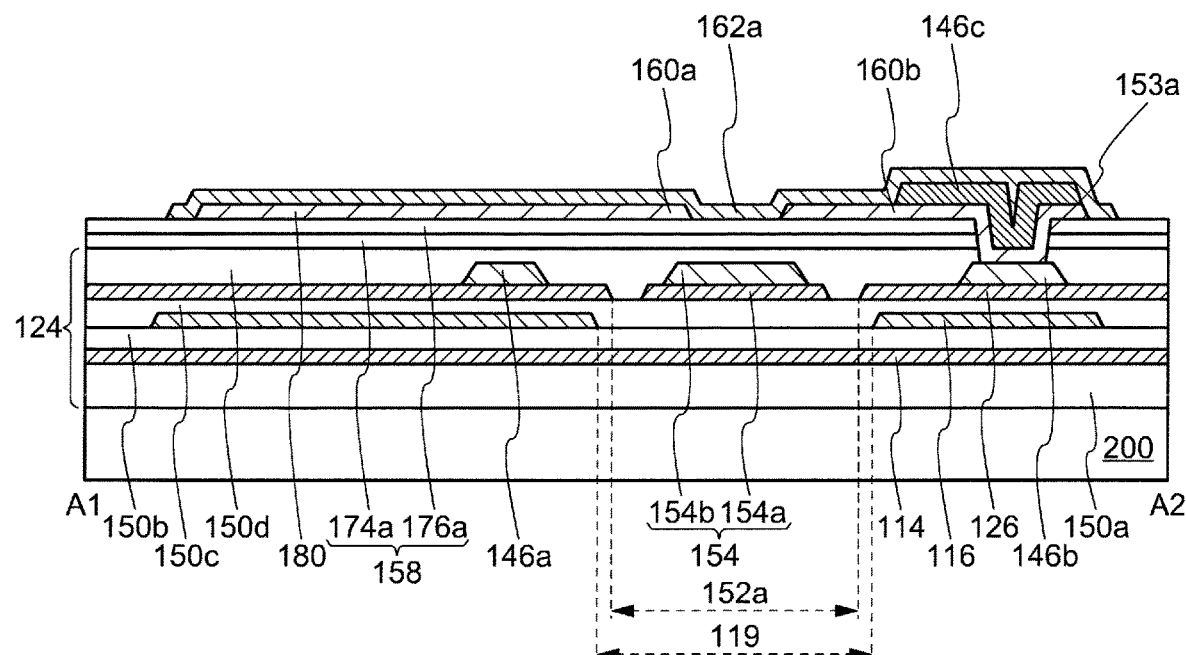
FIG. 14A and FIG. 14B are each a cross-sectional view of the pixel showing a manufacturing step of the touch panel display in an embodiment according to the present invention.
Figure 14B:
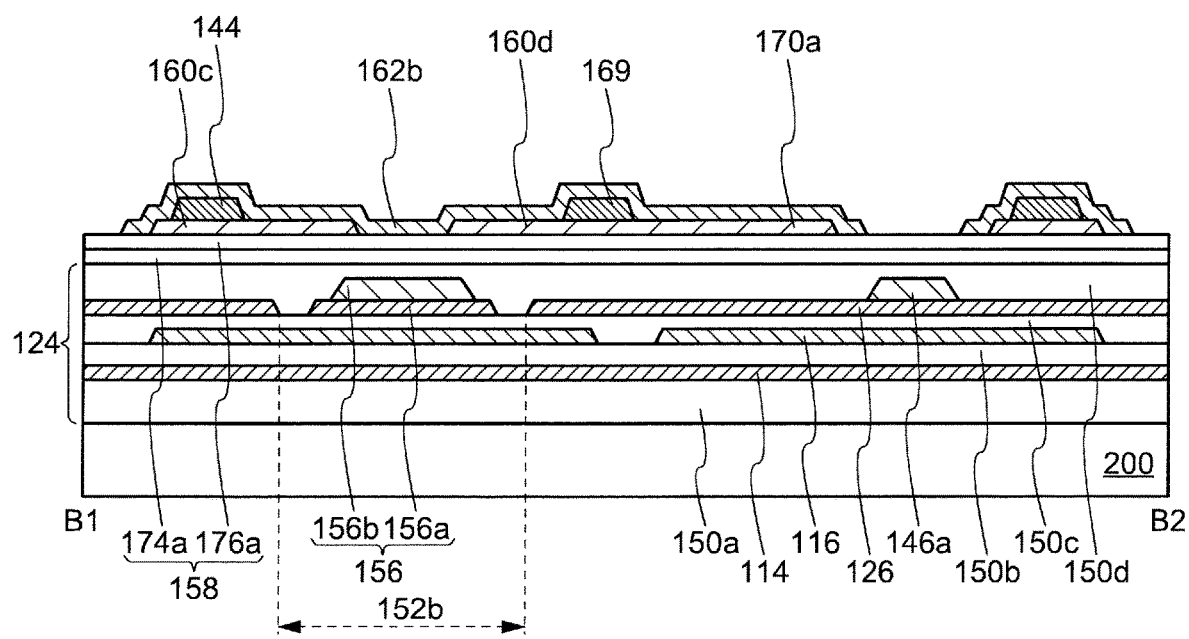

FIG. 14A and FIG. 14B show a stage of forming the oxide semiconductor layers 162 (the first oxide semiconductor layer 162a and the second oxide semiconductor layer 162b). The first oxide semiconductor layer 162a is formed to cover substantially the entirety of the first transparent conductive layer 160a and the second transparent conductive layer 160b. The second oxide semiconductor layer 162b is formed to cover substantially the entirety of the third transparent conductive layer 160c and the fourth transparent conductive layer 160d. The first oxide semiconductor layer 162a and the second oxide semiconductor layer 162b are formed as follows. An oxide semiconductor film is formed by sputtering with an oxide semiconductor being used as a target, and then is patterned into island-like as shown in FIG. 4 by lithography. Thus, the first oxide semiconductor layer 162a and the second oxide semiconductor layer 162b are formed. The first oxide semiconductor layer 162a is formed to be in contact with, and thus is electrically connected with, the first transparent conductive layer 160a and the second transparent conductive layer 160b. The second oxide semiconductor layer 162b is formed to be in contact with, and thus is electrically connected with, the third transparent conductive layer 160c and the fourth transparent conductive layer 160d.

Figure 15A:
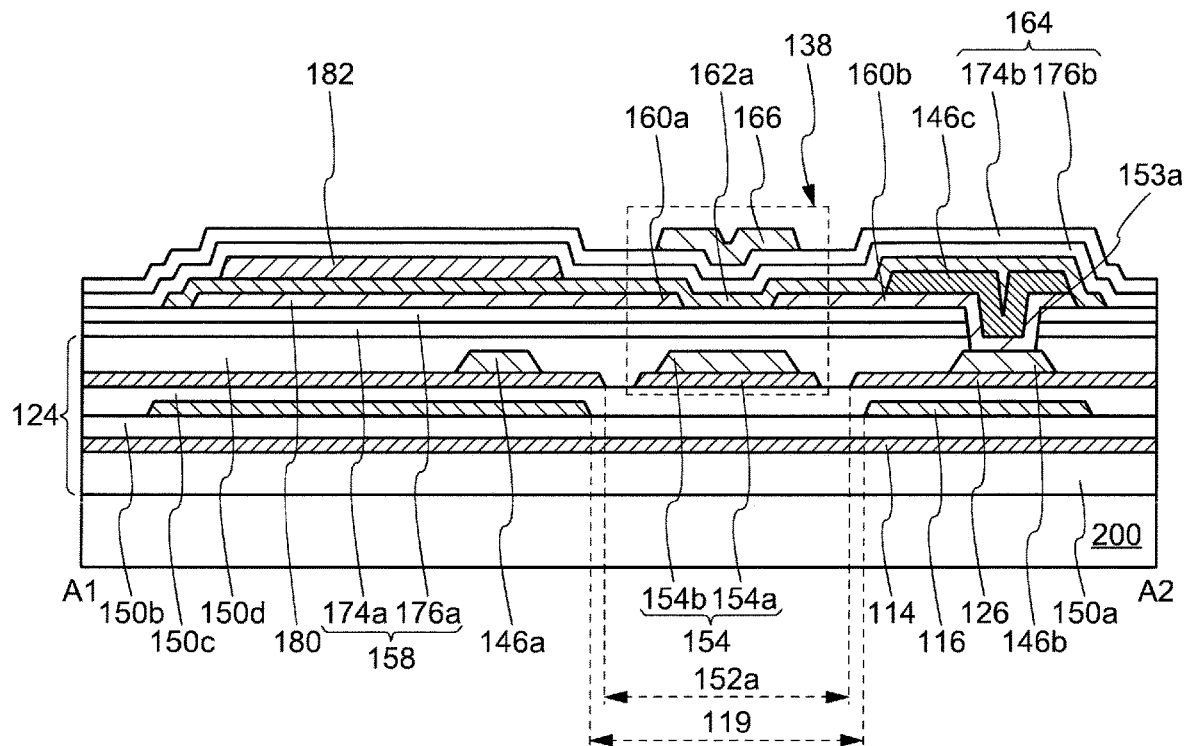
FIG. 15A and FIG. 15B are each a cross-sectional view of the pixel showing a manufacturing step of the touch panel display in an embodiment according to the present invention.
Figure 15B:
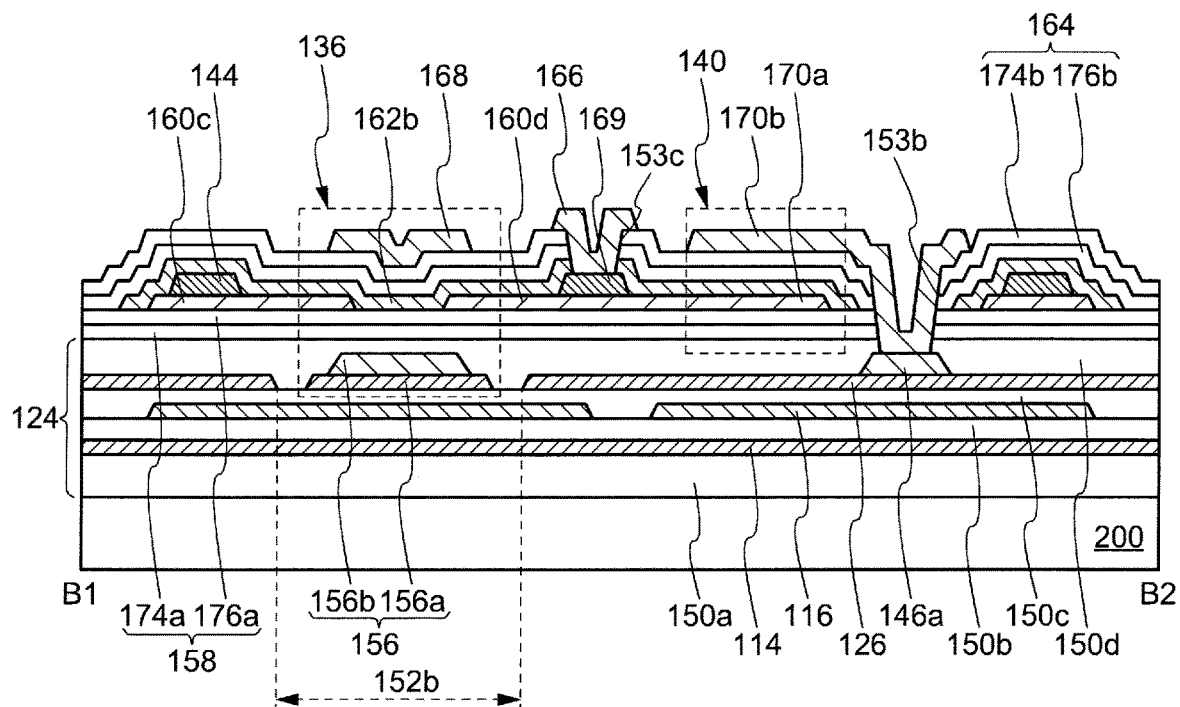

FIG. 15A and FIG. 15B show a stage of forming the electron transfer layer 182, the second insulating layer 164, the second gate electrodes 166 and 168 and the second capacitance electrode 170b on the oxide semiconductor layers 162 (the first oxide semiconductor layer 162a and the second oxide semiconductor layer 162b).

As shown in FIG. 15A, the electron transfer layer 182 is formed on the first oxide semiconductor layer 162a. The electron transfer layer 182 is in contact with a top surface of the first oxide semiconductor layer 162a and is individually provided for each pixel 110a. The electron transfer layer 182 is formed in a region overlapping the first electrode 180 continuous from the first transparent conductive layer 160a. Like the first oxide semiconductor layer 162a, the electron transfer layer 182 is formed of an oxide semiconductor. The electron transfer layer 182 is formed of an oxide semiconductor material different from the oxide semiconductor material used to form the first oxide semiconductor layer 162a, and thus is selectively processable on the first oxide semiconductor layer 162a. More specifically, the electron transfer layer 182 is formed of an oxide semiconductor material having a higher etching rate than the oxide semiconductor material of the first oxide semiconductor layer 162a, and thus is selectively processable. A multiple tone photomask is used for this process, so that the first oxide semiconductor layer 162a and the electron transfer layer 182 are formed at the same time by one exposure step.

For example, it is preferred that the electron transfer layer 182 is formed of a zinc-based oxide semiconductor layer not containing tin (Sn) (e.g., $ZnSiO_x$, ZnMgO, $ZnGaO_x$, etc.), whereas the oxide semiconductor layer 162 is formed of a tin (Sn)-based oxide semiconductor layer not containing zinc (Zn), magnesium (Mg) or the like (e.g., $InGaSnO_x$, $InWSnO_x$, $InSiSnO_x$, etc.). In other words, it is preferred that the electron transfer layer 182 contains zinc oxide and at least one selected from silicon oxide, magnesium oxide and gallium oxide, and that the oxide semiconductor layer 162 contains tin oxide, and at least one selected from indium oxide, gallium oxide, tungsten oxide and silicon oxide. With such an arrangement, the etching rates of the two layers are made different from each other to increase the selection ratio. More specifically, the etching rate of the electron transfer layer 182 is made higher than the etching rate of the oxide semiconductor layer 162. In addition, the bandgaps of the oxide semiconductor layer 162 and the electron transfer layer 182 are optimized. More specifically, the bandgap of the electron transfer layer 182 is made larger than the bandgap of the oxide semiconductor layer 162. For example, in the case where the bandgap of the oxide semiconductor layer 162 is 3.0 eV or larger, the bandgap of the electron transfer layer 182 is larger than, or equal to, the bandgap of the oxide semiconductor layer 162, preferably 3.4 eV or larger. In the case of having a bandgap of 3.4 eV or larger, the electron transfer layer 182 does not absorb blue light and thus improves the reliability. It is preferred that the oxide semiconductor layer 162 has a thickness of 10 nm to 100 nm, whereas the electron transfer layer 182 has a thickness of 50 nm to 500 nm. In the case where the oxide semiconductor layer 162 and the electron transfer layer 182 each have a thickness in such a range, generation of plasmon in the first electrode 180 formed of a transparent conductive oxide is suppressed, which improves the light emission efficiency of the organic EL element 134.

The second insulating layer 164 is formed to cover the oxide semiconductor layer 162 and the electron transfer layer 182. The second insulating layer 164 is formed by, for example, stacking the second silicon oxide film 176b and the second silicon nitride film 174b from the side of the oxide semiconductor layer 162. As a result, the first silicon oxide film 176a is formed below the oxide semiconductor layer 162, and the second silicon oxide film 176b is formed above the oxide semiconductor layer 162. The oxide semiconductor layer 162 is held between the oxide insulating films, so that generation of a defect caused by oxygen deficiency (donor level) is suppressed.

As shown in FIG. 15B, the contact hole 153b running through the second insulating layer 164, the first insulating layer 158 and the fourth transparent resin layer 150d and exposing the first common line 146a is formed. The contact hole 153c running through the second insulating layer 164 and the first oxide semiconductor layer 162a and exposing the drain electrode 169 is formed.

Then, the second gate electrodes 166 and 168 and the second capacitance electrode 170b are formed. The second gate electrodes 166 and 168 and the second capacitance electrode 170b are formed by performing lithography and etching on a metal film formed on a top surface of the second insulating layer 164. The second gate electrode 166 is formed to include a region overlapping the first gate electrode 154, and the second gate electrode 168 is formed to include a region overlapping the first gate electrode 156. As a result, the driving transistor 138 and the selection transistor 136 are formed. The second gate electrode 166 is electrically connected with the drain electrode 169 via the contact hole 153c. The second capacitance electrode 170b is electrically connected with the first common line 146a via the contact hole 153b. The capacitance element 140 is provided in a region where the first capacitance electrode 170a and the second capacitance electrode 170b overlap each other with the second insulating layer 164 being located between the first capacitance electrode 170a and the second capacitance electrode 170b.

Figure 16A:
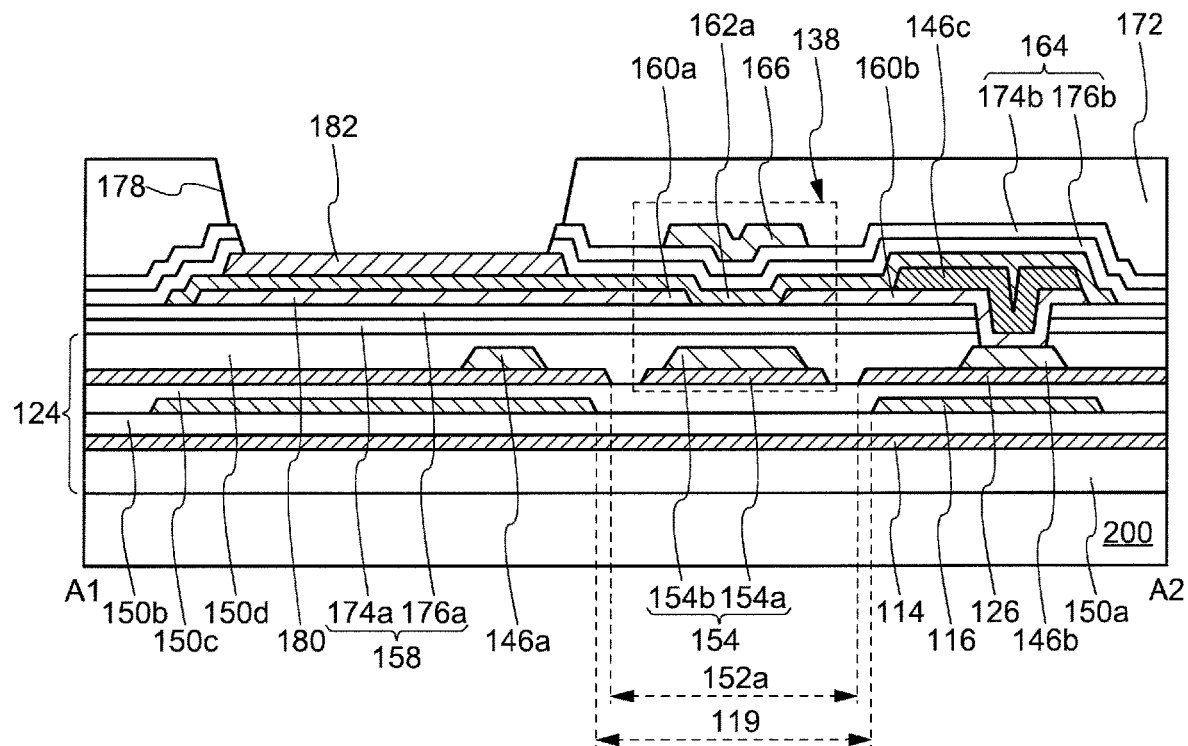
FIG. 16A and FIG. 16B are each a cross-sectional view of the pixel showing a manufacturing step of the touch panel display in an embodiment according to the present invention.
Figure 16B:
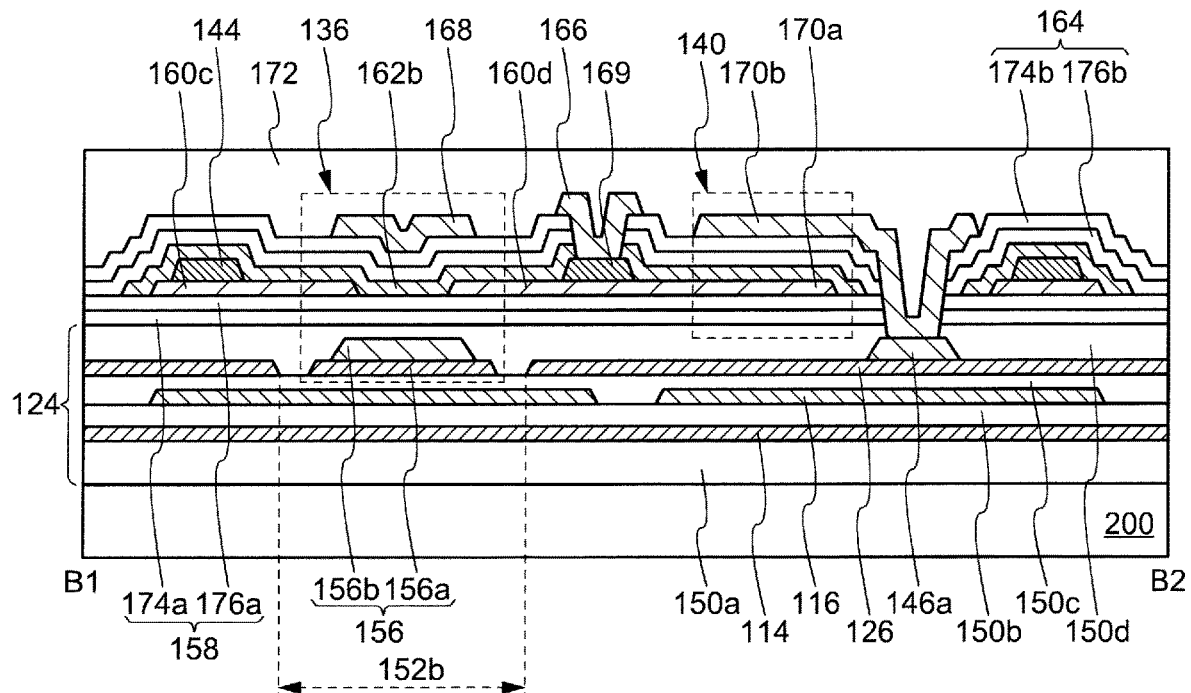

FIG. 16A and FIG. 16B show a stage of forming the flattening layer 172 and forming the opening 178 exposing the electron transfer layer 182. The flattening layer 172 is formed to embed the selection transistor 136, the driving transistor 138 and the capacitance element 140. The flattening layer 172 is formed of an organic resin material such as, for example, an acrylic resin, a polyimide resin, an epoxy resin, a polyamide resin or the like. In the flattening layer 172, the opening 178 exposing the electron transfer layer 182 is formed. In the case where the flattening layer 172 is formed of a photosensitive resin material, the opening 178 is formed by performing exposure by use of a photomask. In the second insulating layer 164, an opening may be formed in a region corresponding to the opening 178 before the flattening layer 172 is formed. It is preferred that the opening 178 has a tapered inner surface for the formation of the organic EL element 134.

Then, the electron injection layer 184, the light emitting layer 186, the hole transfer layer 188, the hole injection layer 190 and the second electrode 192 are formed. The transparent resin substrate 124 is delaminated from the support substrate 200. The transparent resin substrate 124 is delaminated by directing laser light toward the support substrate 200. More specifically, ablation is caused between the transparent resin substrate 124 and the support substrate 200 to weaken the adherence force of the first transparent resin layer 150a and thus to delaminate the transparent resin substrate 124.

As a result of the above-described steps, the touch panel display 100 including the pixels 110a shown in FIG. 5A and FIG. 5B is manufactured. The electron injection layer 184 may be formed by sputtering method with C12A7 electride being used as a sputtering target. The electron injection layer 184 is commonly used for the plurality of pixels 110a, and therefore, is formed in substantially the entirety of the region where the pixels 110a are located. The light emitting layer 186 is formed of a different light emitting material for each of a red pixel, a green pixel and a blue pixel. In the case where the light emitted from the light emitting layer 186 has a white light emission spectrum, the light emitting layer 186 is formed, as a layer common for the plurality of pixels 110a, in substantially the entirety of the region where the pixels 110a are located. The hole transfer layer 188 and the hole injection layer 190 are each formed, as a layer common for the plurality of pixels 110a, in substantially the entirety of the region where the pixels 110a are located. The second electrode 192 is used as a common electrode for the plurality of pixels 110a, and therefore, are formed in substantially the entirety of the region where the pixels 110a are located.

Figure 17:
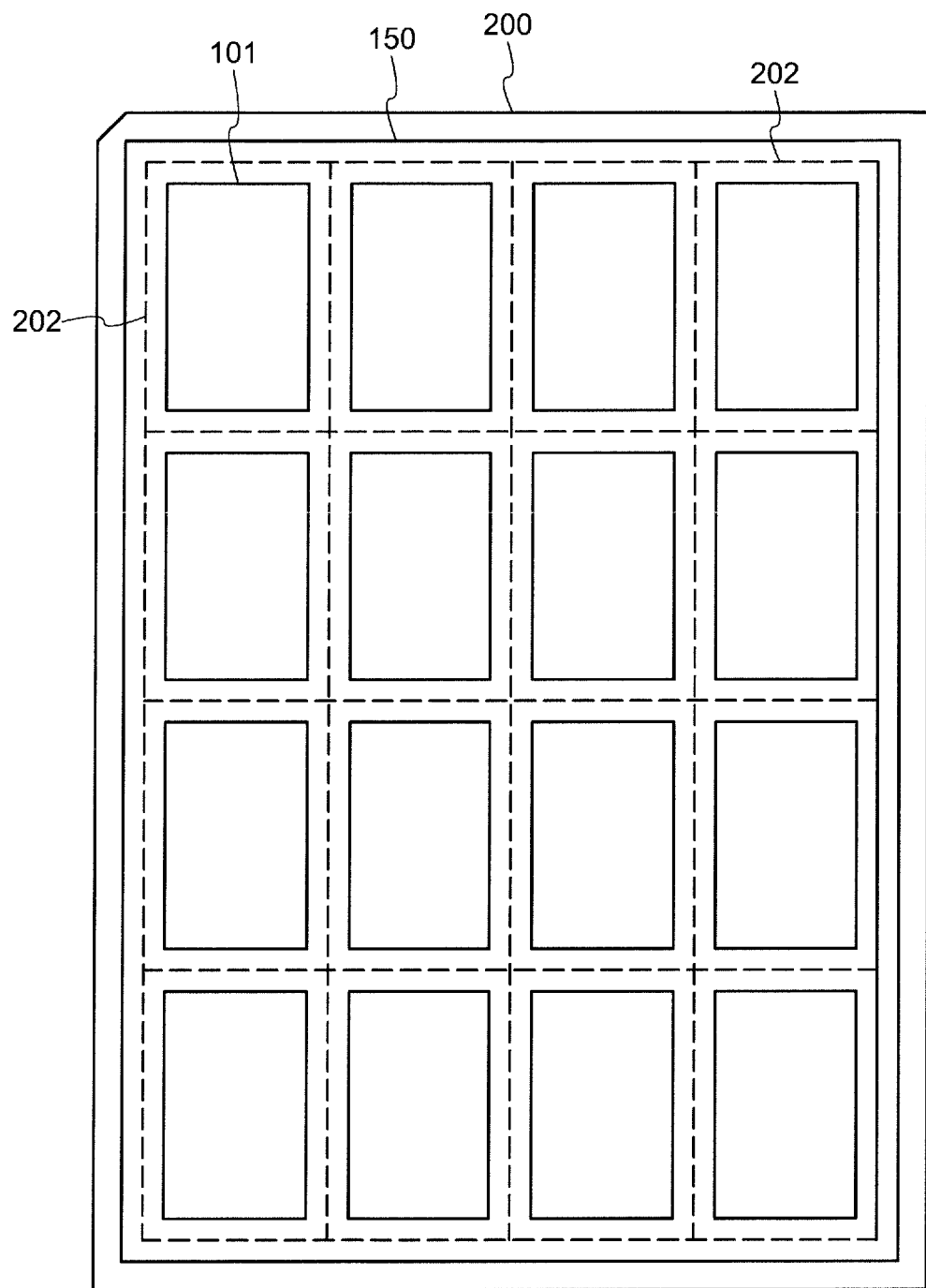
FIG. 17 is a plan view showing a state in which a plurality of display panels is formed on a support substrate in a manufacturing step of the touch panel display in an embodiment according to the present invention.

In the above-described steps, as shown in FIG. 17, the support substrate 200 may be a mother glass substrate (substrate on which a plurality of devices is to be formed), so that a plurality of display panels 101 are formed on the support substrate 200. In this case, the transparent resin layers 150 are formed on substantially the entirety of a surface of the support substrate 200 except for an end portion thereof, and the plurality of display panels 101 are formed in the region where the transparent resin layers 150 are formed. In order to individually provide the plurality of display panels 101 formed on the support substrate 200, the transparent resin substrate 124 including the transparent resin layers 150 is divided along a division region 202. The division of the transparent resin substrate 124 may be performed by laser processing.

In this case, it is preferred that the shield electrode 126 of a transparent conductive film is not formed in the division region 202. It is also preferred that neither the first insulating layer 158 nor the second insulating layer 164 formed of an inorganic insulating film such as a silicon oxide film, a silicon nitride film or the like is formed in the division region 202. The transparent conductive film formed of an inorganic material is not formed in the division region 202, so that the shield electrode 126 is not damaged at the time of division. Similarly, the inorganic insulating films are not formed in the division region 202, so that neither the first insulating layer 158 nor the second insulating layer 164 is damaged at the time of division.

The method for manufacturing the touch panel display 100 in this embodiment uses a multiple tone mask to decrease the number of photomasks needed for the manufacturing. Use of the multiple tone mask allows a plurality of patterns (the shield electrode 126 and the first gate electrodes 154 and 156, the second transparent conductive layer 160b and the third common line 146c, the third transparent conductive layer 160c and the data signal line 144, the fourth transparent conductive layer 160d and the drain electrode 169, the first oxide semiconductor layer 162a and the electrode transfer layer 182) to be formed by one exposure step. This increases the productivity of the touch panel displays 100 and decreases the manufacturing cost thereof. In other words, even in the case where the electrodes forming an embedded-type touch panel (the first sensor electrodes 114 and the second sensor electrodes 116) are formed in the display, the number of the photomasks needed for the manufacturing is decreased.

In this embodiment, the selection transistor 136 and the driving transistor 138 are both of a dual-gate structure. The present invention is not limited to this. For example, the selection transistor 136 may be of a top-gate type with the first gate electrode 156 being omitted. The pixel circuit is not limited to the circuit shown in FIG. 3. The transistors and the organic EL element in this embodiment are applicable to a structure in which each pixel includes three or more transistors.

Second Embodiment

In this embodiment, regrading a touch panel display including a touch sensor function of sensing a touch on a screen and a display function of displaying an image on the screen, differences in the pixel structure from the first embodiment will be described. In the following description, such differences from the first embodiment will be described.

Figure 18:
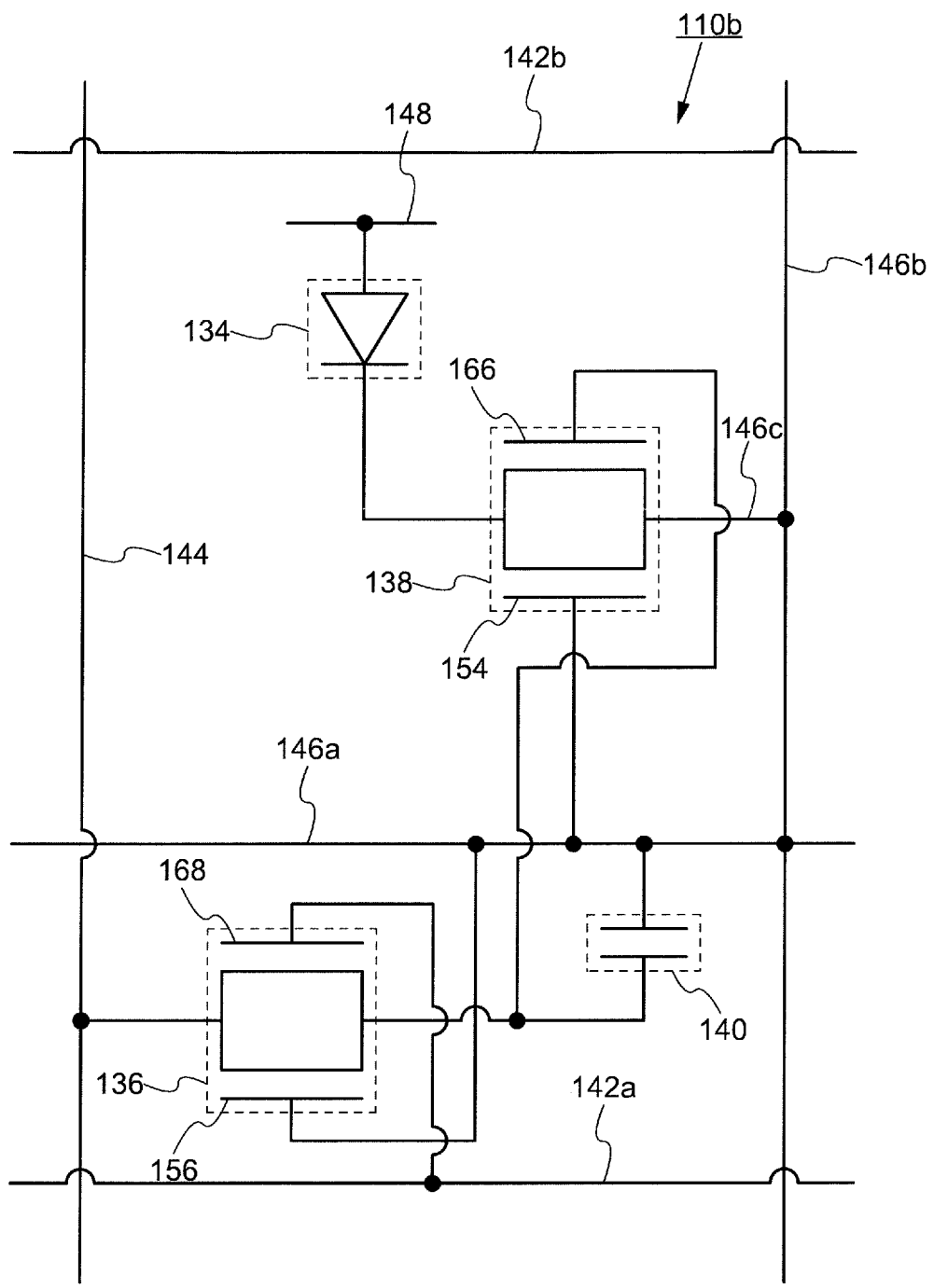
FIG. 18 shows an example of equivalent circuit of a pixel in a touch panel display in an embodiment according to the present invention.

FIG. 18 shows an equivalent circuit of a pixel 110b in this embodiment. Unlike in the first embodiment, the first gate electrode 156 of the selection transistor 136 and the first gate electrode 154 of the driving transistor 138 are electrically connected with the first common line 146a. Except for this, the equivalent circuit shown in FIG. 18 is substantially the same as the equivalent circuit shown in FIG. 3.

Figure 19:
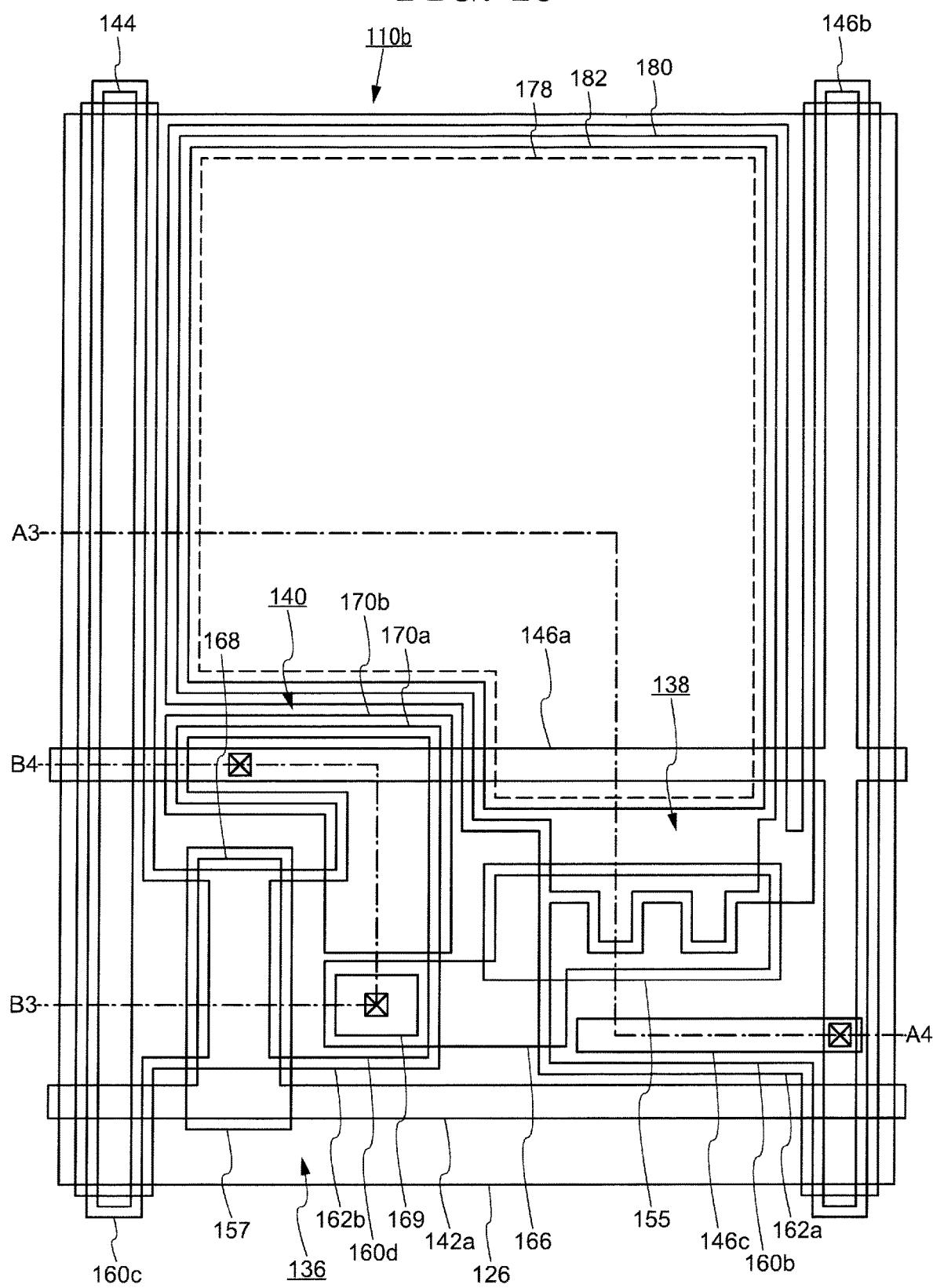
FIG. 19 is a plan view showing a structure of the pixel in the touch panel display in an embodiment according to the present invention.
Figure 20A:
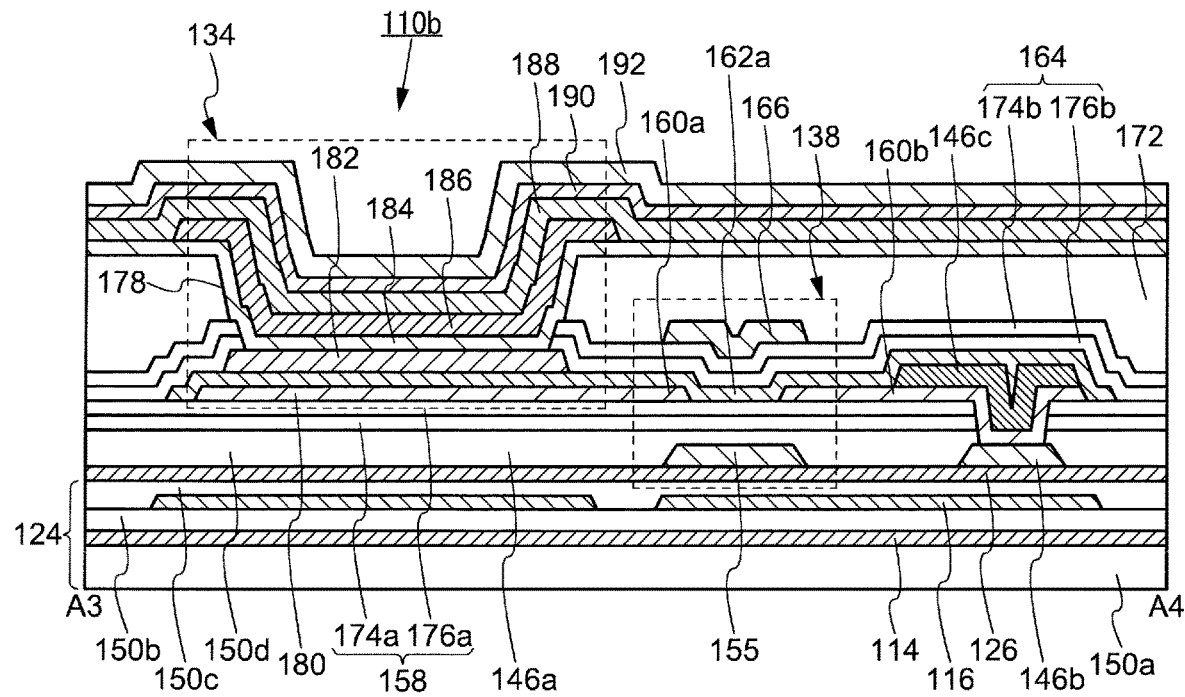
FIG. 20A and FIG. 20B are each a cross-sectional view showing a structure of the pixel in the touch panel display in an embodiment according to the present invention.
Figure 20B:
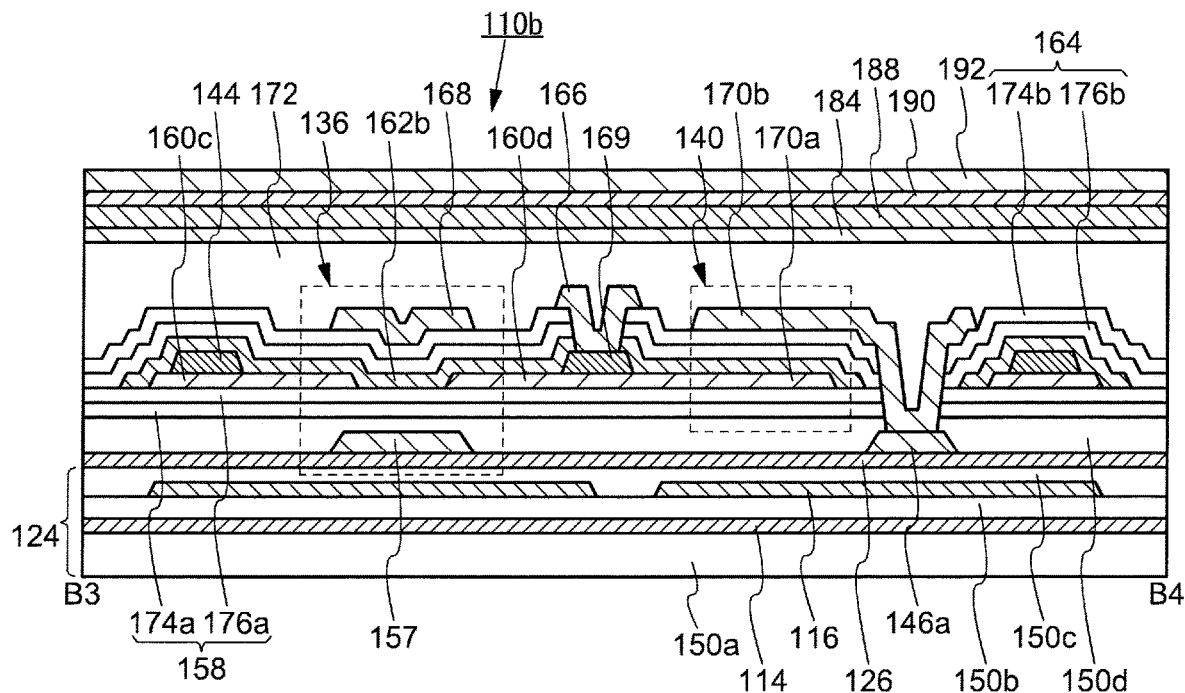

FIG. 19 shows an example of planar structure of the pixel 110b in the touch panel display in this embodiment. FIG. 20A shows a cross-sectional structure of the pixel 110b taken along line A3-A4 shown in FIG. 19. FIG. 20B shows a cross-sectional structure of the pixel 110b taken along line B3-B4 shown in FIG. 19. In the following description, these figures will be referred to, as necessary.

The shield electrode 126 is provided in the entirety of the pixel 110b. The shield electrode 126 is provided to overlap the driving transistor 138 and the selection transistor 136. In other words, the shield electrode 126 in the pixel 110b this embodiment does not have an opening, unlike the shield electrode 126 in the pixel 110a in the first embodiment.

The driving transistor 138 includes a light blocking electrode 155 provided in a region overlapping the second gate electrode 166. The light blocking electrode 155 is located between the shield electrode 126 and the fourth transparent resin layer 150d, and is in contact with the shield electrode 126. The light blocking electrode 155 is formed of a metal film, like the first gate electrode layer 154b in the first embodiment. The shield electrode 126 is formed of a transparent conductive film whereas the light blocking electrode 155 is formed of a metal film, so that light incident on the transparent resin substrate 124 is prevented from being incident on the channel region of the driving transistor 138. This suppresses the threshold voltage of the driving transistor 138 from being fluctuated.

The light blocking electrode 155 is supplied with the same potential as that of the shield electrode 126. The shield electrode 126 is supplied with, for example, the ground potential, and thus the light blocking electrode 155 is also supplied with the ground potential. The driving transistor 138 is supplied, via the first insulating layer 158, with a certain potential at a surface, of the first oxide semiconductor layer 162a where channel region is formed, opposite to the second electrode 166 (the surface opposite to the second electrode 166 is referred to as a "back channel"). Since the potential of the back channel is stabilized, the threshold voltage of the driving transistor 138 is suppressed from being fluctuated. In this embodiment, the light blocking electrode 155 may be omitted.

Like the driving transistor 138, the selection transistor 136 includes a light blocking electrode 157. Therefore, the selection transistor 136 is protected against light by the light blocking electrode 157, and thus the potential of the back channel is stabilized. This suppresses the threshold voltage of the selection transistor 136 from being fluctuated.

The light blocking electrodes 155 and 157 on the shield electrode 126 may be patterned by use of multiple tone exposure, like in the first embodiment. More specifically, the light blocking electrodes 155 and 157 may be formed with no increase in the number of the photomasks, like in the first embodiment.

In this embodiment, the pixel 110b has substantially the same structure as that of the pixel 110a in the first embodiment except for the light blocking electrodes 155 and 157. Therefore, the touch panel display in this embodiment provides substantially the same function and effect as those in the first embodiment.

Third Embodiment

In this embodiment, regrading a touch panel display including a touch sensor function of sensing a touch on a screen and a display function of displaying an image on the screen, differences in the pixel structure from the first embodiment will be described. In the following description, such differences from the first embodiment will be described.

Figure 21:
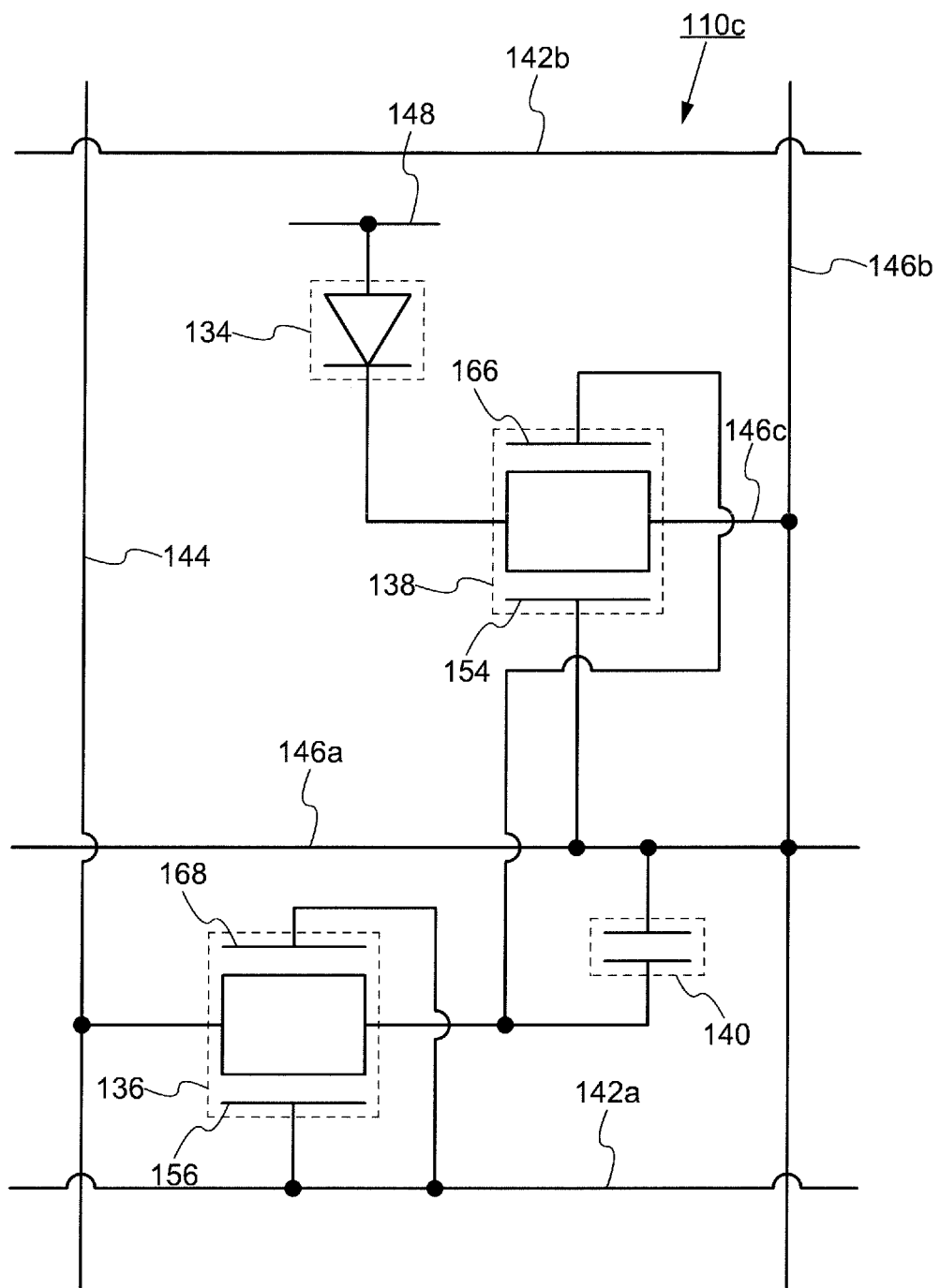
FIG. 21 shows an example of equivalent circuit of a pixel in a touch panel display in an embodiment according to the present invention.

FIG. 21 shows an equivalent circuit of a pixel 110c in this embodiment. Unlike in the first embodiment, the first gate electrode 154 of the driving transistor 138 is electrically connected with the first common line 146a. Except for this, the equivalent circuit shown in FIG. 21 is substantially the same as the equivalent circuit shown in FIG. 3.

Figure 22:
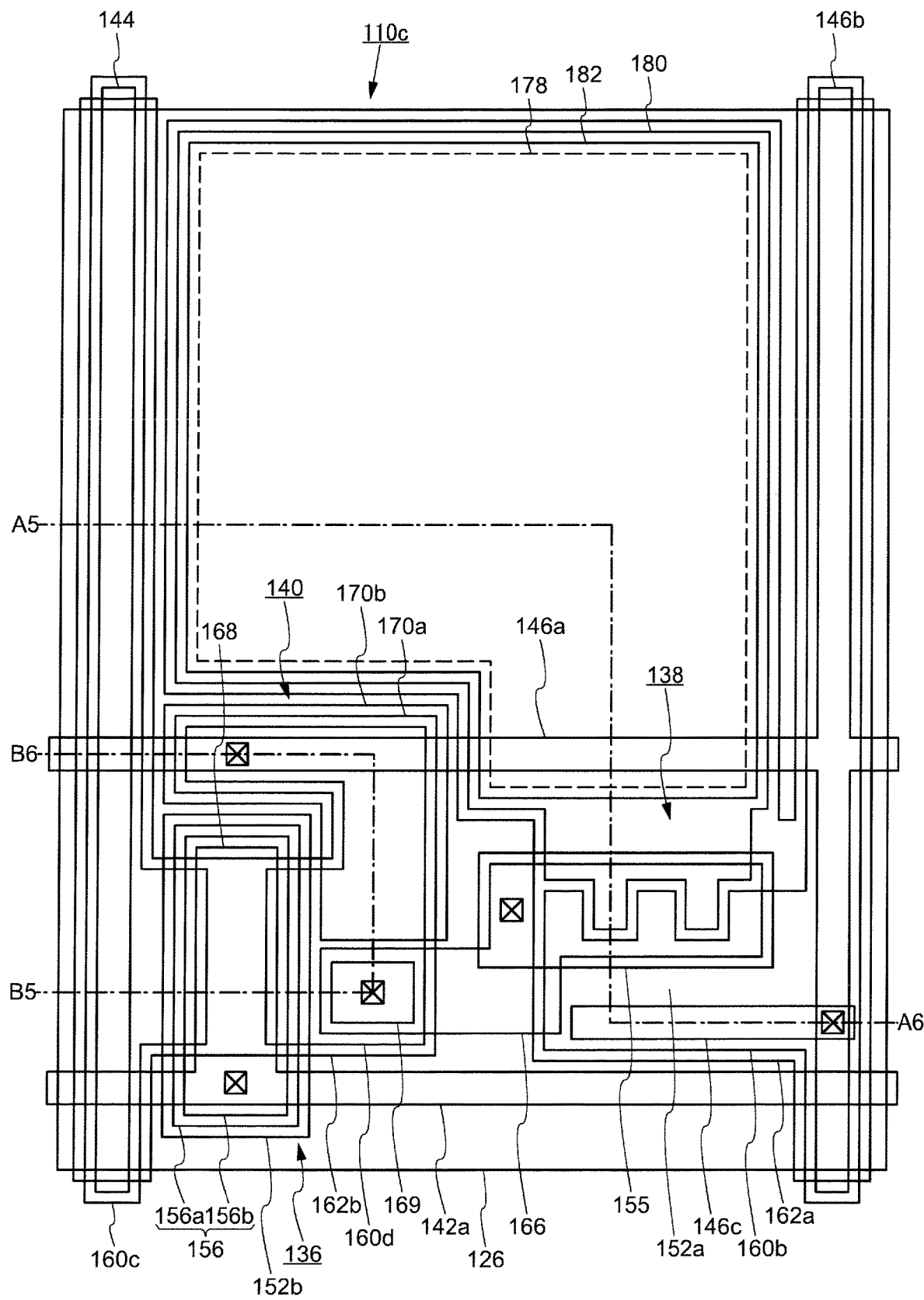
FIG. 22 is a plan view showing a structure of the pixel in the touch panel display in an embodiment according to the present invention.
Figure 23A:
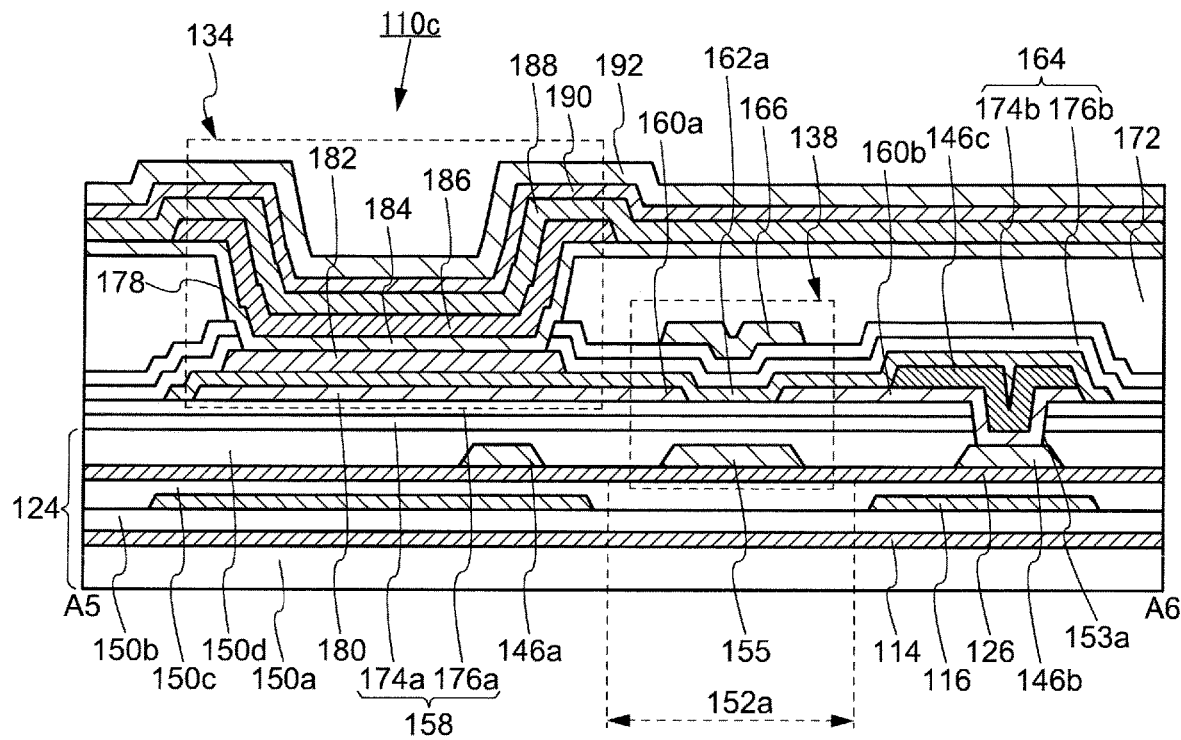
FIG. 23A and FIG. 23B are each a cross-sectional view showing a structure of the pixel in the touch panel display in an embodiment according to the present invention.
Figure 23B:
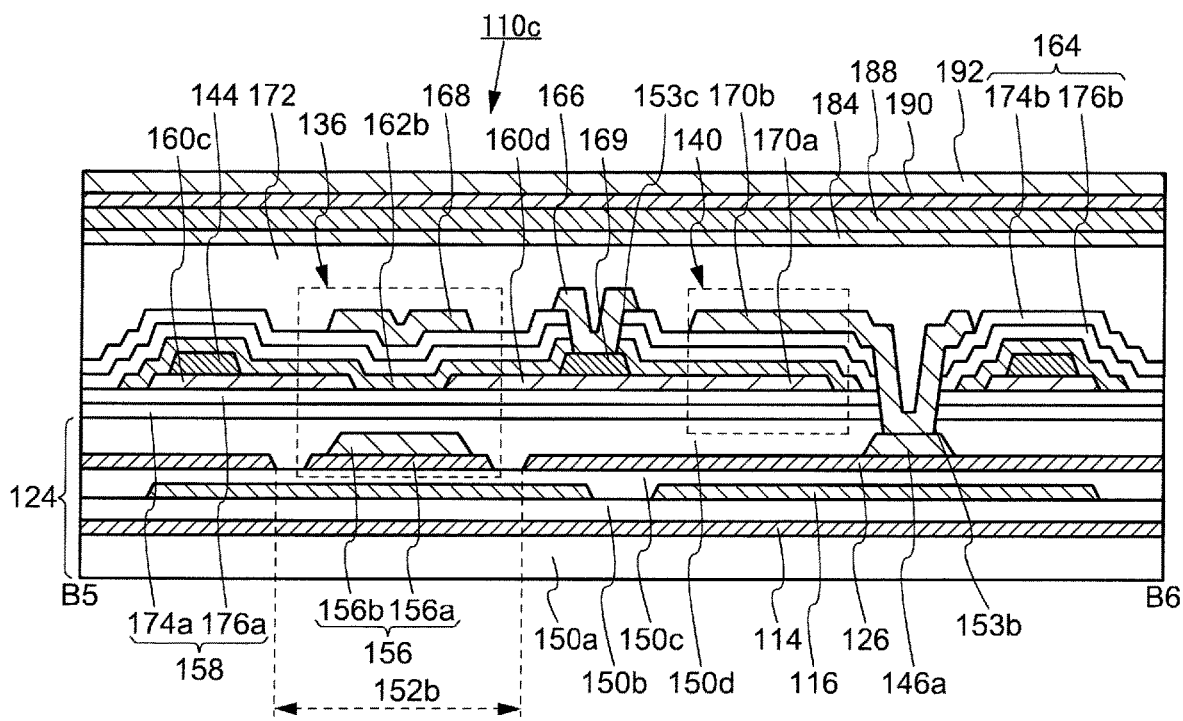

FIG. 22 shows an example of planar structure of the pixel 110c in the touch panel display in this embodiment. FIG. 23A shows a cross-sectional structure of the pixel 110c taken along line A5-A6 shown in FIG. 22. FIG. 23B shows a cross-sectional structure of the pixel 110c taken along line B5-B6 shown in FIG. 22. In the following description, these figures will be referred to, as necessary.

In the pixel 110c, the shield electrode 126 is provided to cover the driving transistor 138. By contrast, the shield electrode 126 has the second opening 152b in a region where the selection transistor 136 is provided. The driving transistor 138 includes the light blocking electrode 155 provided in a region overlapping the second gate electrode 166. The light blocking electrode 155 is located between the shield electrode 126 and the fourth transparent resin layer 150d, and is in contact with the shield electrode 126. With such a structure, light incident on the transparent resin substrate 124 is prevented from being incident on the channel region of the driving transistor 138. This suppresses the threshold voltage of the driving transistor 138 from being fluctuated.

The selection transistor 136 has a dual-gate structure in which the second semiconductor oxide layer 162b is held between the first gate electrode 156 and the second gate electrode 168. This improves the switching characteristics of, and decreases the off-current of, the selection transistor 136.

In this embodiment, the pixel 110*c* has substantially the same structure as that of the pixel 110*a* in the first embodiment except for the shield electrode 126 and the light blocking electrode 155. Therefore, the touch panel display in this embodiment provides substantially the same function and effect as those in the first embodiment.

Fourth Embodiment

In this embodiment, regrading a touch panel display including a touch sensor function of sensing a touch on a screen and a display function of displaying an image on the screen, differences in the pixel structure from the first embodiment will be described. In the following description, such differences from the first embodiment will be described.

Figure 24:
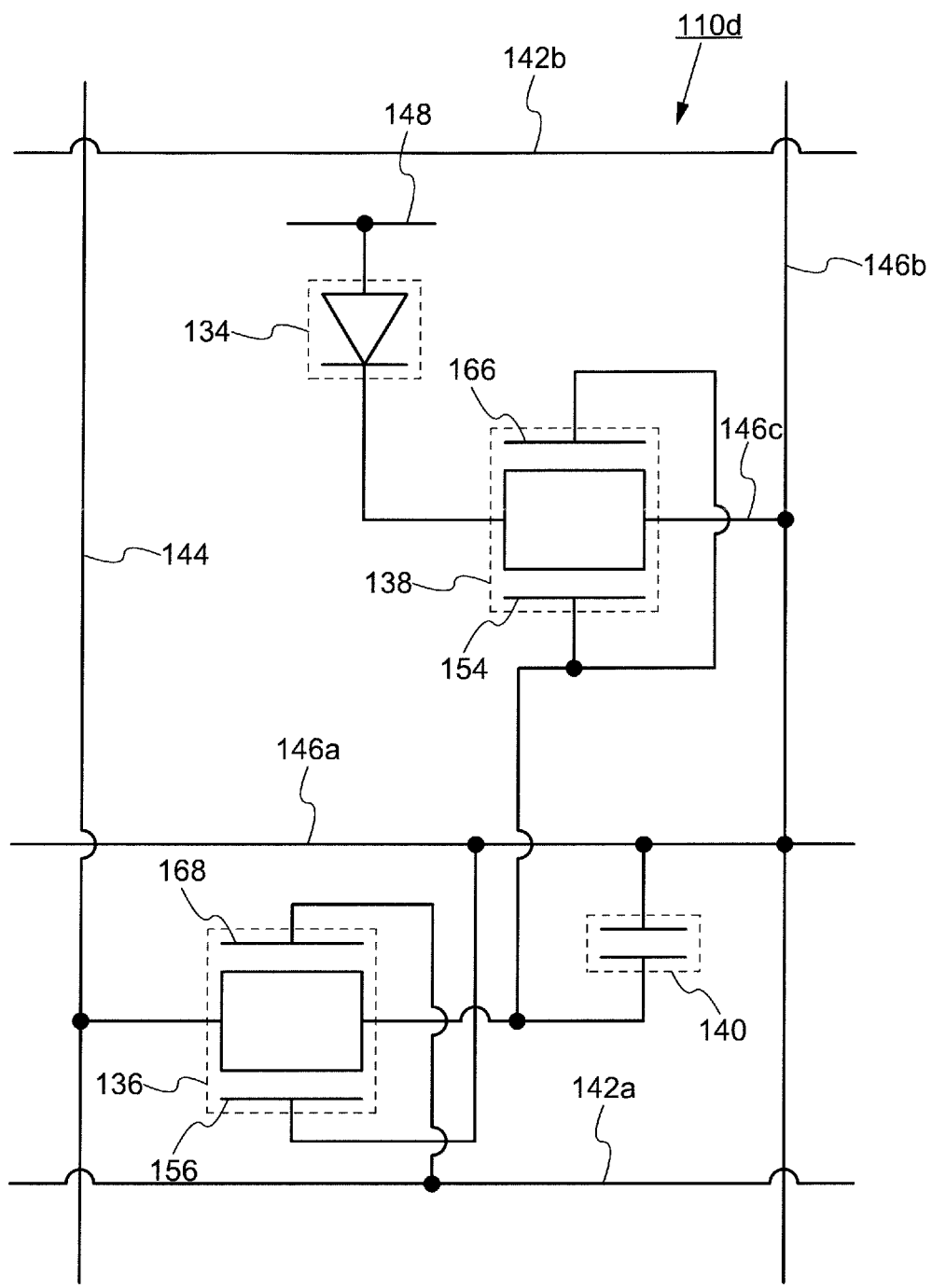
FIG. 24 shows an example of equivalent circuit of a pixel in a touch panel display in an embodiment according to the present invention.

FIG. 24 shows an equivalent circuit of a pixel 110*d* in this embodiment. Unlike in the first embodiment, the first gate electrode 156 of the selection transistor 136 is electrically connected with the first common line 146*a*. Except for this, the equivalent circuit shown in FIG. 24 is the same as the equivalent circuit shown in FIG. 3.

Figure 25:
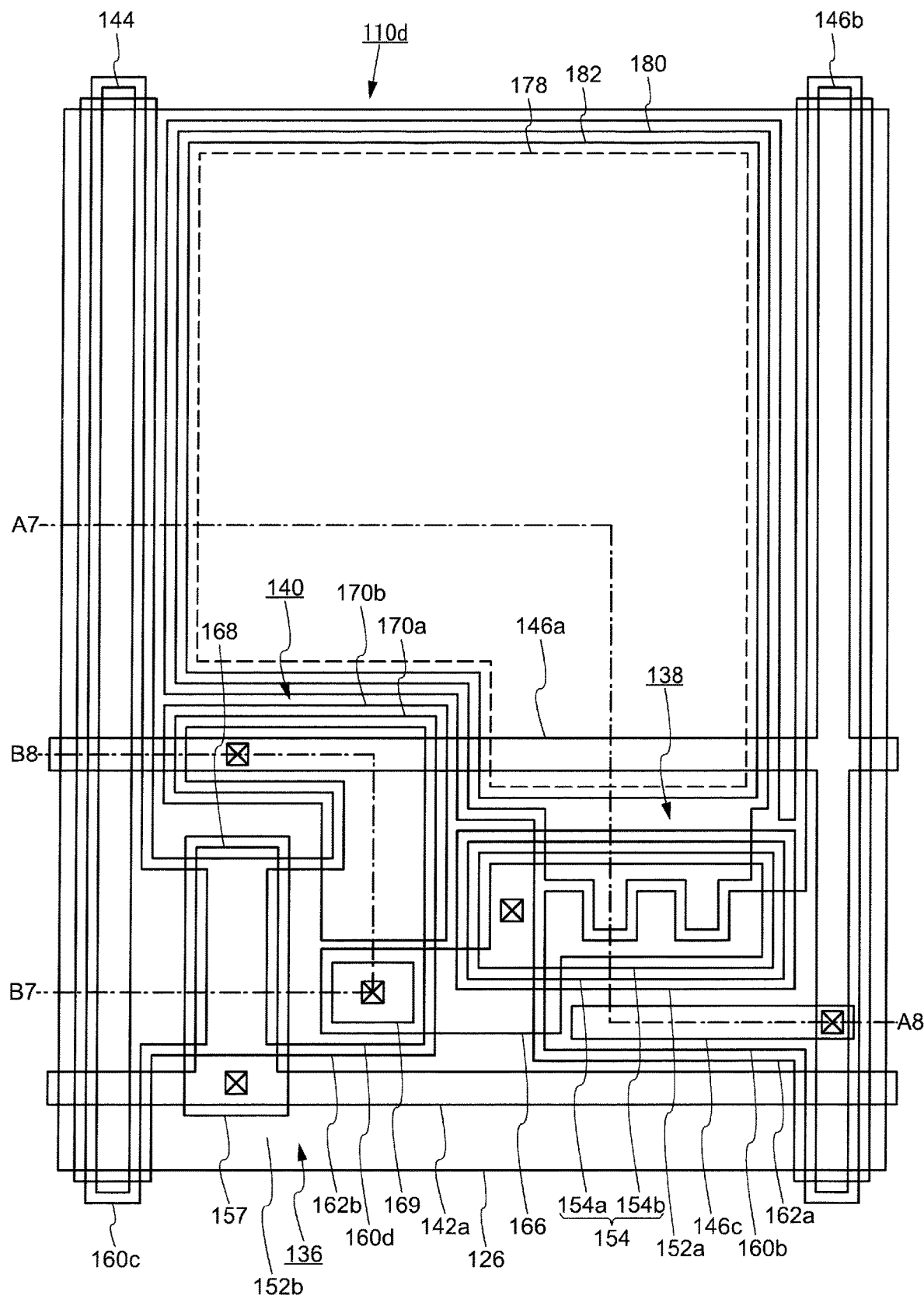
FIG. 25 is a plan view showing a structure of the pixel in the touch panel display in an embodiment according to the present invention.
Figure 26A:
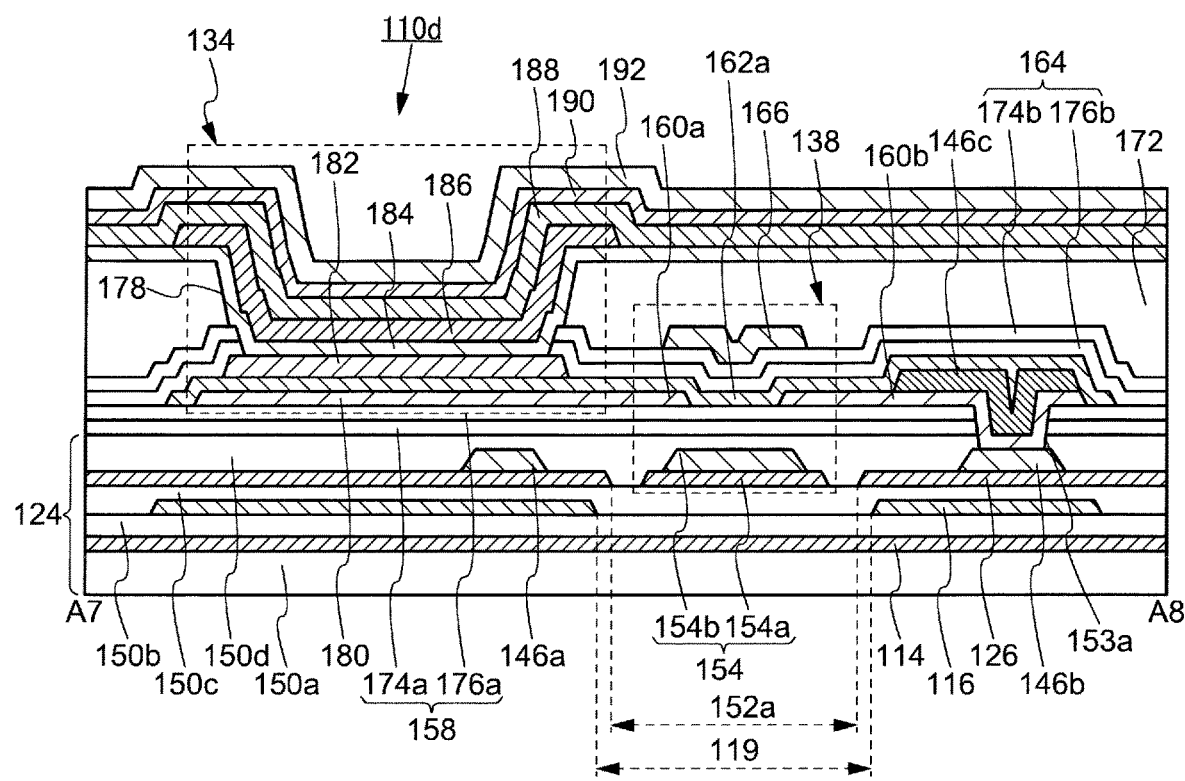
FIG. 26A and FIG. 26B are each a cross-sectional view showing a structure of the pixel in the touch panel display in an embodiment according to the present invention.
Figure 26B:
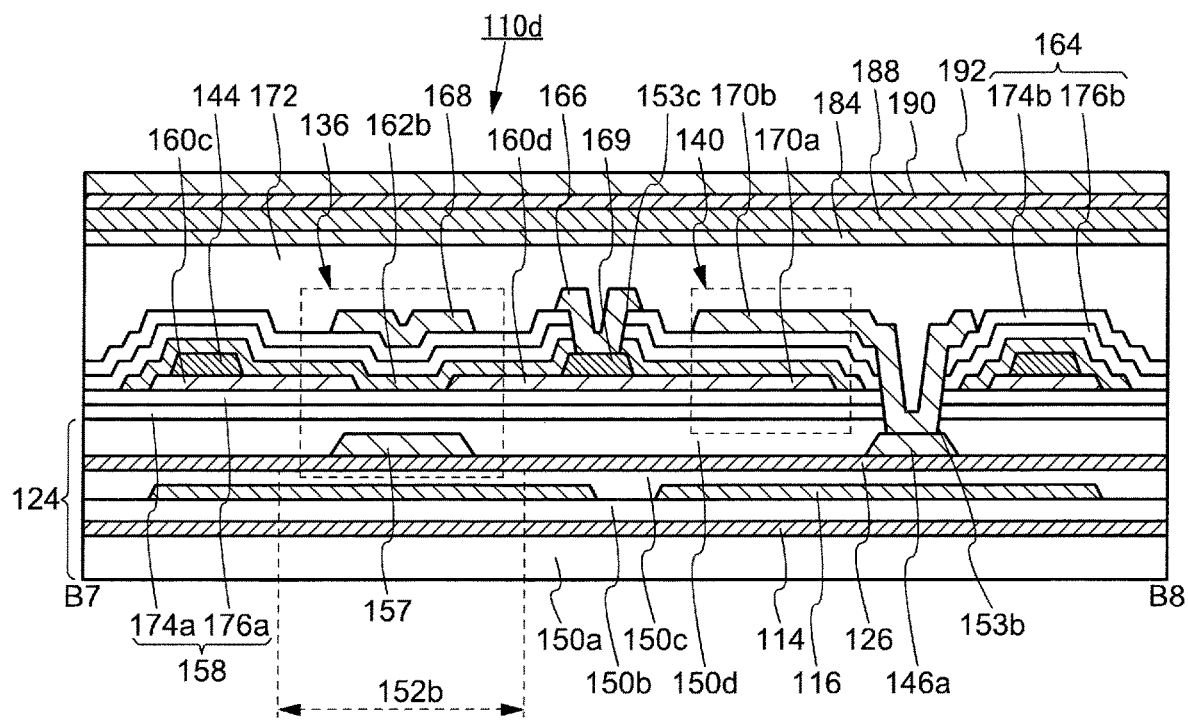

FIG. 25 shows an example of planar structure of the pixel 110*d* in the touch panel display in this embodiment. FIG. 26A shows a cross-sectional structure of the pixel 110*d* taken along line A7-A8 shown in FIG. 25. FIG. 26B shows a cross-sectional structure of the pixel 110*d* taken along line B7-B8 shown in FIG. 25. In the following description, these figures will be referred to, as necessary.

In the pixel 110*d*, the shield electrode 126 is provided to cover the selection transistor 136. By contrast, the shield electrode 126 has the first opening 152*a* in a region where the driving transistor 138 is provided. The selection transistor 136 includes the light blocking electrode 157 provided in a region overlapping the second gate electrode 168. The light blocking electrode 157 is located between the shield electrode 126 and the fourth transparent resin layer 150*d*, and is in contact with the shield electrode 126. With such a structure, light incident on the transparent resin substrate 124 is prevented from being incident on the channel region of the selection transistor 136. This suppresses the threshold voltage of the selection transistor 136 from being fluctuated.

Meanwhile, the driving transistor 138 has a dual-gate structure in which the first semiconductor oxide layer 162*a* is held between the first gate electrode 154 and the second gate electrode 166. The first gate electrode 154 and the second gate electrode 166 are electrically connected with each other and thus are supplied with the same potential. This improves the current driving capability of the driving transistor 138, and thus the driving transistor 138 supplies a sufficient level of current to drive the organic EL element 134.

In this embodiment, the pixel 110*d* has substantially the same structure as that of the pixel 110*a* in the first embodiment except for the shield electrode 126 and the light blocking electrode 157. Therefore, the touch panel display in this embodiment provides substantially the same function and effect as those in the first embodiment.

Fifth Embodiment

In this embodiment, a form in which the structures of the driving transistor 138 and the selection transistor 136 are different from those in the first embodiment will be described. Specifically, the driving transistor 138 and the selection transistor 136 are formed of a polycrystalline silicon film. In the following description, components that are the same as those in the first embodiment will not be described, and the above-described differences from the first embodiment will be mainly described.

Figure 27:
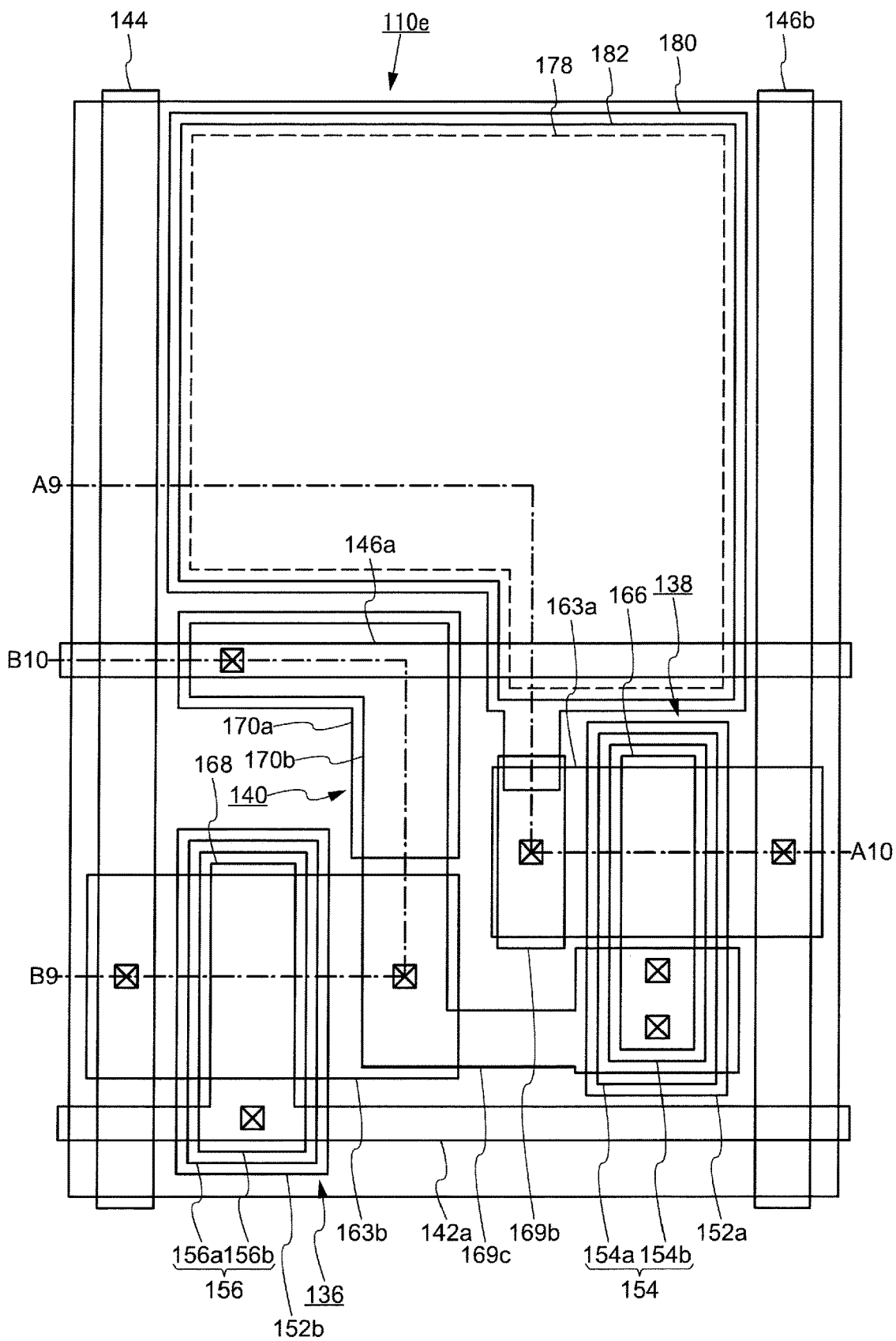
FIG. 27 is a plan view showing a structure of a pixel in a touch panel display in an embodiment according to the present invention.
Figure 28A:
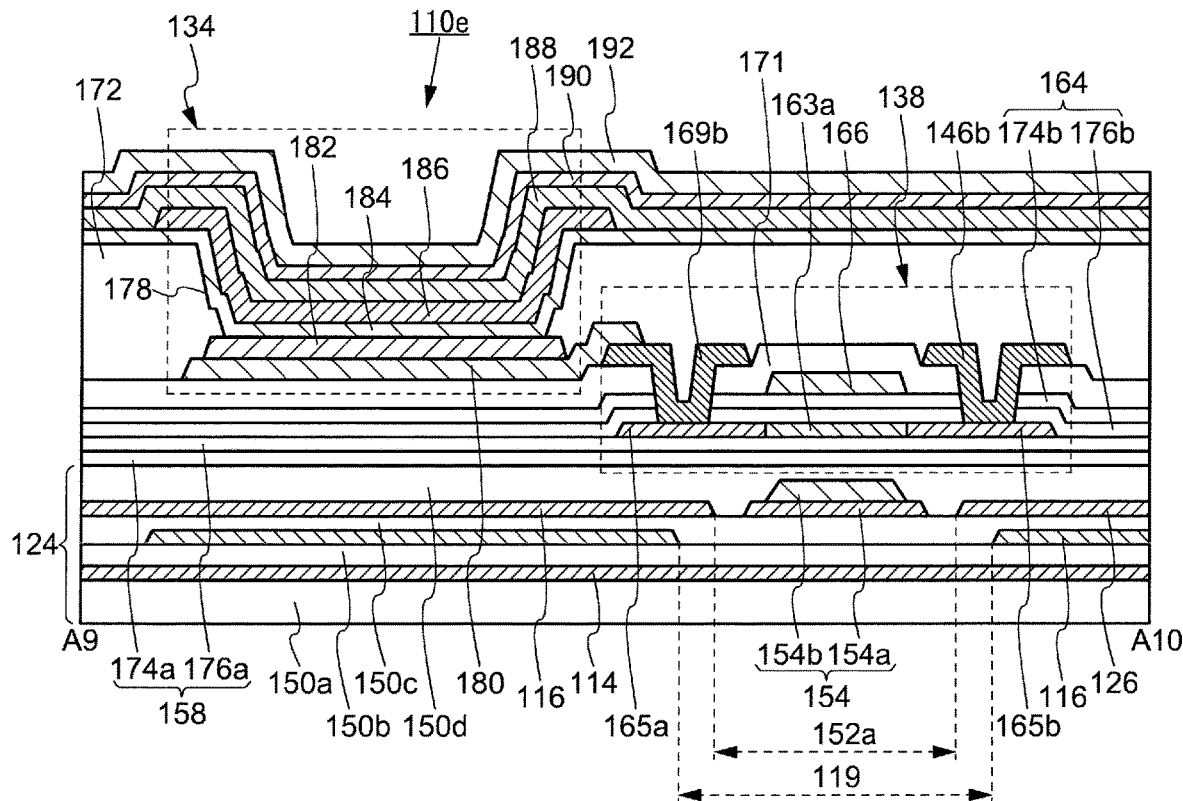
FIG. 28A and FIG. 28B are each a cross-sectional view showing a structure of the pixel in the touch panel display in an embodiment according to the present invention.
Figure 28B:
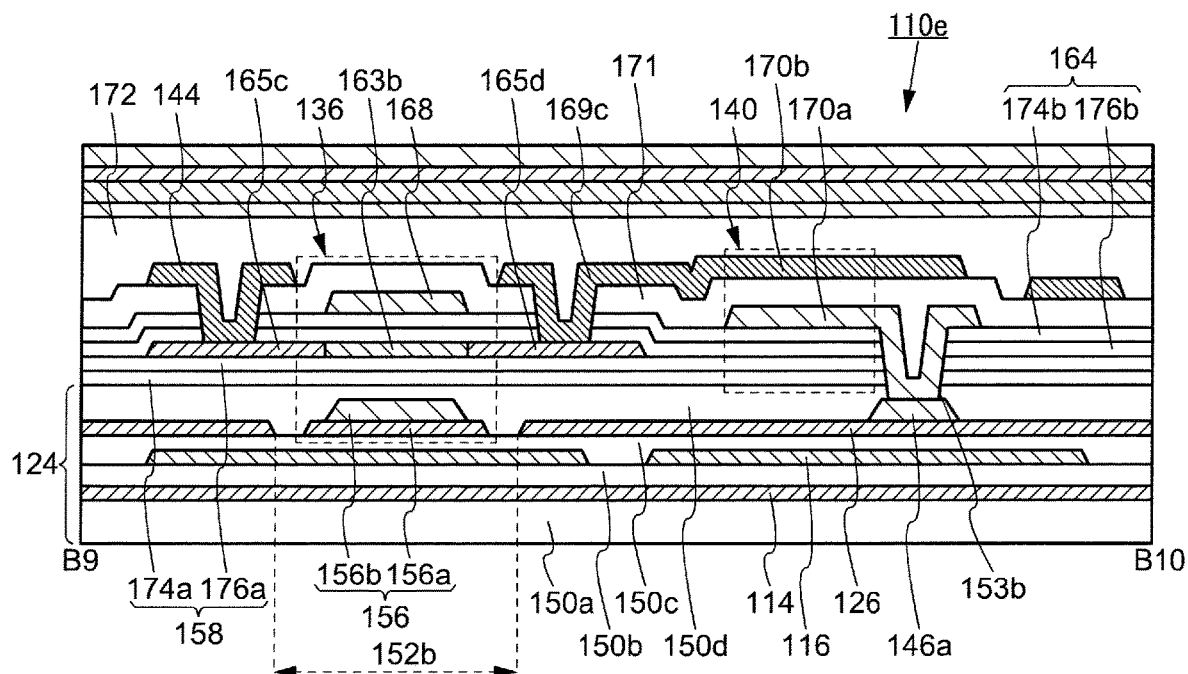

FIG. 27 shows an example of planar structure of a pixel 110*e* in a touch panel display in this embodiment. FIG. 28A shows a cross-sectional structure of the pixel 110*e* taken along line A9-A10 shown in FIG. 28. FIG. 28B shows a cross-sectional structure of the pixel 110*e* taken along line B9-B10 shown in FIG. 28. In the following description, these figures will be referred to, as necessary.

As shown in FIG. 28A and FIG. 28B, the organic EL element 134, the driving transistor 138, the selection transistor 136, and the capacitance element 140 are located on the transparent resin substrate 124. The structure of the transparent resin substrate 124 is substantially the same as that in the first embodiment.

As shown in FIG. 27 and FIG. 28A, the driving transistor 138 includes a first semiconductor layer 163*a*. The first semiconductor layer 163*a* is formed of a tetrahedral semiconductor, for example, polycrystalline silicon. Below the first semiconductor layer 163*a*, the first gate electrode 154 is located with the first insulating layer 158 and the fourth transparent resin layer 150*d* being located between the first semiconductor layer 163*a* and the first gate electrode 154. Above the first semiconductor layer 163*a*, the second gate electrode 166 is located with the second insulating layer 164 being located between the first semiconductor layer 163*a* and the second gate electrode 166. The structures of the first gate electrode 154 and the second gate electrode 166 are substantially the same as those in the first embodiment. The first semiconductor layer 163*a* includes impurity regions 165*a* and 165*b* containing impurity elements provided to control valence electrons. In the driving transistor 138, the impurity region 165*b* is connected with the second common line 146*b*, and the impurity region 165*a* is connected with a drain electrode 169*b*. The drain electrode 169*b* is electrically connected with the first electrode 180 of the organic EL element 134. The first electrode 180 is formed of a transparent conductive film. A third insulating layer 171 is provided between the second gate electrode 166 and the flattening layer 172. The second common line 146*b* and the drain electrode 169*b* are provided between the third insulating layer 171 and the flattening layer 172.

As shown in FIG. 27 and FIG. 28B, the selection transistor 136 includes a second semiconductor layer 163*b*. The second semiconductor layer 163*b* is also formed of a tetrahedral semiconductor, for example, polycrystalline silicon. Below the second semiconductor layer 163*b*, the first gate electrode 156 is located with the first insulating layer 158 and the fourth transparent resin layer 150*d* being located between the second semiconductor layer 163*b* and the first gate electrode 156. Above the second semiconductor layer 163*b*, the second gate electrode 168 is located with the second insulating layer 164 being located between the second semiconductor layer 163*b* and the second gate electrode 168. An impurity region 165*c* of the second semiconductor layer 163*b* is connected with the data signal line 144, and an impurity region 165*d* of the second semiconductor layer 163*b* is connected with a drain electrode 169*c*.

A polycrystalline silicon film used to form the semiconductor layer 163 is formed by crystallizing an amorphous silicon film formed by plasma CVD on the first insulating layer 158. The amorphous silicon film is crystallized by directing laser light thereto (referred to as "laser annealing"). As a laser light source, for example, a third harmonic of an excimer laser or a YAG laser is usable. The laser light is ultrasonic light and is absorbed by an amorphous silicon film substantially entirety. Therefore, the transparent resin substrate 124 is not thermally damaged.

The capacitance element 140 includes the first capacitance electrode 170a formed in the same layer as that of the second gate electrode 168, the second capacitance electrode 170b formed in the same layer as that of the drain electrode 169c, and the third insulating layer 171 located between the first capacitance electrode 170a and the second capacitance electrode 170b. The drain electrode 169c and the second capacitance electrode 170b of the selection transistor 136 are electrically connected with each other. FIG. 27 and FIG. 28B show a form in which the drain electrode 169c and the second capacitance electrode 170b are formed of one continuous conductive layer.

Figure 29A:
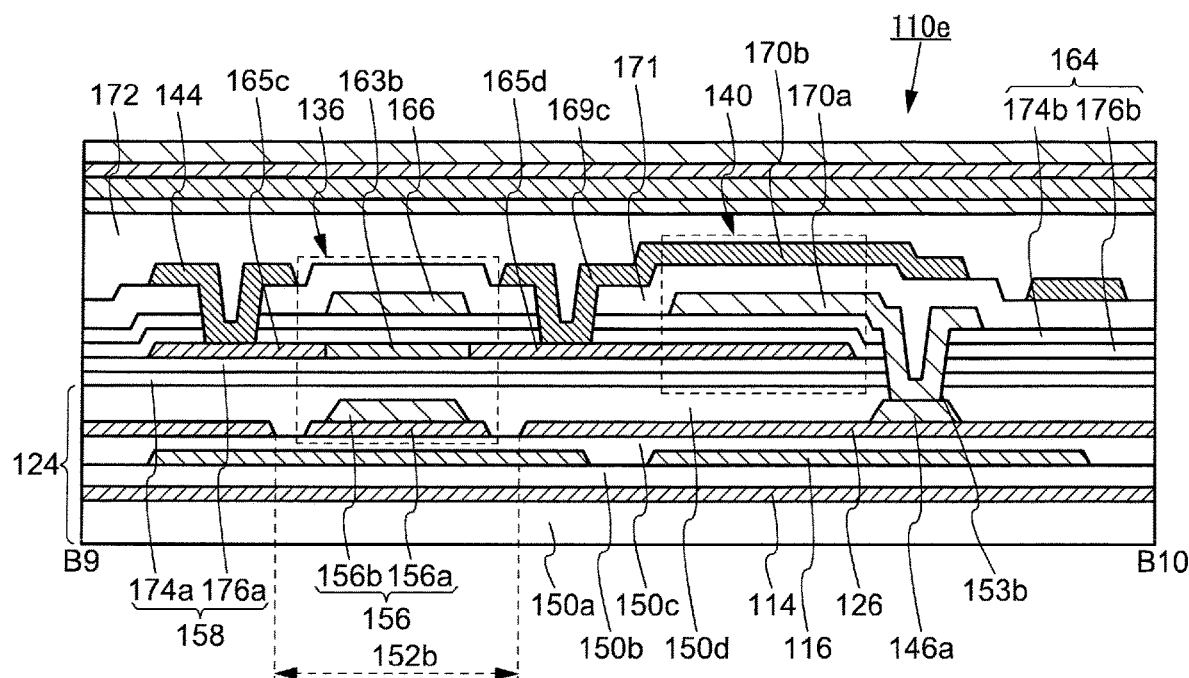
FIG. 29A is a cross-sectional view showing a structure of the pixel in the touch panel display in an embodiment according to the present invention.
Figure 29B:
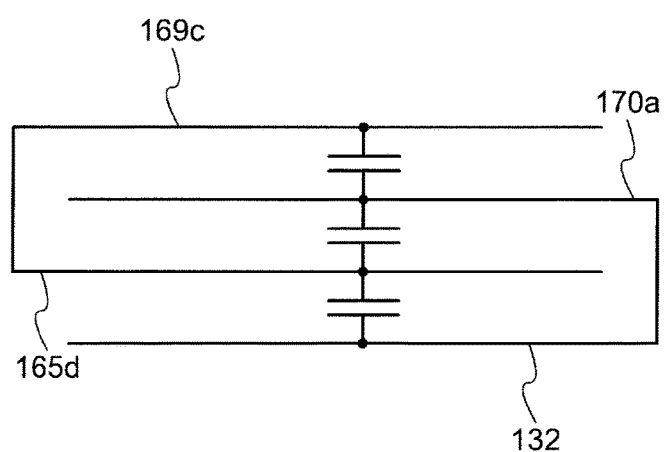
FIG. 29B shows an equivalent circuit of a capacitance element in the touch panel display in an embodiment according to the present invention.

As shown in FIG. 29A, the impurity region 165d may be extended to a region bellow the first capacitance electrode 170a, so that the area size of the capacitance element 140 is enlarged to increase the capacitance without decreasing the aperture ratio of the pixel 110e. FIG. 29B shows an equivalent circuit of the capacitance element 140. As shown in FIG. 29B, the capacitance element 140 has a structure in which a capacitance formed between the drain electrode 169c and the first capacitance electrode 170a, a capacitance formed between the impurity region 165d having the same potential as that of the drain electrode 169c and the first capacitance electrode 170a, and a capacitance formed between the impurity region 165d and the shield electrode 126 having the same potential as that of the first capacitance electrode 170a are connected in parallel. With such a stack structure, the capacitance element 140 increases the capacitance thereof even though the area size of a projected area as seen in a plan view is not changed.

As shown in FIG. 28A, the organic EL element 134 has the same structure as that in the first embodiment. In this embodiment, the driving transistor 138 and the selection transistor 136 each have an n-channel conductivity. In other words, since the impurity region 165 is formed of an n-type semiconductor, the driving transistor 138 and the selection transistor 136 each have an n-channel conductivity. Therefore, the touch panel display in this embodiment operates in substantially the same manner as that in the first embodiment.

The first gate electrode 154 and the second gate electrode 166 of the driving transistor 138 are electrically connected with each other and are supplied with the same gate voltage. The driving transistor 138 has such a dual-gate structure, and thus improves the current driving capability thereof. Therefore, the driving transistor 138 supplies a sufficient level of current to drive the organic EL element 134. Even if the operation point of the organic EL element 134 is fluctuated, the constant current driving is performed in accordance with the fluctuation of the operation point. The first gate electrode 156 and the second gate electrode 168 of the selection transistor 136 are electrically connected with each other. The selection transistor 136 has such a dual-gate structure, and thus suppresses the threshold voltage thereof from being fluctuated and increases the on/off ratio thereof.

As described in this embodiment, the touch panel display including the touch panel 108 embedded in the transparent resin substrate 124 is also realized by use of transistors formed of polycrystalline silicon. The transistors including the channel region of polycrystalline silicon provide a high field effect mobility. Therefore, the current driving capability of the driving transistor 138 is improved, which advantageously contributes to increase in the precision of the pixels 110e.

The touch panel display in this embodiment has substantially the same structure as that in the first embodiment except that the transistors are formed of polycrystalline silicon. Therefore, the touch panel display in this embodiment provides substantially the same function and effect as those in the first embodiment.

Sixth Embodiment

In this embodiment, regrading a touch panel display including a touch sensor function of sensing a touch on a screen and a display function of displaying an image on the screen, differences in the pixel structure from the fifth embodiment will be described. In the following description, such differences from the fifth embodiment will be described.

Figure 30:
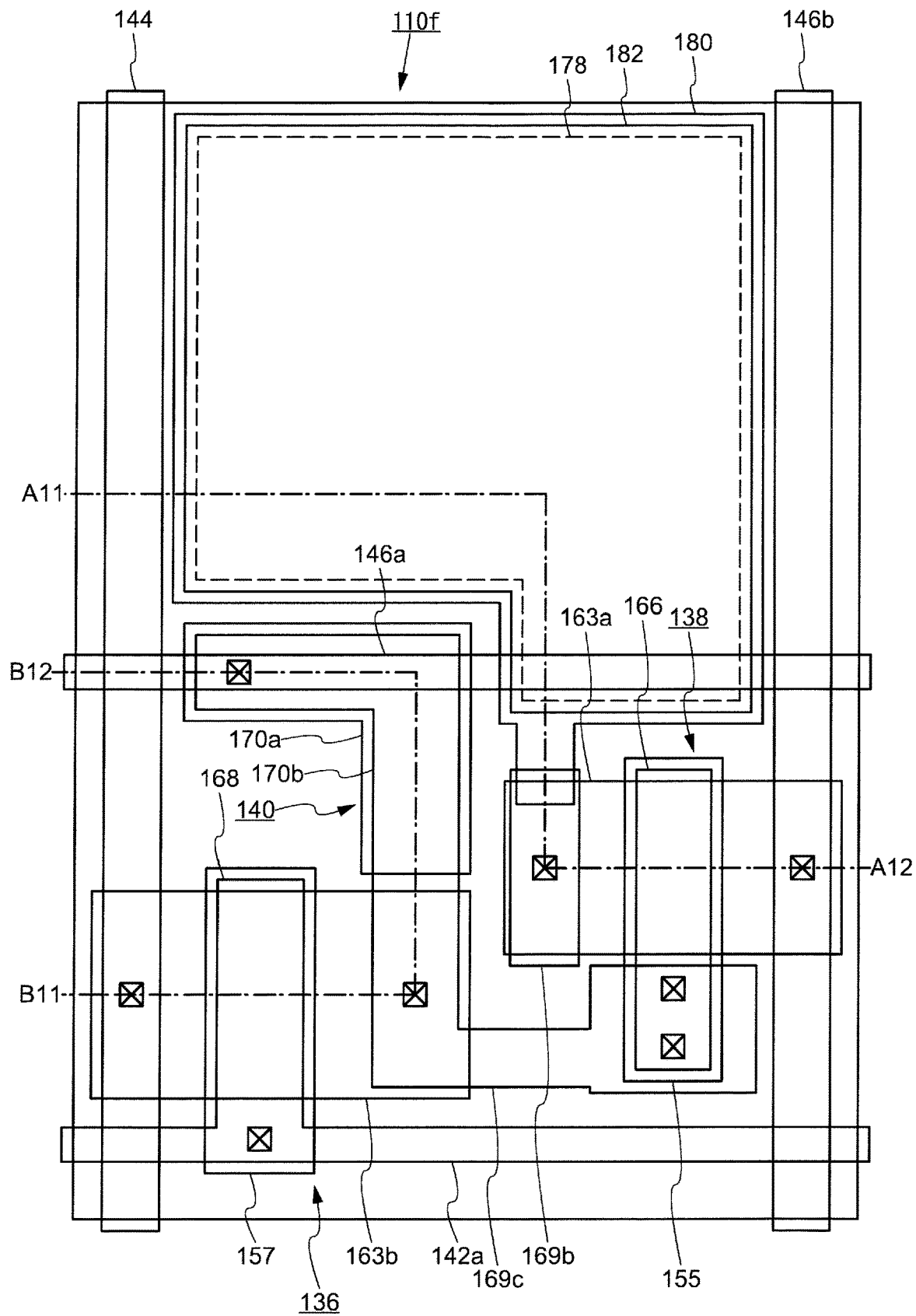
FIG. 30 is a plan view showing a structure of a pixel in a touch panel display in an embodiment according to the present invention.
Figure 31A:
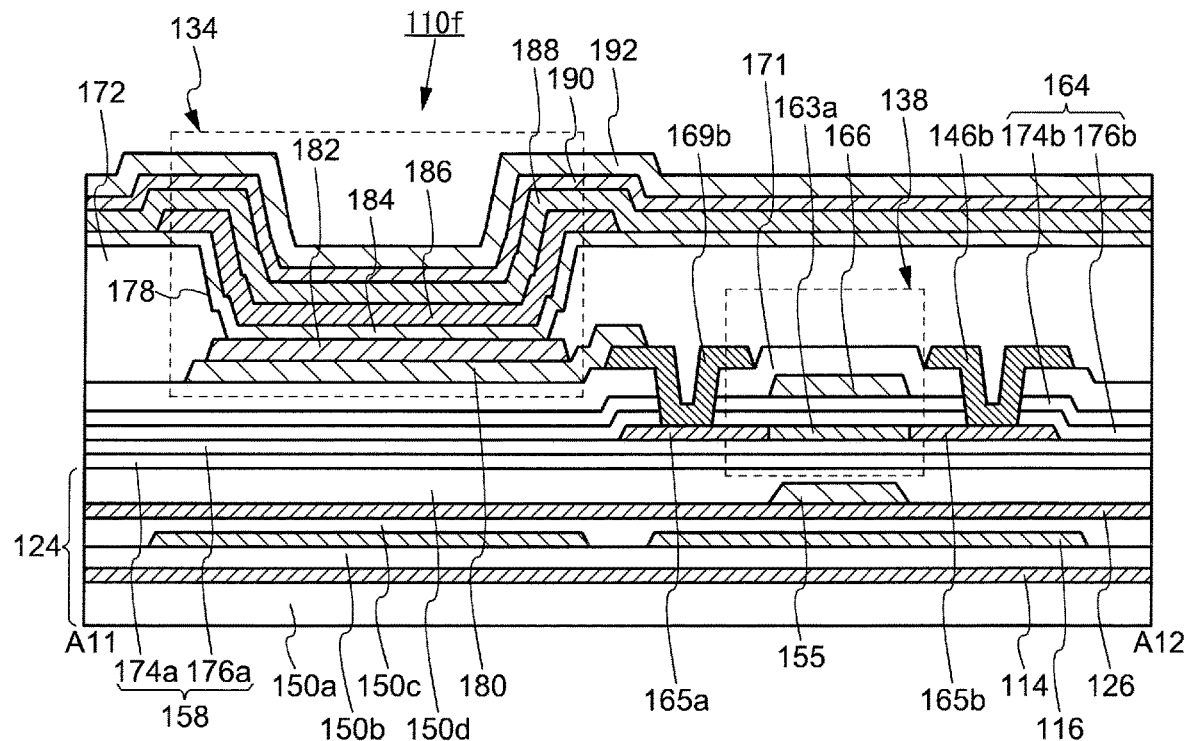
FIG. 31A and FIG. 31B are each a cross-sectional view showing a structure of the pixel in the touch panel display in an embodiment according to the present invention.
Figure 31B:
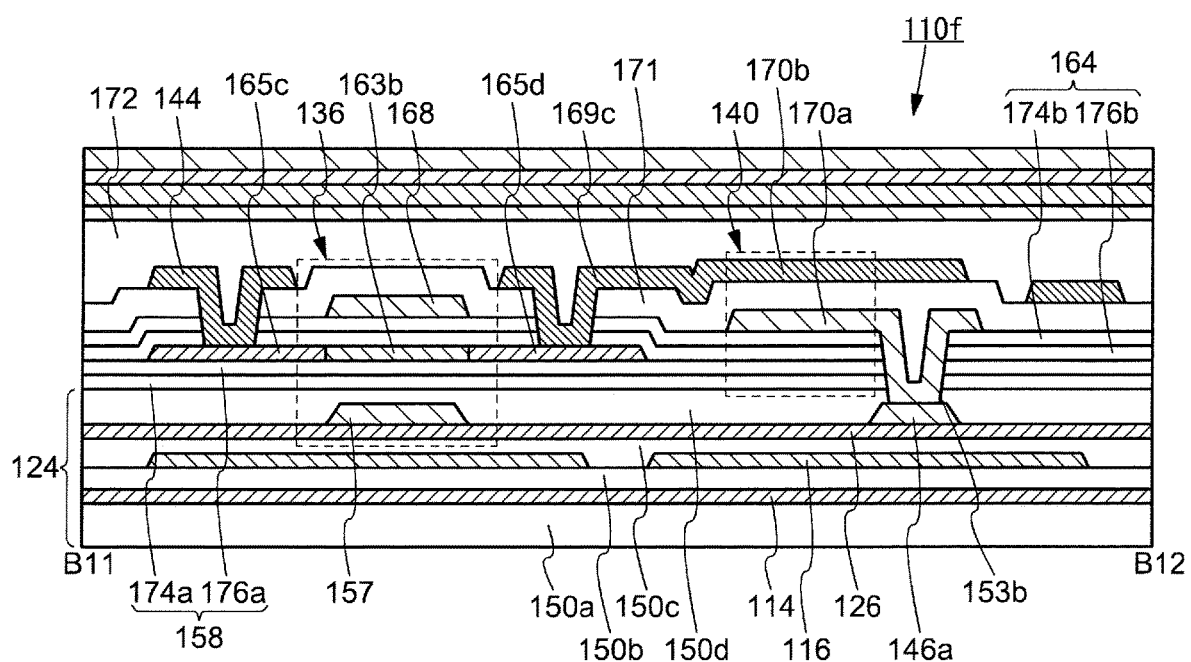

FIG. 30 shows an example of planar structure of a pixel 110f in the touch panel display in this embodiment. FIG. 31A shows a cross-sectional structure of the pixel 110f taken along line A11-A12 shown in FIG. 30. FIG. 31B shows a cross-sectional structure of the pixel 110f taken along line B11-B12 shown in FIG. 30. In the following description, these figures will be referred to, as necessary.

The pixel 110f has substantially the same structure as that in the fifth embodiment except that the first opening 152a and the second opening 152b are omitted and that the shield electrode 126 is provided in the entirety of the pixel 110f.

The driving transistor 138 includes the light blocking electrode 155 provided in a region overlapping the second gate electrode 166. The light blocking electrode 155 is located between the shield electrode 126 and the fourth transparent resin layer 150d, and is in contact with the shield electrode 126. The light blocking electrode 155 is formed of a metal film, like in the second embodiment. The light blocking electrode 155 prevents light incident on the transparent resin substrate 124 from being incident on the channel region of the driving transistor 138. This suppresses the threshold voltage of the driving transistor 138 from being fluctuated.

The light blocking electrode 155 is supplied with the same potential as that of the shield electrode 126. The shield electrode 126 is supplied with, for example, the ground potential, and thus the light blocking electrode 155 is also supplied with the ground potential. The driving transistor 138 is supplied, via the first insulating layer 158, with a certain potential in the back channel of the first semiconductor layer 163a where the channel region is formed. This suppresses the threshold voltage of the driving transistor 138 from being fluctuated.

Like the driving transistor 138, the selection transistor 136 includes the light blocking electrode 157. Therefore, the selection transistor 136 is protected against light by the light blocking electrode 157, and thus the potential of the back channel is stabilized. This suppresses the threshold voltage of the selection transistor 136 from being fluctuated.

In this embodiment, the pixel 110f has substantially the same structure as that of the pixel 110e in the fifth embodiment except for the light blocking electrodes 155 and 157. Therefore, the touch panel display in this embodiment provides substantially the same function and effect as those in the fifth embodiment.

Seventh Embodiment

In this embodiment, regrading a touch panel display including a touch sensor function of sensing a touch on a screen and a display function of displaying an image on the screen, differences in the pixel structure from the fifth embodiment will be described. In the following description, such differences from the fifth embodiment will be described.

Figure 32:
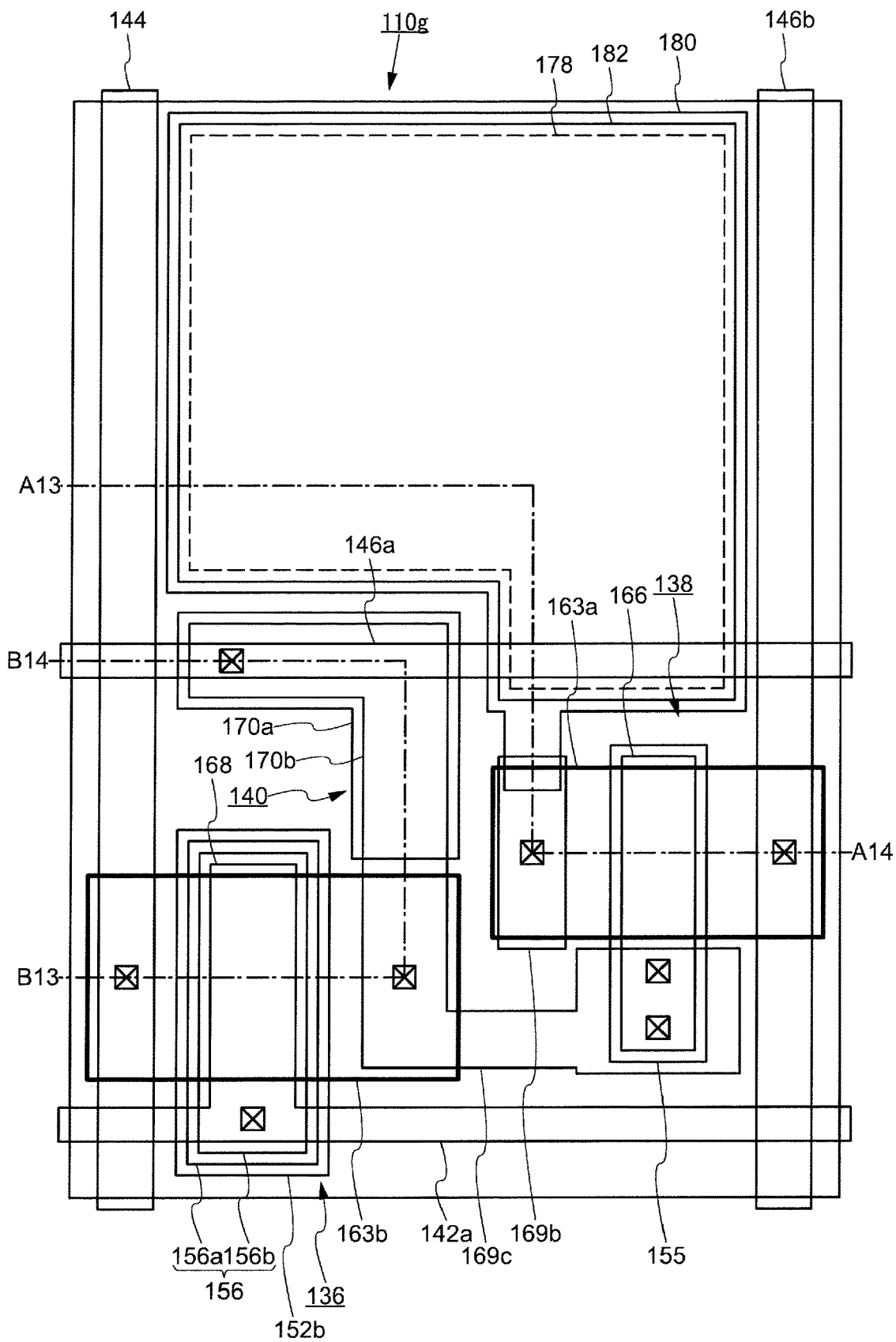
FIG. 32 is a plan view showing a structure of a pixel in a touch panel display in an embodiment according to the present invention.
Figure 33A:
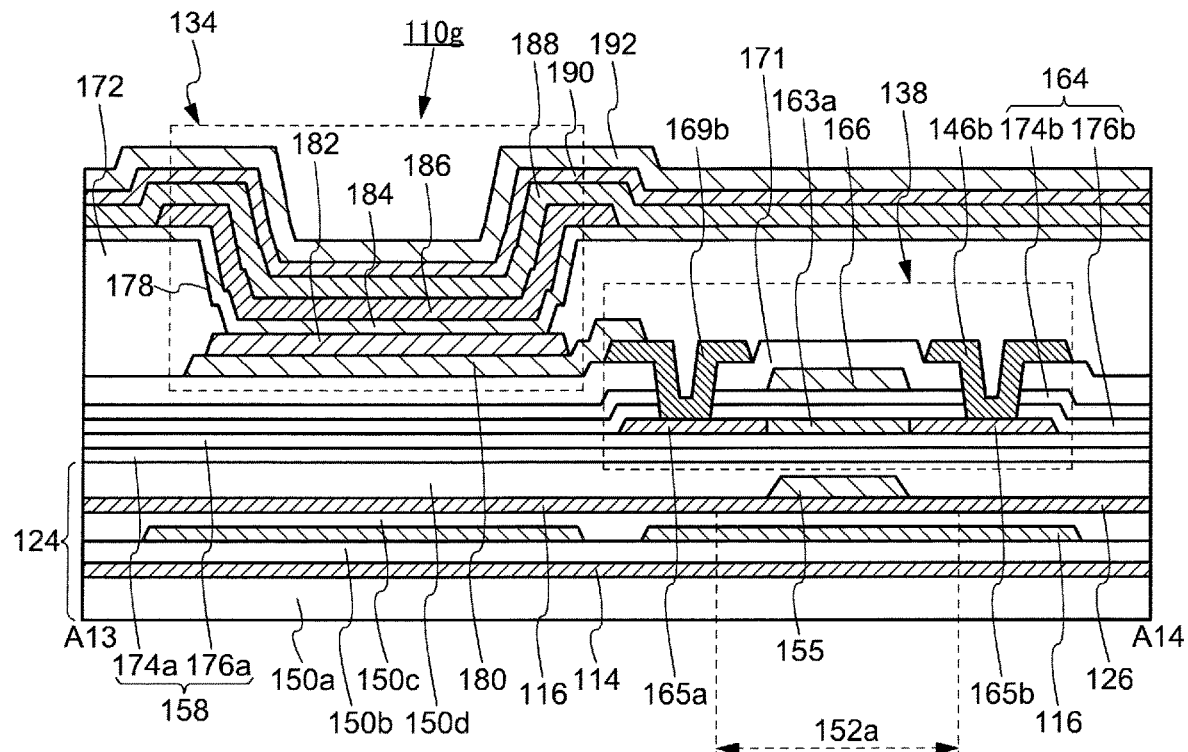
FIG. 33A and FIG. 33B are each a cross-sectional view showing a structure of the pixel in the touch panel display in an embodiment according to the present invention.
Figure 33B:
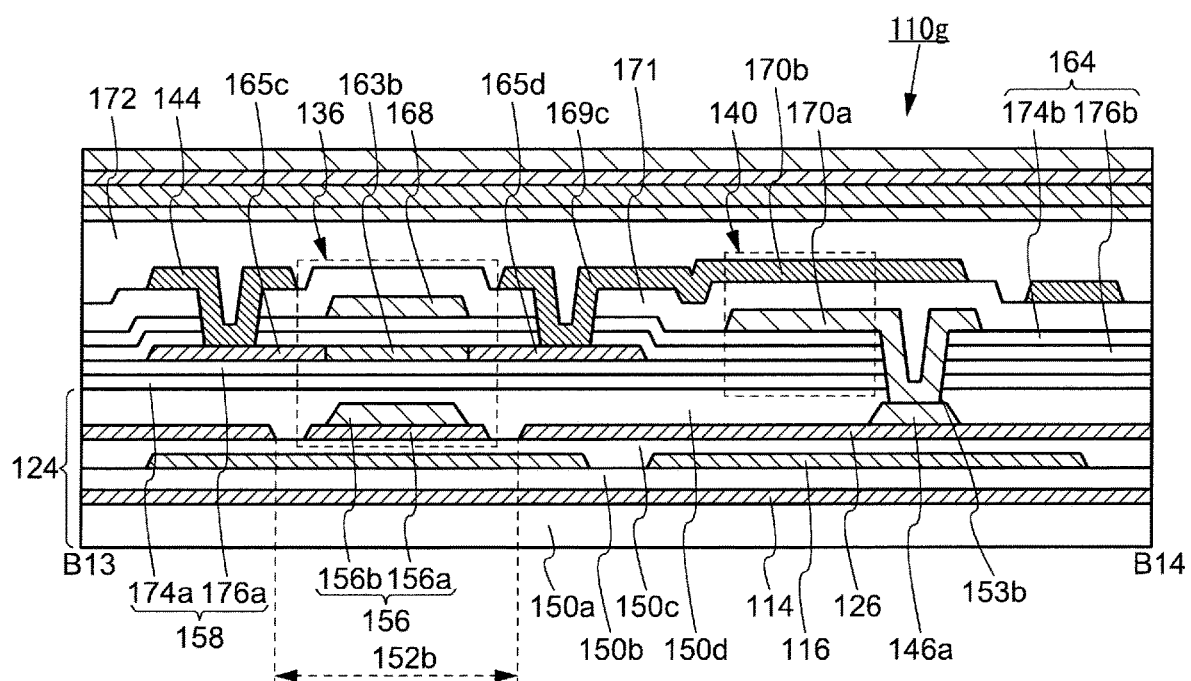

FIG. 32 shows an example of planar structure of a pixel 110g in the touch panel display in this embodiment. FIG. 33A shows a cross-sectional structure of the pixel 110g taken along line A13-A14 shown in FIG. 32. FIG. 33B shows a cross-sectional structure of the pixel 110g taken along line B13-B14 shown in FIG. 32. In the following description, these figures will be referred to, as necessary.

In the pixel 110g, the shield electrode 126 is provided to cover the driving transistor 138. By contrast, the shield electrode 126 has the second opening 152b in a region where the selection transistor 136 is provided. The driving transistor 138 includes the light blocking electrode 155 provided in a region overlapping the second gate electrode 166. The light blocking electrode 155 is located between the shield electrode 126 and the fourth transparent resin layer 150d, and is in contact with the shield electrode 126. With such a structure, light incident on the transparent resin substrate 124 is prevented from being incident on the channel region of the driving transistor 138.

The selection transistor 136 has a dual-gate structure in which the second semiconductor layer 163b is held between the first gate electrode 156 and the second gate electrode 168. This improves the switching characteristics of, and decreases the off-current of, the selection transistor 136. The first gate electrode 156 of the selection transistor 136 has a structure in which the first gate electrode layer 156a formed of a transparent conductive film and the second gate electrode layer 156b formed of a metal film are stacked on each other. Therefore, the selection transistor 136 also has a function of a light blocking film.

In this embodiment, the pixel 110g has substantially the same structure as that of the pixel 110e in the fifth embodiment except for the shield electrode 126 and the light blocking electrode 155. Therefore, the touch panel display in this embodiment provides substantially the same function and effect as those in the fifth embodiment.

Eighth Embodiment

In this embodiment, regrading a touch panel display including a touch sensor function of sensing a touch on a screen and a display function of displaying an image on the screen, differences in the pixel structure from the fifth embodiment will be described. In the following description, such differences from the fifth embodiment will be described.

Figure 34:
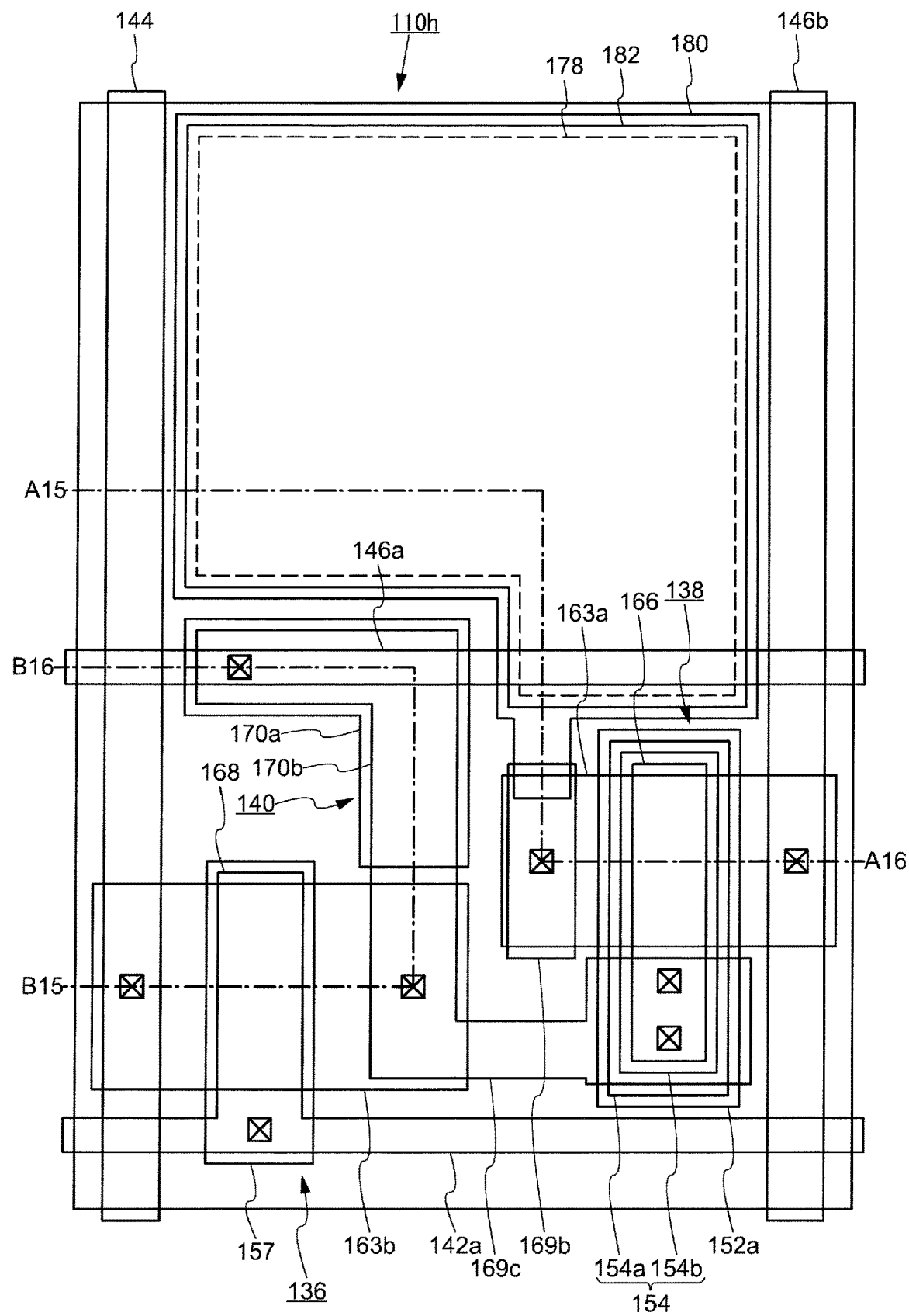
FIG. 34 is a plan view showing a structure of a pixel in a touch panel display in an embodiment according to the present invention.
Figure 35A:
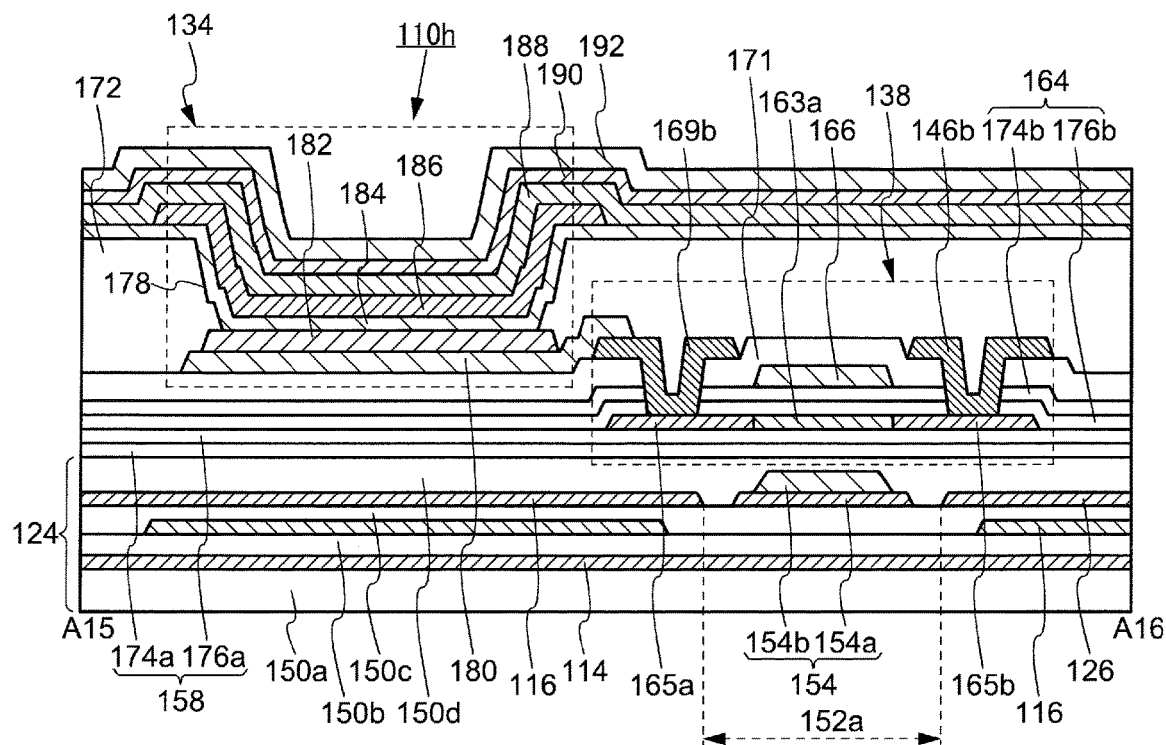
FIG. 35A and FIG. 35B are each a cross-sectional view showing a structure of the pixel in the touch panel display in an embodiment according to the present invention.
Figure 35B:
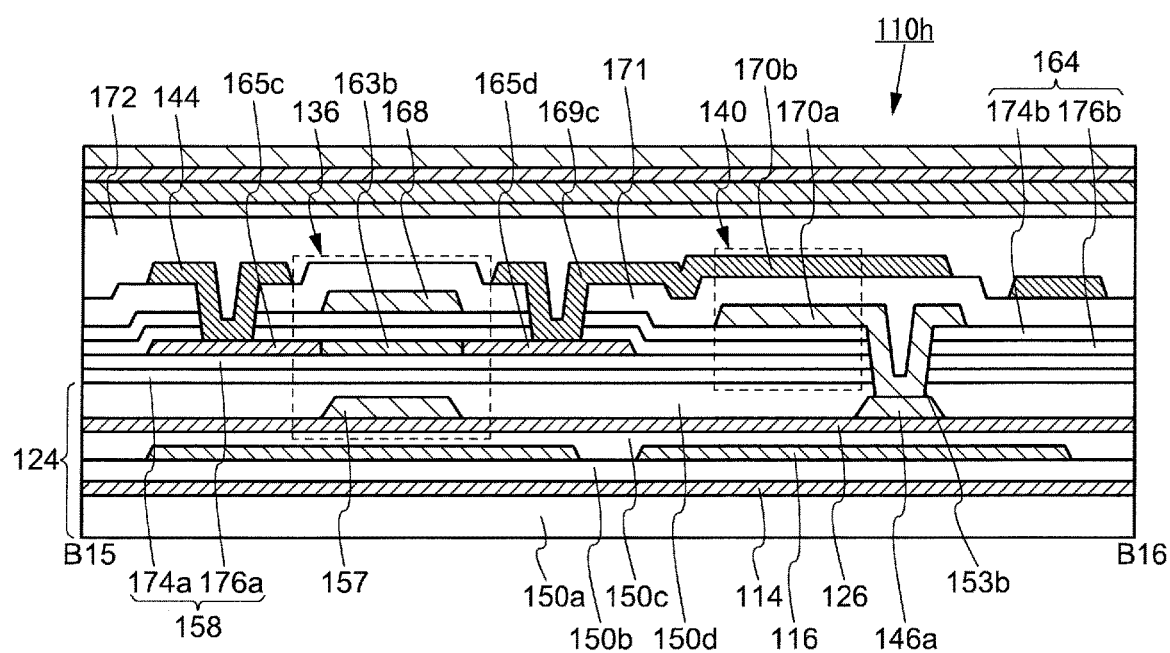

FIG. 34 shows an example of planar structure of a pixel 110h in the touch panel display in this embodiment. FIG. 35A shows a cross-sectional structure of the pixel 110h taken along line A15-A16 shown in FIG. 34. FIG. 35B shows a cross-sectional structure of the pixel 110h taken along line B15-B16 shown in FIG. 34. In the following description, these figures will be referred to, as necessary.

In the pixel 110h, the shield electrode 126 is provided to cover the selection transistor 136. By contrast, the shield electrode 126 has the first opening 152a in a region where the driving transistor 138 is provided. The selection transistor 136 includes the light blocking electrode 157 provided in a region overlapping the second gate electrode 168. The light blocking electrode 157 is located between the shield electrode 126 and the fourth transparent resin layer 150d, and is in contact with the shield electrode 126. With such a structure, light incident on the transparent resin substrate 124 is prevented from being incident on the channel region of the selection transistor 136. This suppresses the threshold voltage of the selection transistor 136 from being fluctuated.

Meanwhile, the driving transistor 138 has a dual-gate structure in which the first semiconductor layer 163a is held between the first gate electrode 154 and the second gate electrode 166. The first gate electrode 154 and the second gate electrode 166 are electrically connected with each other and thus are supplied with the same potential. This improves the current driving capability of the driving transistor 138, and thus the driving transistor 138 supplies a sufficient level of current to drive the organic EL element 134.

In this embodiment, the pixel 110h has substantially the same structure as that of the pixel 110e in the fifth embodiment except for the shield electrode 126 and the light blocking electrode 157. Therefore, the touch panel display in this embodiment provides substantially the same function and effect as those in the fifth embodiment.

Ninth Embodiment

In this embodiment, an example of touch panel display in which the sensor electrodes embedded in the transparent resin substrate each have a diamond shape will be described. In the following embodiment, components that are the same as those in the first embodiment and the second embodiment will not be described, and differences therefrom will be mainly described.

Figure 36:
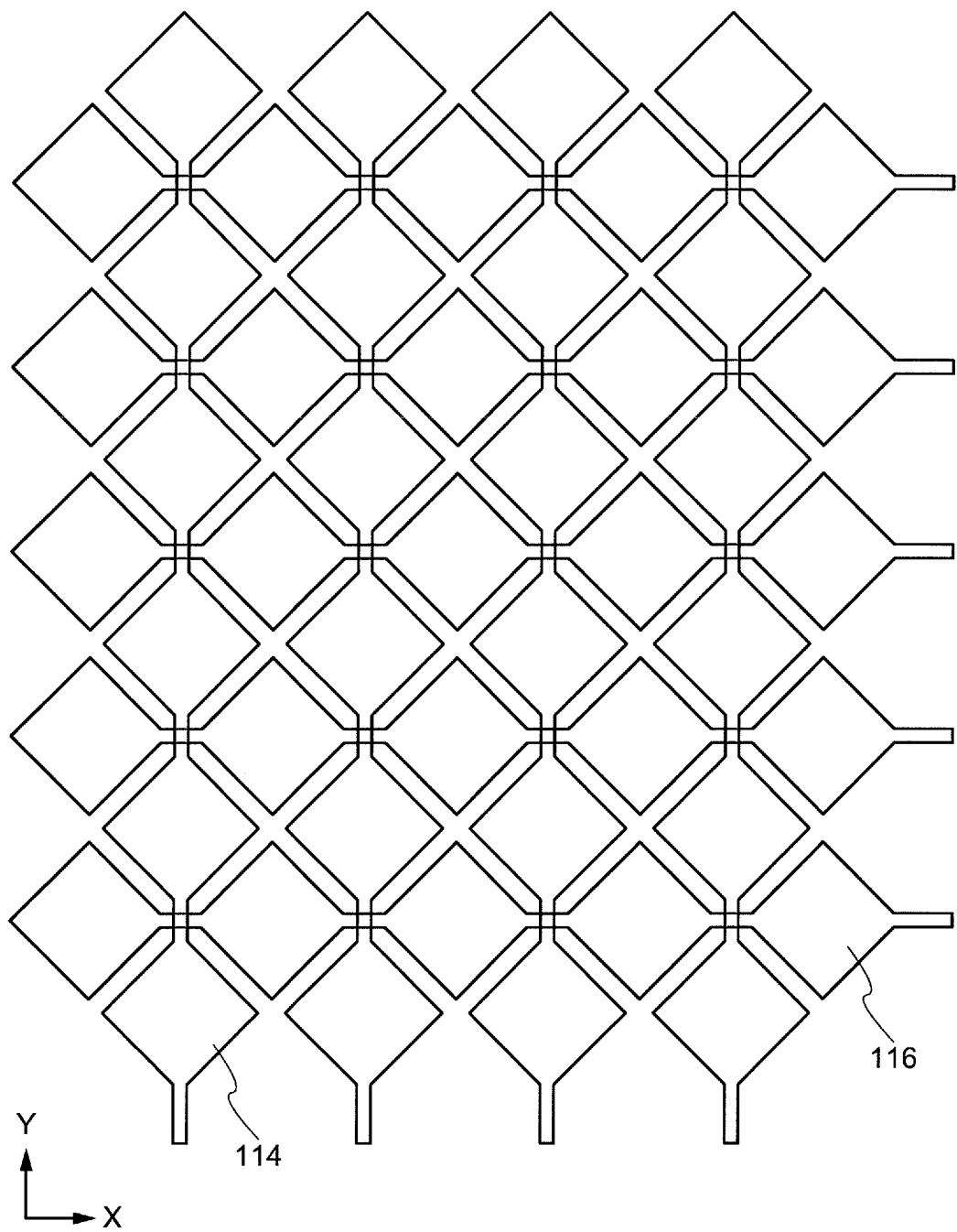
FIG. 36 is a plan view showing a structure of electrodes embedded in a touch panel display in an embodiment according to the present invention.

FIG. 36 shows a planar structure of the first sensor electrodes 114 and the second sensor electrodes 116 forming a mutual capacitance-system electrostatic capacitance-type touch sensor. Each of the first sensor electrodes 114 is a receiver electrode (Rx electrode), and sequentially outputs detection signals (Vdet). By contrast, each of the second sensor electrodes 116 is a transmitter electrode (Tx electrode), and is supplied with a common driving signal (Vcom). The first sensor electrodes 114 are each of a diamond shape and are connected with each other in one direction (in the Y direction shown in FIG. 36), whereas the second sensor electrodes 116 are each of a diamond shape and are connected with each other in a direction crossing the one direction (in the X direction shown in FIG. 36). Although not shown in FIG. 36, the first sensor electrodes 114 and the second sensor electrodes 116 are formed in different layers from each other with an insulating layer being located between the first sensor electrodes 114 and the second sensor electrodes 116. The first sensor electrodes 114 and the second sensor electrodes 116 are each formed of a transparent conductive film or a metal film. In the case where a transparent conductive film is used, the first sensor electrodes 114 are formed in diamond patterns provided to spread two-dimensionally, and the second sensor electrodes 116 are also formed in diamond patterns provided to spread two-dimensionally. By contrast, in the case where a metal film is used, the first sensor electrodes 114 are formed in a mesh pattern with openings being formed in positional correspondence with the pixels, and the second sensor electrodes 116 are also formed in a mesh pattern with openings being formed in positional correspondence with the pixels. In either case, diamond-shaped electrodes are adopted, so that the first sensor electrodes 114 and the second sensor electrodes 116 are located densely.

Figure 37A:
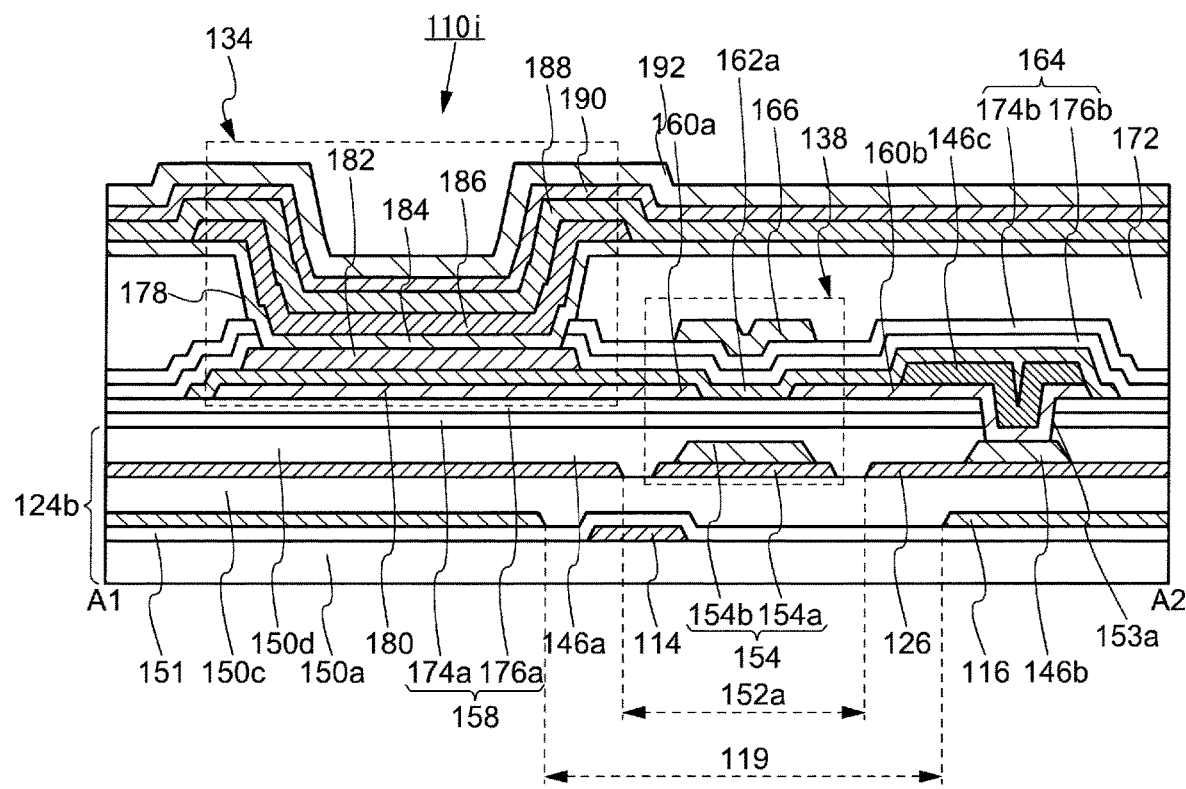
FIG. 37A and FIG. 37B are each a cross-sectional view showing a structure of a pixel in the touch panel display in an embodiment according to the present invention.
Figure 37B:
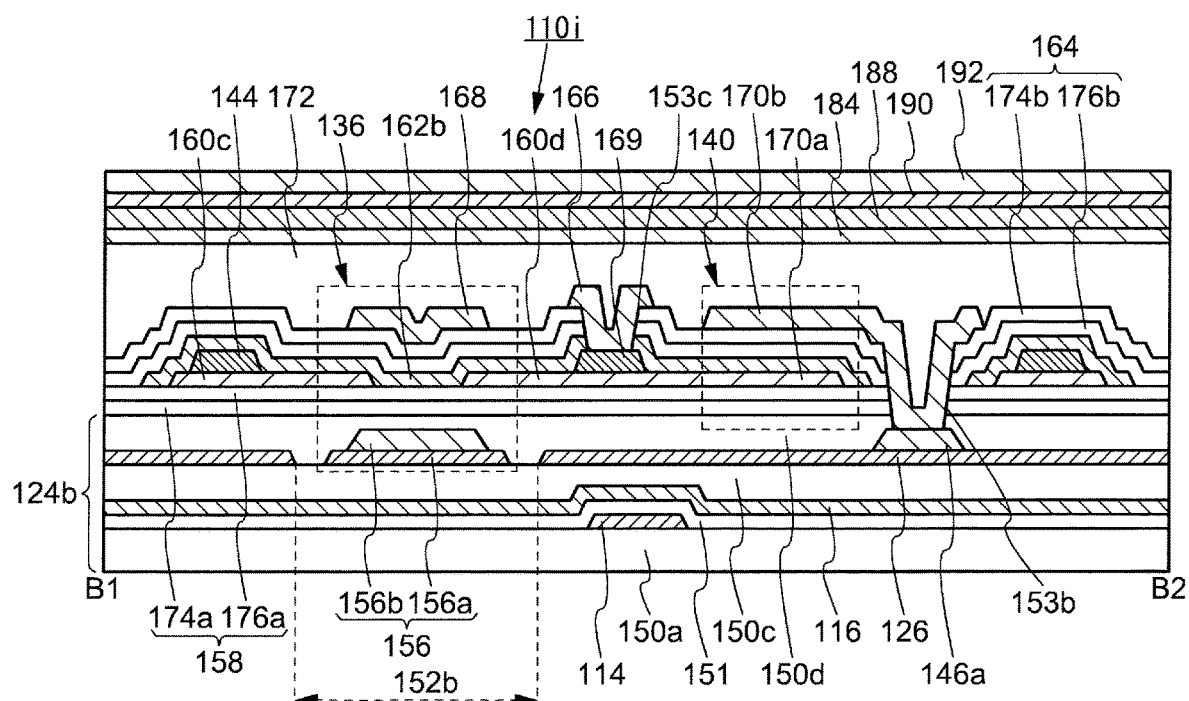

FIG. 37A and FIG. 37B show an example of pixel 110i of a touch panel display in which the diamond-shaped electrodes shown in FIG. 36 are embedded in a transparent resin substrate 124b. FIG. 37A shows a cross-sectional structure of the pixel 110*i* corresponding to the cross-sectional structure taken along line A1-A2 shown in FIG. 4. FIG. 37B shows a cross-sectional structure of the pixel 110*i* corresponding to the cross-sectional structure taken along line B1-B2 shown in FIG. 4. The structure of the driving transistor 138 and the organic EL element 134 shown in FIG. 37A and the structure of the selection transistor 136 and the capacitance element 140 shown in FIG. 37B are substantially the same as those in the first embodiment.

The transparent resin substrate 124*b* has a structure in which the first transparent resin layer 150*a*, the first sensor electrodes 114, the inorganic insulating layer 151, the second sensor electrodes 116, the third transparent resin layer 150*c*, the shield electrode 126 and the fourth transparent resin layer 150*d* are stacked. In the case where the second sensor electrodes 116 used as the transmitter electrodes (Tx electrodes) provided to spread two-dimensionally are located as overlapping the driving transistors 138, it is preferred that the second sensor electrodes 116 each have the opening 119 in positional correspondence with the corresponding driving transistor 138. The opening 119 is provided, so that the electric field generated by a driving signal applied to the second sensor electrode 116 is prevented from influencing the first gate electrode 154 of the driving transistor 138. In this embodiment also, it is preferred that the third transparent resin layer 150*c* has a thickness of 10 μm or greater, preferably 15 μm or greater, in order to put the first gate electrode 154 far from the second sensor electrode 116.

The first sensor electrodes 114 and the second sensor electrodes 116 are provided with the organic insulating layer 151 being located between the first sensor electrodes 114 and the second sensor electrodes 116 so as not to be short-circuited. It is preferred that the organic insulating layer 151 is formed of an insulating film that has a low moisture permeability and is visible light-transmissive such as a silicon nitride film, an aluminum oxide film or the like. The organic insulating layer 151 may have a thickness of 100 nm to 300 nm, and is formed on substantially the entirety of the transparent resin substrate 124*b*. The organic insulating layer 151 provided in the transparent resin substrate 124*b* improves the barrier property against water vapor. This suppresses the organic EL element 134 provided on the transparent resin substrate 124*b* from being deteriorated.

A silicon nitride film is considered to have a relative dielectric constant of 6 to 8, and an aluminum oxide is considered to have a relative dielectric constant of 8 to 10, which are both higher than that of a transparent resin layer (for example, a polyimide resin is considered to have a relative dielectric constant of 4 to 5). In addition, the inorganic insulating layer 151 is formed to have a thickness of 100 nm to 300 nm. Therefore, the capacitance formed between the first sensor electrodes 114 and the second sensor electrodes 116 is increased. This improves the sensitivity of the touch sensor 108. As can be seen, the touch panel display in this embodiment increases the moisture resistance and the sensitivity of the touch panel 108 in addition to having the function and effect of the touch panel display 100 in the first embodiment.

Figure 38A:
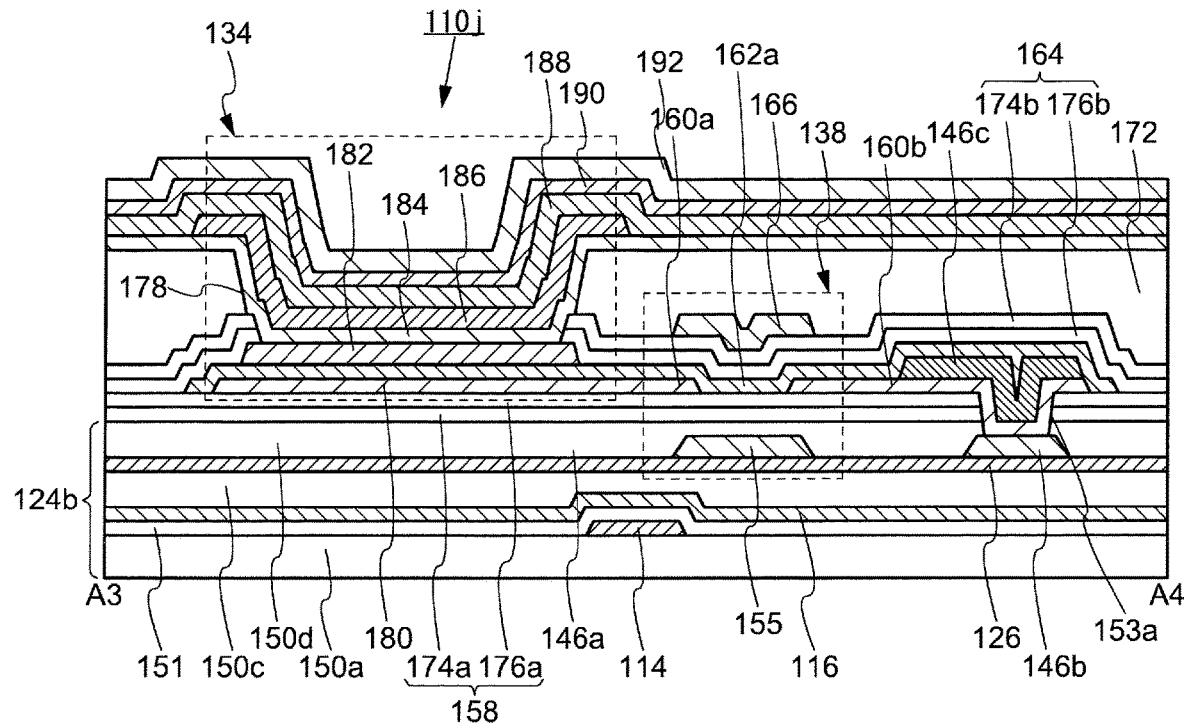
FIG. 38A and FIG. 38B are each a cross-sectional view showing a structure of the pixel in the touch panel display in an embodiment according to the present invention.
Figure 38B:
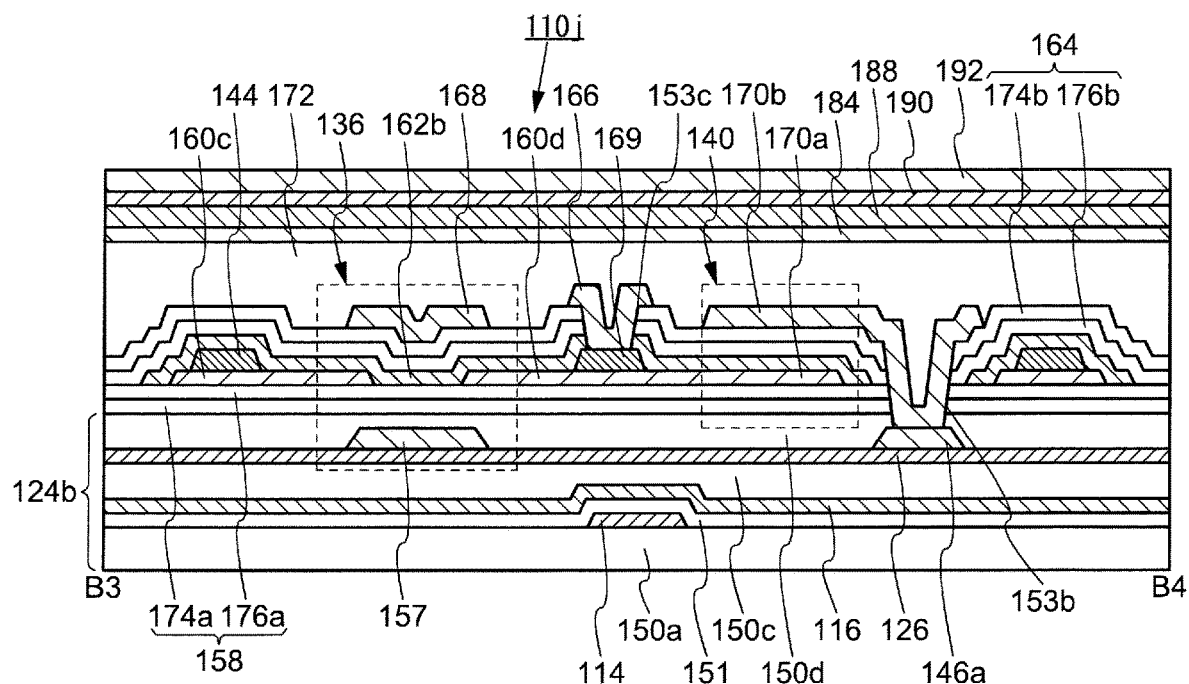

FIG. 38A and FIG. 38B show an example of pixel 110*j* of a touch panel display in which the diamond-shaped electrodes shown in FIG. 36 are embedded in the transparent resin substrate 124*b*. FIG. 38A shows a cross-sectional structure of the pixel 110*j* corresponding to the cross-sectional structure taken along line A3-A4 shown in FIG. 19. FIG. 38B shows a cross-sectional structure of the pixel 110*j* corresponding to the cross-sectional structure taken along line B3-B4 shown in FIG. 19.

The structure of the driving transistor 138 and the organic EL element 134 shown in FIG. 38A and the structure of the selection transistor 136 and the capacitance element 140 shown in FIG. 38B are substantially the same as those in the second embodiment. The transparent resin substrate 124*b* has substantially the same structure as that shown in FIG. 37A and FIG. 37B except that the shield electrode 126 is provided in substantially the entirety thereof. Therefore, the touch panel display in this embodiment increases the moisture resistance and the sensitivity of the touch panel 108 in addition to having the function and effect of the touch panel display 100 in the second embodiment.

Tenth Embodiment

In this embodiment, an example of touch panel display in which the sensor electrodes embedded in the transparent resin substrate each have a diamond shape will be described. In the following embodiment, components that are the same as those in the fifth embodiment and the sixth embodiment will not be described, and differences therefrom will be mainly described.

Figure 39A:
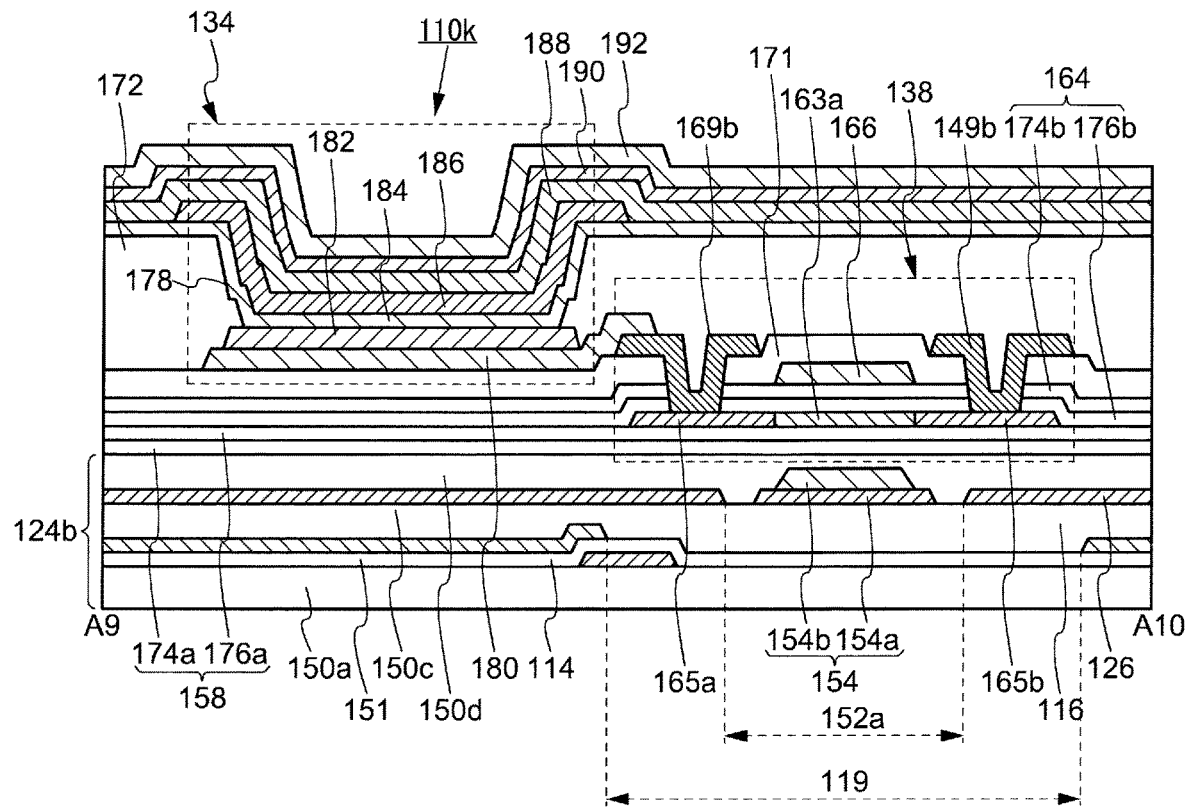
FIG. 39A and FIG. 39B are each a cross-sectional view showing a structure of a pixel in a touch panel display in an embodiment according to the present invention.
Figure 39B:
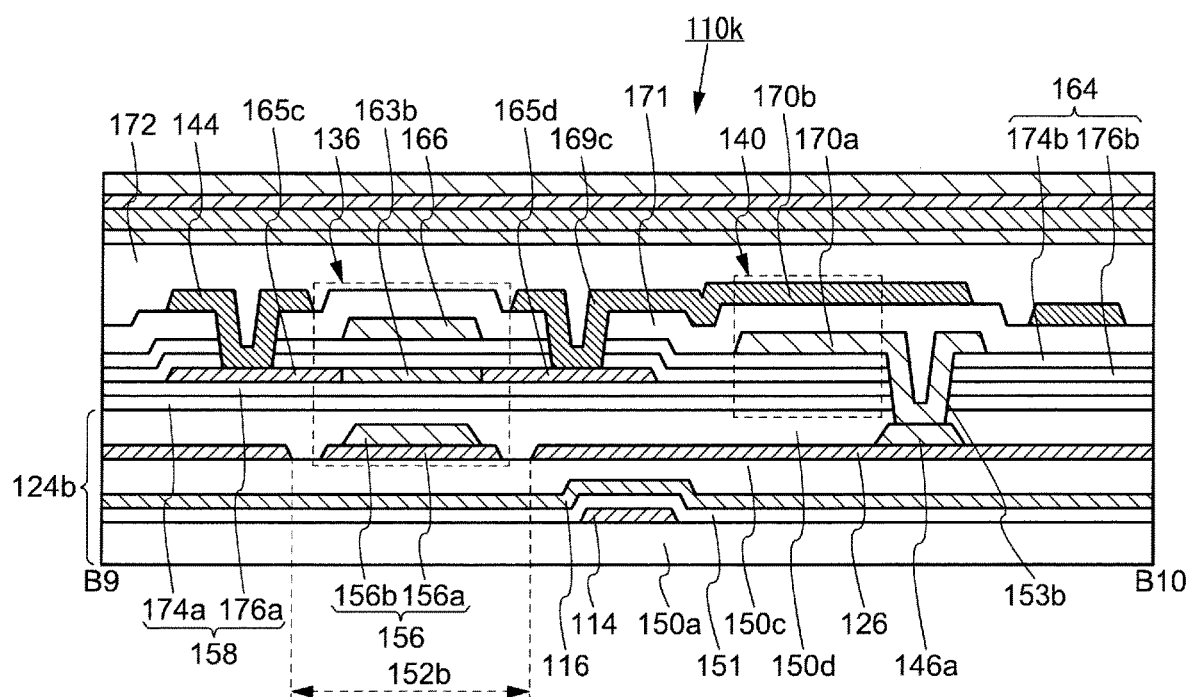

FIG. 39A and FIG. 39B show an example of pixel 110*k* of a touch panel display in which the diamond-shaped electrodes shown in FIG. 36 are embedded in the transparent resin substrate 124*b*. FIG. 39A shows a cross-sectional structure of the pixel 110*k* corresponding to the cross-sectional structure taken along line A9-A10 shown in FIG. 27. FIG. 39B shows a cross-sectional structure of the pixel 110*k* corresponding to the cross-sectional structure taken along line B9-B10 shown in FIG. 27. The structure of the driving transistor 138 and the organic EL element 134 shown in FIG. 39A and the structure of the selection transistor 136 and the capacitance element 140 shown in FIG. 39B are substantially the same as those in the fifth embodiment.

The transparent resin substrate 124*b* has substantially the same structure as that in the ninth embodiment. Therefore, the touch panel display in this embodiment increases the moisture resistance and the sensitivity of the touch panel 108 in addition to having the function and effect of the touch panel display 100 in the fifth embodiment.

Figure 40A:
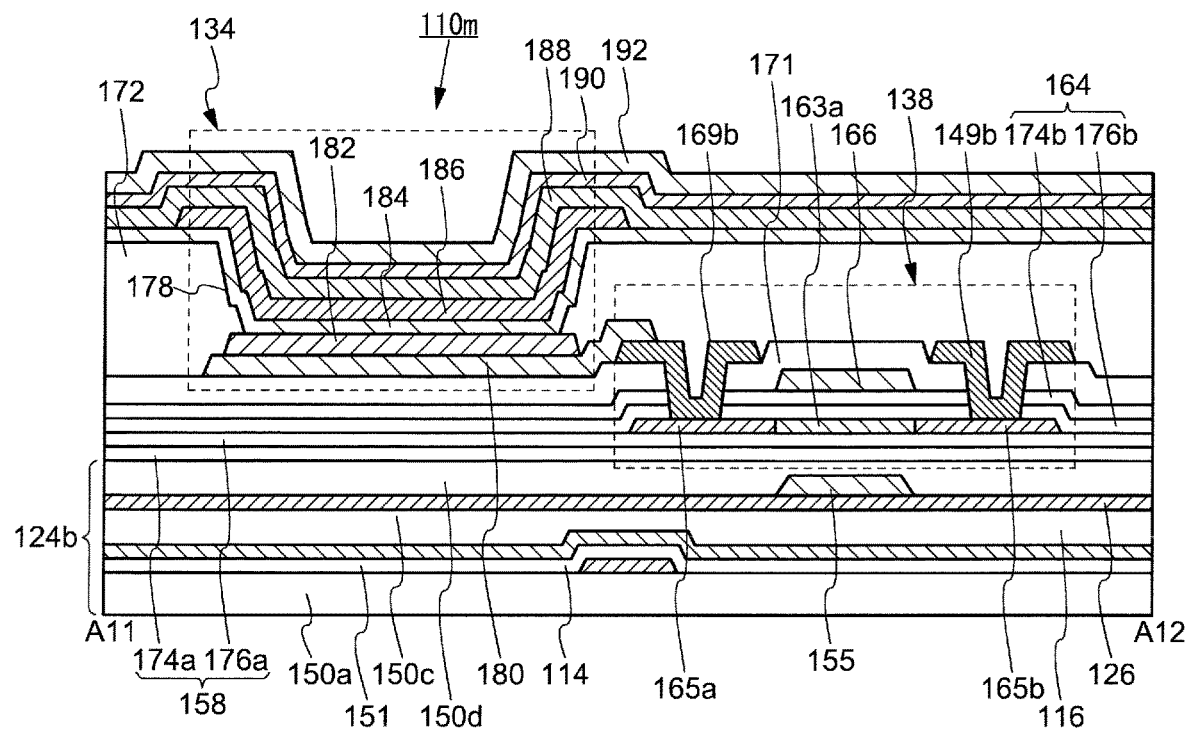
FIG. 40A and FIG. 40B are each a cross-sectional view showing a structure of the pixel in the touch panel display in an embodiment according to the present invention.
Figure 40B:
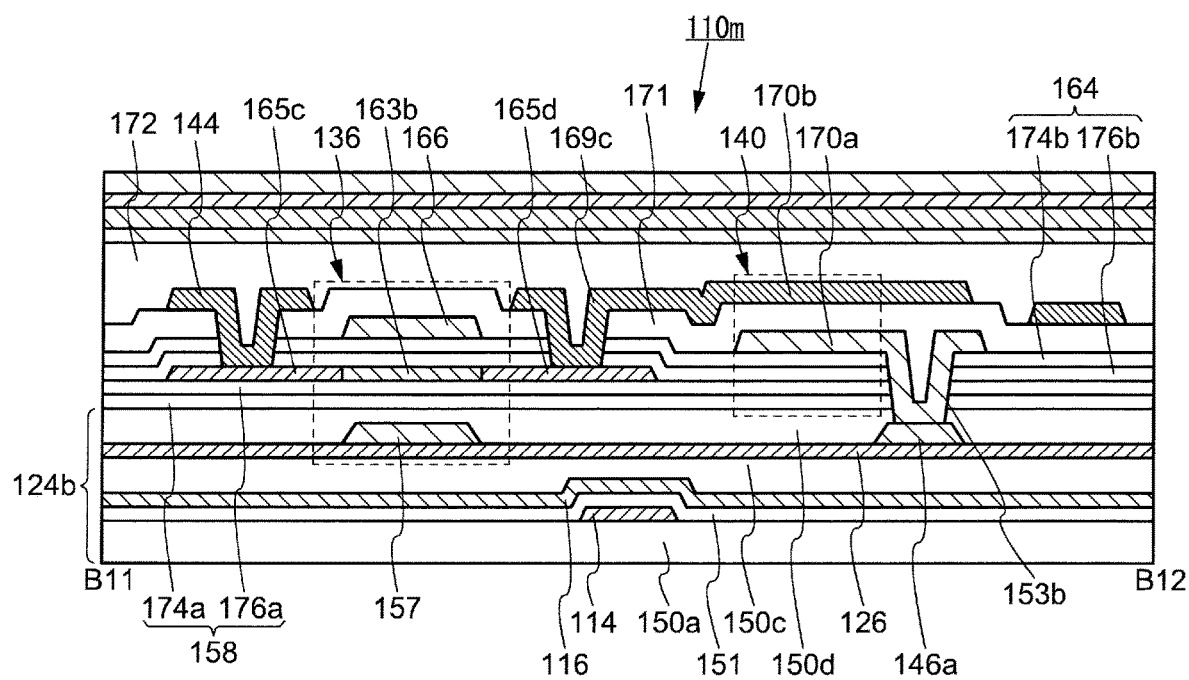

FIG. 40A and FIG. 40B show an example of pixel 110*m* of a touch panel display in which the diamond-shaped electrodes shown in FIG. 36 are embedded in the transparent resin substrate 124*b*. FIG. 40A shows a cross-sectional structure of the pixel 110*m* corresponding to the cross-sectional structure taken along line A11-A12 shown in FIG. 30. FIG. 40B shows a cross-sectional structure of the pixel 110*m* corresponding to the cross-sectional structure taken along line B11-B12 shown in FIG. 30.

The structure of the driving transistor 138 and the organic EL element 134 shown in FIG. 40A and the structure of the selection transistor 136 and the capacitance element 140 shown in FIG. 40B are substantially the same as those in the sixth embodiment. The transparent resin substrate 124*b* has substantially the same structure as that shown in FIG. 39A and FIG. 39B except that the shield electrode 126 is provided in substantially the entirety of the transparent resin substrate 124*b*. Therefore, the touch panel display in this embodiment increases the moisture resistance and the sensitivity of the touch panel 108 in addition to having the function and effect of the touch panel display 100 in the sixth embodiment.

Eleventh Embodiment

In this embodiment, various forms of the first sensor electrodes 114 and the second sensor electrodes 116 forming the touch sensor 108 will be described.

Figure 41A:
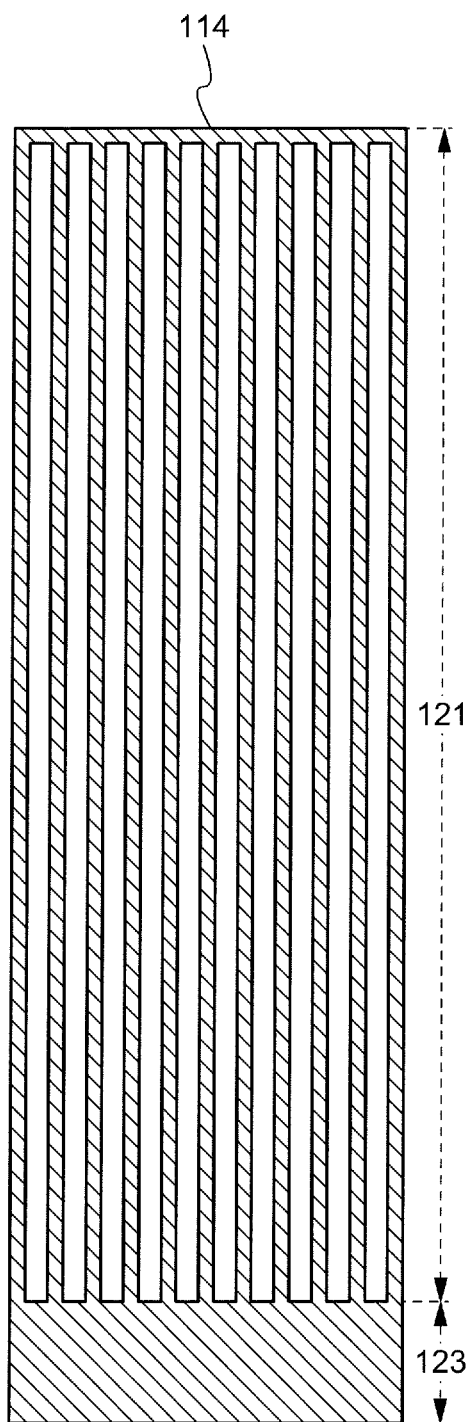
FIG. 41A and FIG. 41B are each a plan view showing an example of sensor electrode of a touch panel display in an embodiment according to the present invention.

FIG. 41A shows an example of first sensor electrodes 114. The first sensor electrodes 114 shown in FIG. 41A include an electrode portion 121 and a connection portion 123. The electrode portion 121 extends from a first end of the display portion 102 in a direction along the data signal line 144 to a second end facing the first end. The connection portion 123 is outer to the display portion 102 and is connected with the second driving circuit 112b. The first sensor electrodes 114 are formed of a metal film of aluminum (Al), titanium (Ti), molybdenum (Mo), copper (Cu) or the like. In the first sensor electrodes 114 shown in FIG. 41A, the electrode portion 121 includes linear patterns, whereas the connection portion 123 includes a two-dimensional solid pattern (the connection portion 123 is entirely formed of a metal material). The linear patterns each have a line width that is substantially equal to that of each of the data signal lines 144 provided in the display portion 102, and are located at the same interval (or pitch) as that of the data signal lines 144.

Figure 41B:
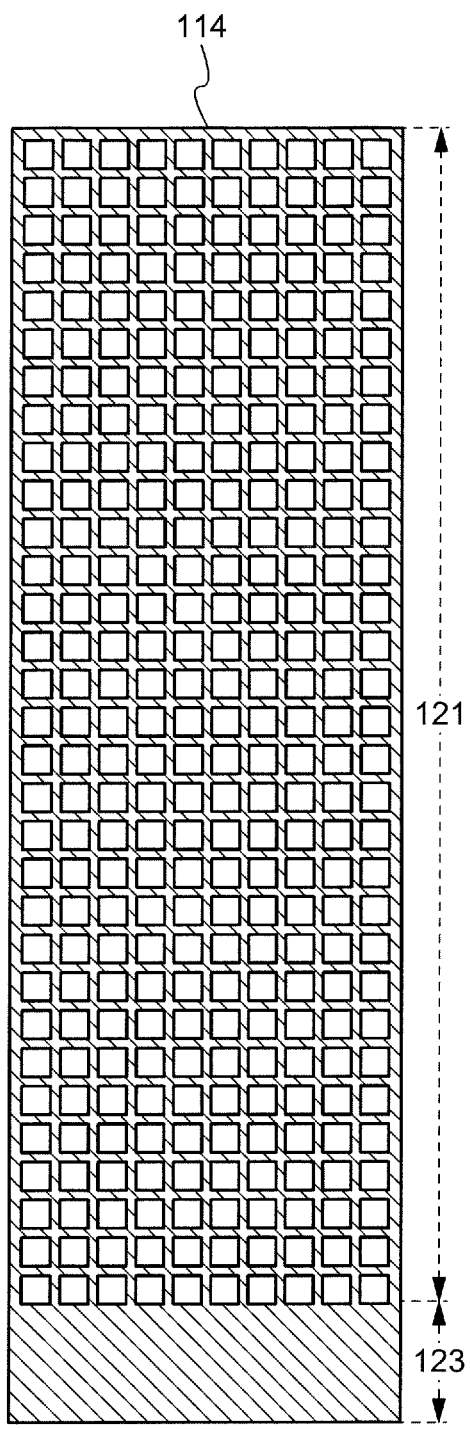

FIG. 41B shows another example of first sensor electrodes 114. In the first sensor electrodes 114 shown in FIG. 41B, the electrode portion 121 has a lattice pattern including a plurality of squares. The lattice pattern in the electrode portion 121 is provided such that lines of squares that are arrayed parallel to the gate signal line 142 each have a line width that is substantially equal to that of each of the gate signal lines 142, and are located at the same interval (or pitch) as that of the gate signal lines 142. The lattice pattern in the electrode portion 121 is provided such that lines of squares that are arrayed parallel to the data signal line 144 each have a line width that is substantially equal to that of each of the data signal lines 144, and are located at the same interval (or pitch) as that of the data signal lines 144. Alternatively, the lattice pattern in the electrode portion 121 may be provided such that the lines of squares that are arrayed parallel to the gate signal line 142 each have a line width that is substantially equal to that of each of the gate signal lines 142, and are located at the same interval (or pitch) as that of the gate signal lines 142; and such that the lines of squares that are arrayed parallel to the data signal line 144 each have a line width that is substantially equal to that of each of the data signal lines 144, and are located at three times the interval (or pitch) of that of the data signal lines 144.

Figure 42A:
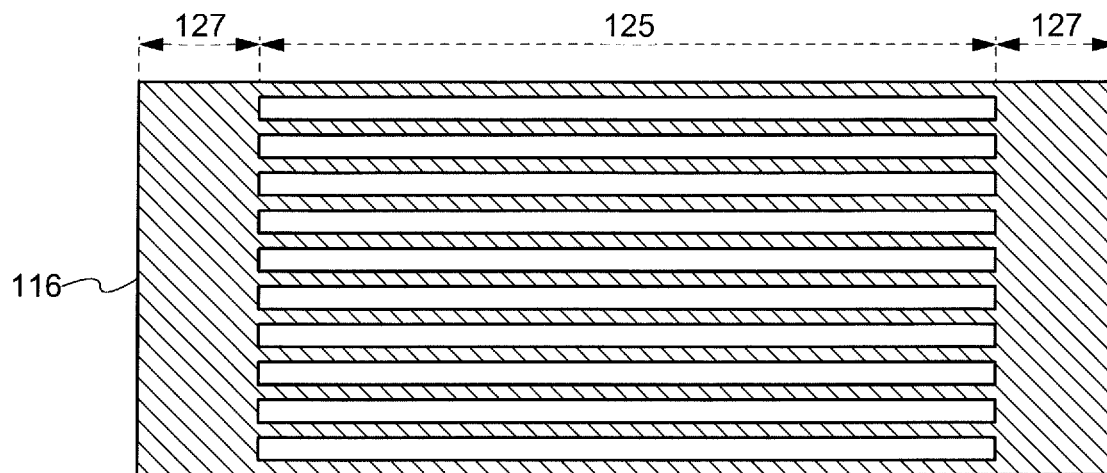
FIG. 42A and FIG. 42B are each a plan view showing an example of sensor electrode of the touch panel display in an embodiment according to the present invention.

FIG. 42A shows an example of second sensor electrodes 116. The second sensor electrodes 116 shown in FIG. 42A include an electrode portion 125 and a connection portion 127. The electrode portion 125 extends from a first end of the display portion 102 in a direction along the gate signal line 142 to a second end facing the first end. The connection portion 127 is outer to the display portion 102 and is connected with the third driving circuit 112c. The second sensor electrodes 116 are formed of a metal film of aluminum (Al), titanium (Ti), molybdenum (Mo), copper (Cu) or the like. In the second sensor electrodes 116 shown in FIG. 42A, the electrode portion 125 includes linear patterns, whereas the connection portion 127 includes a two-dimensional solid pattern (the connection portion 127 is entirely formed of a metal material). The linear patterns each have a line width that is substantially equal to that of each of the gate signal lines 142 provided in the display portion 102, and are located at the same interval (or pitch) as that of the gate signal lines 142.

Figure 42B:
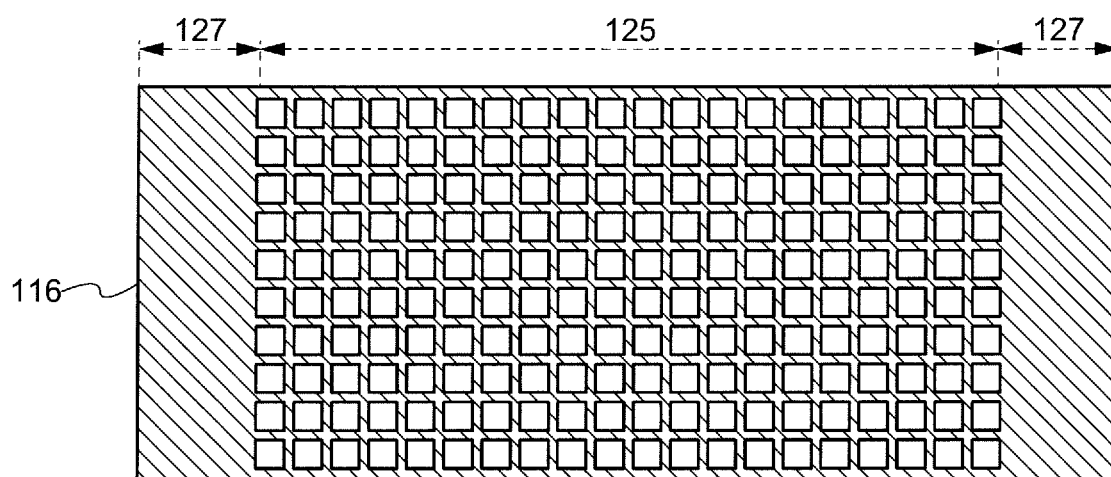

FIG. 42B shows another example of second sensor electrodes 116. In the second sensor electrodes 116 shown in FIG. 42B, the electrode portion 125 has a lattice pattern including a plurality of squares. The lattice pattern in the electrode portion 125 is provided such that lines of squares that are arrayed parallel to the gate signal line 142 each have a line width that is substantially equal to that of each of the gate signal lines 142, and are located at the same interval (or pitch) as that of the gate signal lines 142. The lattice pattern in the electrode portion 125 is provided such that lines of squares that are arrayed parallel to the data signal line 144 each have a line width that is substantially equal to that of each of the data signal lines 144, and are located at the same interval (or pitch) as that of the data signal lines 144. Alternatively, the lattice pattern in the electrode portion 125 may be provided such that the lines of squares that are arrayed parallel to the gate signal line 142 each have a line width that is substantially equal to that of each of the gate signal lines 142, and are located at the same interval (or pitch) as that of the gate signal lines 142; and such that the lines of squares that are arrayed parallel to the data signal line 144 each have a line width that is substantially equal to that of each of the data signal lines 144, and are located at three times the interval (or pitch) of that of the data signal lines 144.

In each of the examples shown in FIG. 41A, FIG. 41B, FIG. 42A and FIG. 42B, the first sensor electrodes 114 and the second sensor electrodes 116 are embedded in the transparent resin substrate 124. Therefore, for example, a metal film used to form the first sensor electrodes 114 and the second sensor electrodes 116 may be used to form an alignment marker. The alignment marker may be used to align the photomask used to form the data signal lines 144 in a later step, so that the first sensor electrodes 114, the second sensor electrodes 116, the gate signal lines 142 and the data signal lines 144 are positionally matched precisely with each other.

The first sensor electrodes 114 and the second sensor electrodes 116 in this embodiment have the same line width as that of the gate signal line 122 and the data signal line 144, and are located at the same pitch as that of the gate signal lines 142 and the data signal lines 144. Therefore, even in the case where the touch panel display is of a bottom emission-type, the touch sensor 108 is embedded in the transparent resin substrate 124 without decreasing the aperture ratio of the pixels. In addition, the first sensor electrodes 114 and the second sensor electrodes 116 are formed of a metal material, so that the resistance is decreased.

This embodiment may be appropriately combined with the touch sensor of the touch panel display in any of the first embodiment to the tenth embodiment.

Twelfth Embodiment

In this embodiment, various forms of the first sensor electrodes 114 and the second sensor electrodes 116 forming the touch sensor 108 will be described.

FIG. 43A shows an example of first sensor electrodes 114. The first sensor electrodes 114 shown in FIG. 43A include an electrode portion 121 including diamond-shaped electrode patterns, and a connection portion 123 provided at an end of the electrode portion 121. The electrode portion 121 extends from a first end of the display portion 102 in a direction along the data signal line 144 to a second end facing the first end. The connection portion 123 is outer to the display portion 102 and is connected with the second driving circuit 112b. In the first sensor electrodes 114 shown in FIG. 43A, the electrode portion 121 includes linear patterns, whereas the connection portion 123 has a two-dimensional solid pattern (the connection portion 123 is entirely formed of a metal material). The linear patterns each have a line width that is substantially equal to that of each of the data signal lines 144 provided in the display portion 102, and are located at the same interval (or pitch) as that of the data signal lines 144.

FIG. 43B shows another example of first sensor electrodes 114. In the first sensor electrodes 114 shown in FIG. 43B, the electrode portion 121, including diamond-shaped electrode patterns, has a lattice pattern including a plurality of squares. The lattice pattern in the electrode portion 121 is provided such that lines of squares that are arrayed parallel to the gate signal line 142 each have a line width that is substantially equal to that of each of the gate signal lines 142, and are located at the same interval (or pitch) as that of the gate signal lines 142. The lattice pattern in the electrode portion 121 is provided such that lines of squares that are arrayed parallel to the data signal line 144 each have a line width that is substantially equal to that of each of the data signal lines 144, and are located at the same interval (or pitch) as that of the data signal lines 144. Alternatively, the lattice pattern in the electrode portion 121 may be provided such that the lines of squares that are arrayed parallel to the gate signal line 142 each have a line width that is substantially equal to that of each of the gate signal lines 142, and are located at the same interval (or pitch) as that of the gate signal lines 142; and such that the lines of squares that are arrayed parallel to the data signal line 144 each have a line width that is substantially equal to that of each of the data signal lines 144, and are located at three times the interval (or pitch) of that of the data signal lines 144.

Figure 44A:
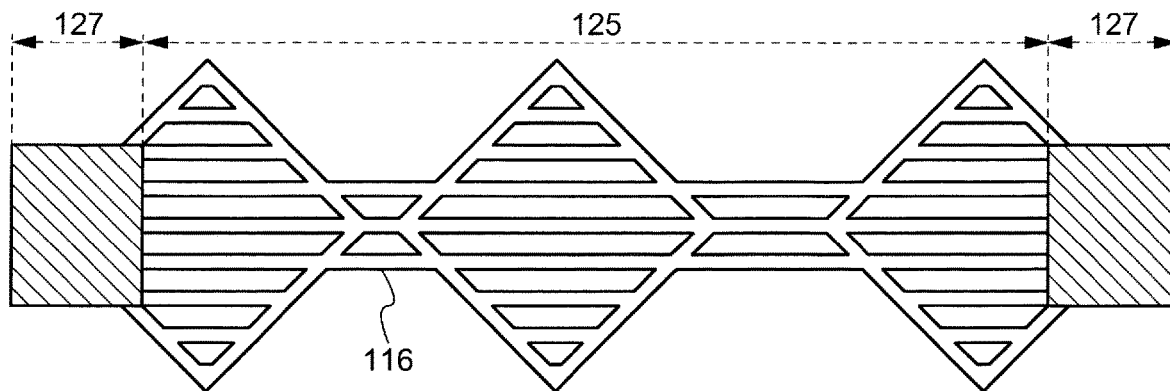
FIG. 44A and FIG. 44B are each a plan view showing an example of sensor electrode of the touch panel display in an embodiment according to the present invention.

FIG. 44A shows an example of second sensor electrodes 116. The second sensor electrodes 116 shown in FIG. 44A include an electrode portion 125 including diamond-shaped electrode patterns, and a connection portion 127. The electrode portion 125 extends from a first end of the display portion 102 in a direction along the gate signal line 142 to a second end facing the first end. The connection portion 127 is outer to the display portion 102 and is connected with the third driving circuit 112c. In the second sensor electrodes 116 shown in FIG. 44A, the electrode portion 125 includes linear patterns, whereas the connection portion 127 includes a two-dimensional solid pattern (the connection portion 127 is entirely formed of a metal material). The linear patterns each have a line width that is substantially equal to that of each of the gate signal lines 142 provided in the display portion 102, and are located at the same interval (or pitch) as that of the gate signal lines 142.

Figure 44B:
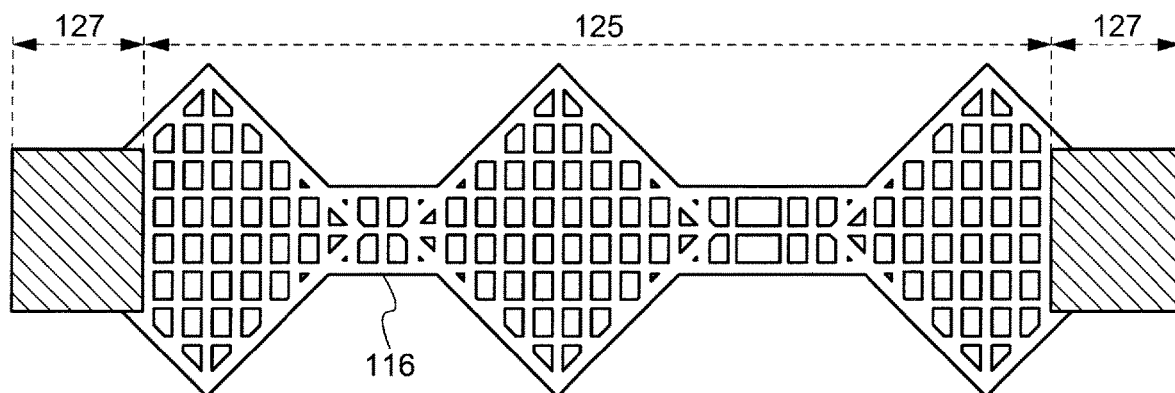

FIG. 44B shows another example of second sensor electrodes 116. In the second sensor electrodes 116 shown in FIG. 44B, the electrode portion 125, including diamond-shaped electrode patterns, has a lattice pattern including a plurality of squares. The lattice pattern in the electrode portion 125 is provided such that lines of squares that are arrayed parallel to the gate signal line 142 each have a line width that is substantially equal to that of each of the gate signal lines 142, and are located at the same interval (or pitch) as that of the gate signal lines 142. The lattice pattern in the electrode portion 125 is provided such that lines of squares that are arrayed parallel to the data signal line 144 each have a line width that is substantially equal to that of each of the data signal lines 144, and are located at the same interval (or pitch) as that of the data signal lines 144. Alternatively, the lattice pattern in the electrode portion 125 may be provided such that the lines of squares that are arrayed parallel to the gate signal line 142 each have a line width that is substantially equal to that of each of the gate signal lines 142, and are located at the same interval (or pitch) as that of the gate signal lines 142; and such that the lines of squares that are arrayed parallel to the data signal line 144 each have a line width that is substantially equal to that of each of the data signal lines 144, and are located at three times the interval (or pitch) of that of the data signal lines 144.

In this embodiment, the first sensor electrodes 114 and the second sensor electrodes 116 are formed of a metal film of aluminum (Al), titanium (Ti), molybdenum (Mo), copper (Cu) or the like. Therefore, the first sensor electrodes 114 and the second sensor electrodes 116 have a low resistance. In addition, like in the eleventh embodiment, an alignment marker may be formed in the transparent resin substrate 124 during the formation of the first sensor electrodes 114 and the second sensor electrodes 116. Therefore, the first sensor electrodes 114 and the second sensor electrodes 116 are positionally matched precisely with the gate signal lines 144 and the data signal lines 144.

The first sensor electrodes 114 and the second sensor electrodes 116 in this embodiment have the same line width as that of the gate signal line 142 and the data signal line 144, and are located at the same pitch as that of the gate signal lines 142 and the data signal lines 144. Therefore, even in the case where the touch panel display is of a bottom emission-type, the touch sensor 108 is embedded in the transparent resin substrate 124 without decreasing the aperture ratio of the pixels. In addition, the first sensor electrodes 114 and the second sensor electrodes 116 are formed of a metal material, so that the resistance is decreased.

This embodiment may be appropriately combined with the touch sensor of the touch panel display in any of the first embodiment to the tenth embodiment.

Thirteenth Embodiment

In this embodiment, forms of the first sensor electrodes 114 and the second sensor electrodes 116 forming the touch sensor 108 will be described. The first sensor electrodes 114 and the second sensor electrodes 116 forming the touch sensor 108 in this embodiment correspond to a diamond PenTile matrix of the pixels.

Figure 45A:
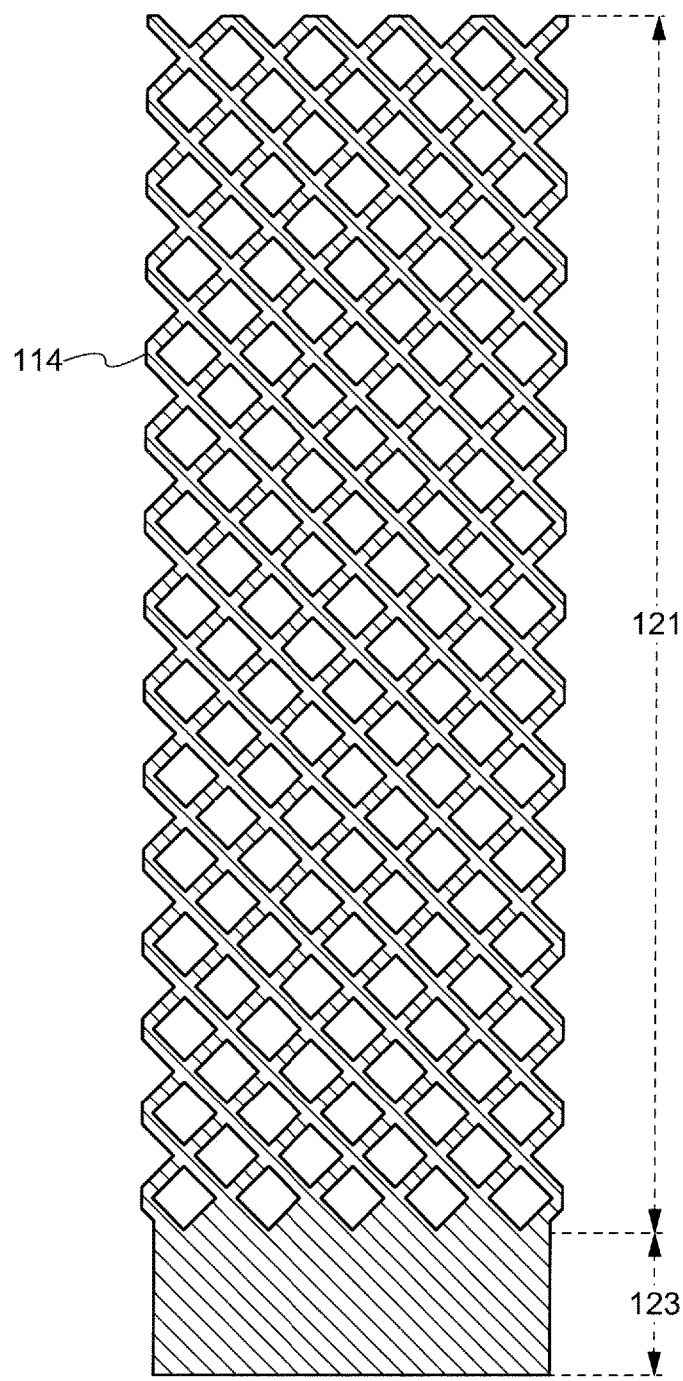
FIG. 45A and FIG. 45B are each a plan view showing an example of sensor electrode of a touch panel display in an embodiment according to the present invention.
Figure 45B:
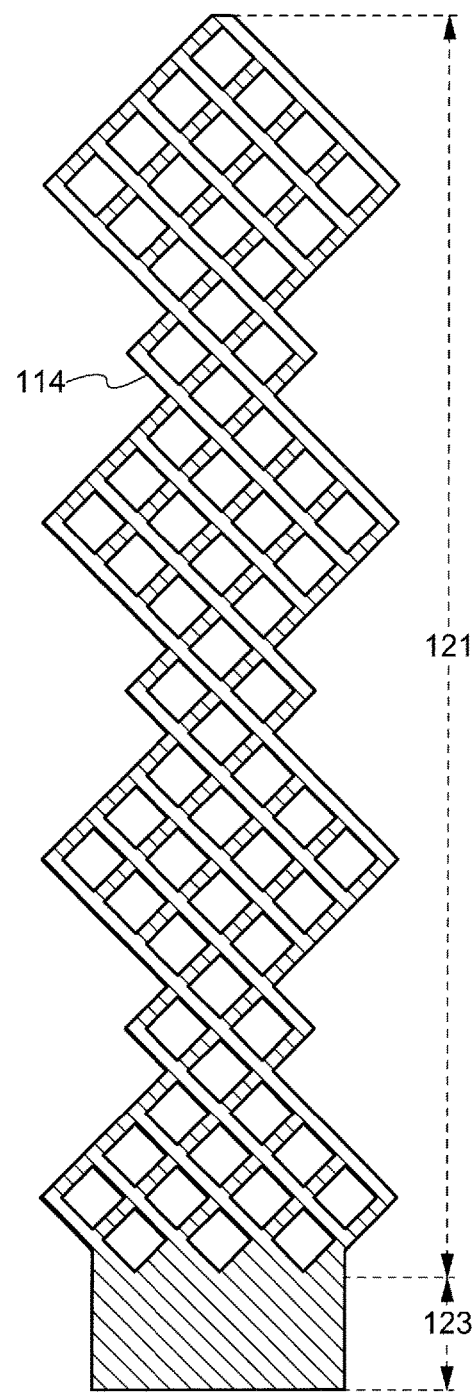

FIG. 45A shows an example of first sensor electrodes 114. The first sensor electrodes 114 shown in FIG. 45A is formed of a metal film, has a strip-like shape, and includes a connection portion 123 and an electrode portion 121. The electrode portion 121 includes a mesh pattern corresponding to pixels located in a diamond PenTile matrix. The mesh of the metal material is located in positional correspondence with a region where light is not emitted from the pixels. The connection portion 123 includes a two-dimensional solid pattern of a metal film (the connection portion 123 is entirely formed of a metal material). In the example shown in FIG. 45B, the electrode portion 123 of the first sensor electrodes 114 includes diamond-shaped electrode patterns, and also includes a mesh pattern corresponding to pixels located in a diamond PenTile matrix.

Figure 46A:
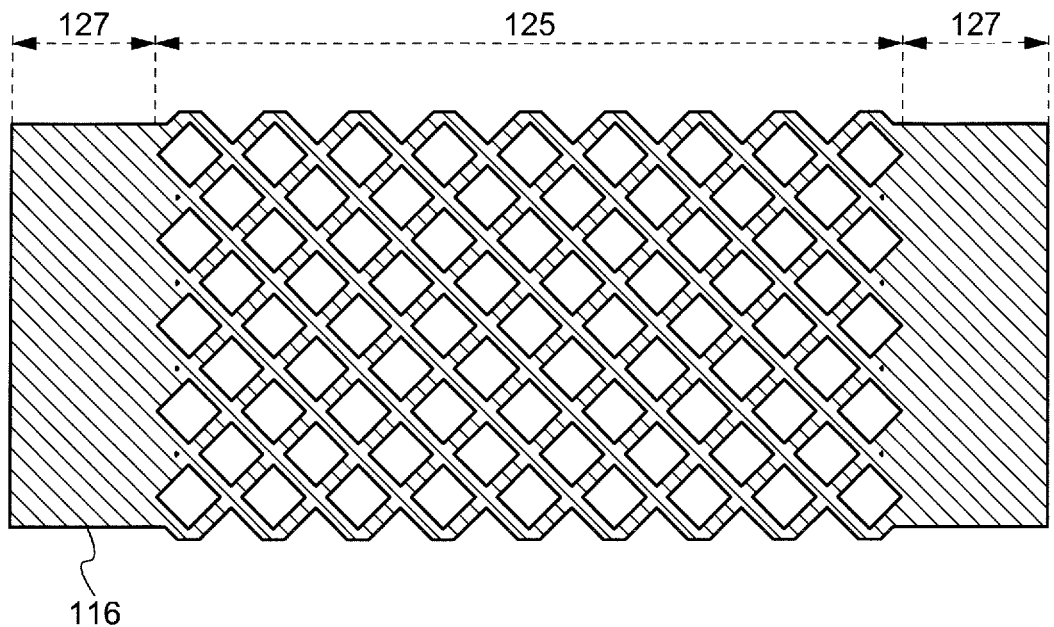
FIG. 46A and FIG. 46B are each a plan view showing an example of sensor electrode of the touch panel display in an embodiment according to the present invention.
Figure 46B:
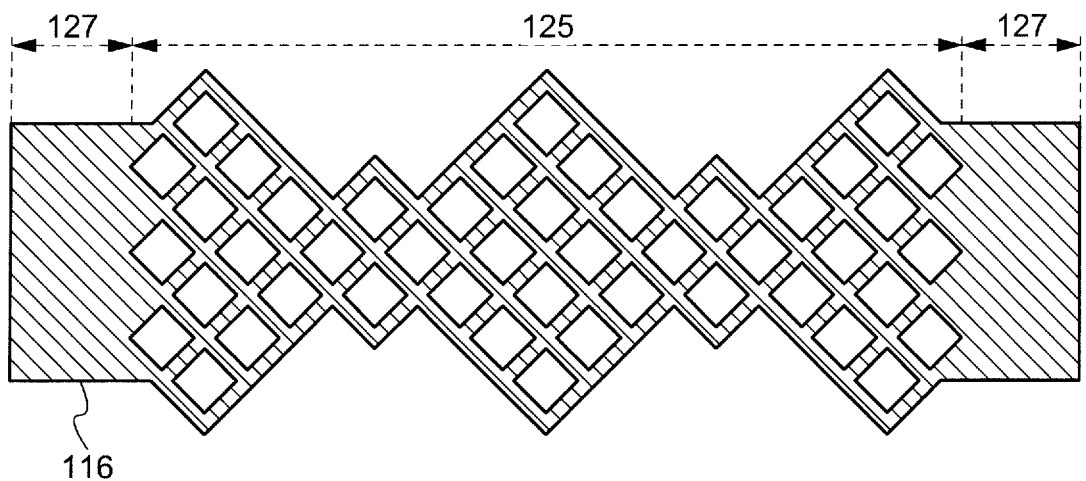

FIG. 46A shows an example of second sensor electrodes 116. The second sensor electrodes 116 shown in FIG. 46A is formed of a metal film, has a strip-like shape, and includes a connection portion 127 and an electrode portion 125. The electrode portion 125 includes a mesh pattern corresponding to pixels located in a diamond PenTile matrix. The mesh of the metal material is located in positional correspondence with a region where light is not emitted from the pixels. The connection portion 127 includes a two-dimensional solid pattern of a metal film (the connection portion 127 is entirely formed of a metal material). In the example shown in FIG. 46B, the electrode portion 125 of the second sensor electrodes 116 includes diamond-shaped electrode patterns, and also includes a mesh pattern corresponding to pixels located in a diamond PenTile matrix.

The mesh patterns of the electrode portions 121 and 125 each merely need to have an opening pattern enclosing a set of two sub pixels corresponding to green, one sub pixel corresponding to red and one sub pixel corresponding to blue (one set of sub pixels). The mesh pattern may each have an opening pattern enclosing four or nine sets of the sub pixels.

The first sensor electrodes 114 shown in FIG. 45A and the second sensor electrodes 116 shown in FIG. 46A are located in an overlapping manner with an insulating layer being located between the first sensor electrodes 114 and the second sensor electrodes 116. In this case, the mesh pattern of the electrode portion 121 of the first sensor electrodes 114, and the mesh pattern of the electrode portion 125 of the second sensor electrodes 116, may be located to overlapping each other. Alternatively, the mesh pattern of the electrode portion 121 and the mesh pattern of the electrode portion 125 may be shifted from each other. In any way, the mesh pattern is located so as not to overlap the light emitting regions of the pixels, so that the aperture ratio of the pixels is not decreased. The mesh pattern of a metal material encloses the pixels, and thus acts as a light blocking film (also referred to as a "black matrix") to improve the image quality.

This embodiment may be appropriately combined with the touch sensor of the touch panel display in any of the first embodiment to the tenth embodiment.

Fourteenth Embodiment

In this embodiment, a form of connection structure between the first sensor electrodes 114 and the second sensor electrodes 116 with drawing wires will be described.

Figure 47A:
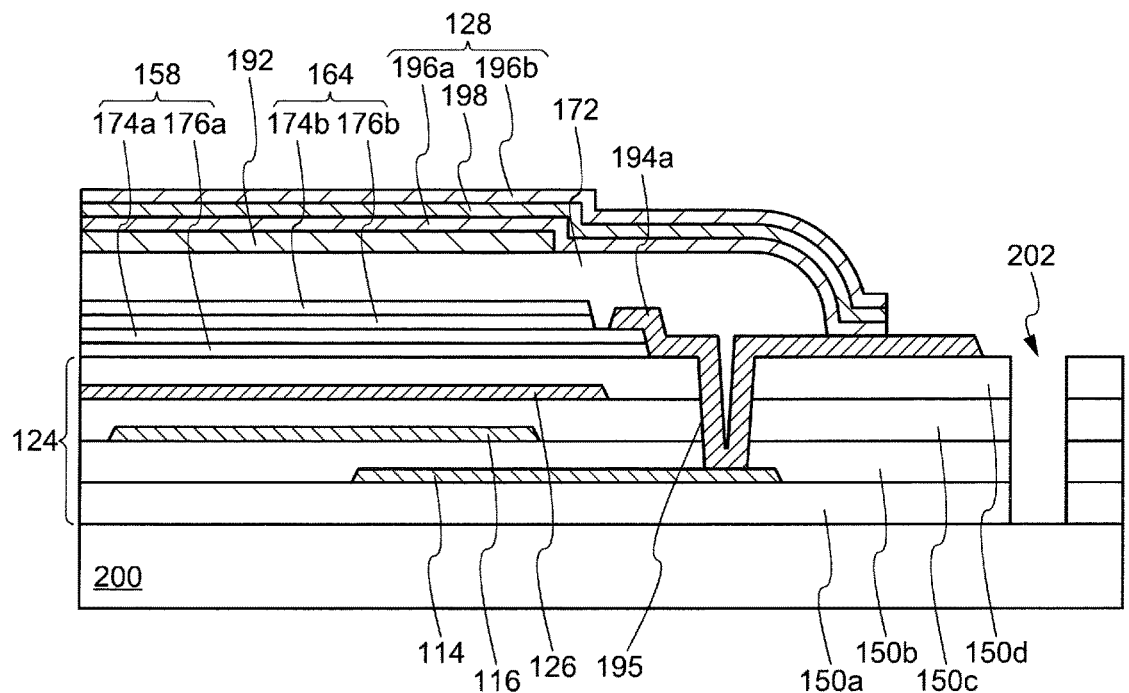
FIG. 47A and FIG. 47B are each a cross-sectional view showing an example of structure connecting a sensor electrode and a drawing wire in a touch panel display in an embodiment according to the present invention.

FIG. 47A shows an example of connection structure between the first sensor electrode 114 and a first drawing wire 194a. The first sensor electrode 114 is connected with the first drawing wire 194a in a region outer to the display portion 102. The first sensor electrode 114 is provided between the first transparent resin layer 150a and the second transparent resin layer 150b, and the first drawing wire 194a is provided on the fourth transparent resin layer 150d.

As shown in FIG. 47A, the first insulating layer 158, the second insulating layer 164 and the flattening layer 172 are stacked on the fourth transparent resin layer 150d, and the second electrode 192 is provided on the flattening layer 172. FIG. 47A shows that the sealing layer 128 is further provided on the second electrode 192. The sealing layer 128 may have any structure. In this embodiment, the sealing layer 128 includes a carbon nitride film 196a, a silicon nitride film 198 and a carbon nitride film 196b are stacked in this order. The carbon nitride film 196 is a polymerized film formed by plasma polymerization using, as material gas, hydrogen carbide gas such as methane ($CH_4$) of the like and gas such as nitrogen ($N_2$), ammonia ($HN_3$) or the like. Meanwhile, the silicon nitride film 198 is formed by plasma CVD using, as material gas, silane ($SiH_4$), ammonia ($NH_3$), and nitrogen ($N_2$). The plasma polymerized film such as the carbon nitride film 196 or the like has properties of having no pinhole, having a high level of step coverage, and having a small inner stress. The carbon nitride film 196 having such properties and the silicon nitride film 198 are combined, so that the sealing layer 128 having a high level of water vapor blocking property is provided.

The first drawing wire 194a is electrically connected with the first sensor electrode 114 via a contact hole 195 running through the second transparent resin layer 150b, the third transparent resin layer 150c and the fourth transparent resin layer 150d. The first drawing wire 194a is drawn to the outside of the flattening layer 172 and the sealing layer 128. The first drawing wire 194a may be formed to be connected with the terminal electrode 118 in a region exposed from the sealing layer 128.

FIG. 47A shows a form in which the transparent resin substrate 124 is provided on the support substrate 200 and the division region 202 is provided in the vicinity of the terminal electrode 118 (FIG. 1). The division region 202 is an opening running through the transparent resin substrate 124. The division region 202 is formed by, for example, laser processing. The division region 202 is formed as an open groove continuous so as to enclose the display panel. After the division region 202 is formed, the transparent resin substrate 124 may be delaminated from the support substrate 200 by laser ablation as described above in the first embodiment.

It is preferred that the first transparent resin layer 150a is formed of a transparent polyimide resin. The transparent polyimide resin is softer than a transparent para-polyamide resin and has a high level of heat resistance, and therefore has an advantage of not generating a modified layer even by laser ablation. It is preferred that the fourth transparent resin layer 150d is formed of a transparent para-polyamide resin. The first drawing wire 194a and the terminal electrode 118 (shown in FIG. 1) are provided on the fourth transparent resin layer 150d. The transparent para-polyamide resin is harder than the transparent polyimide resin, and therefore, prevents the metal film used to form the first drawing wire 194a and the terminal electrode 118 from coming off. The flexible printed circuit board 122 as shown in FIG. 1 may be thermally press-fit to the terminal electrode 118, so that the deformation of the transparent resin substrate 124 is suppressed.

Figure 47B:
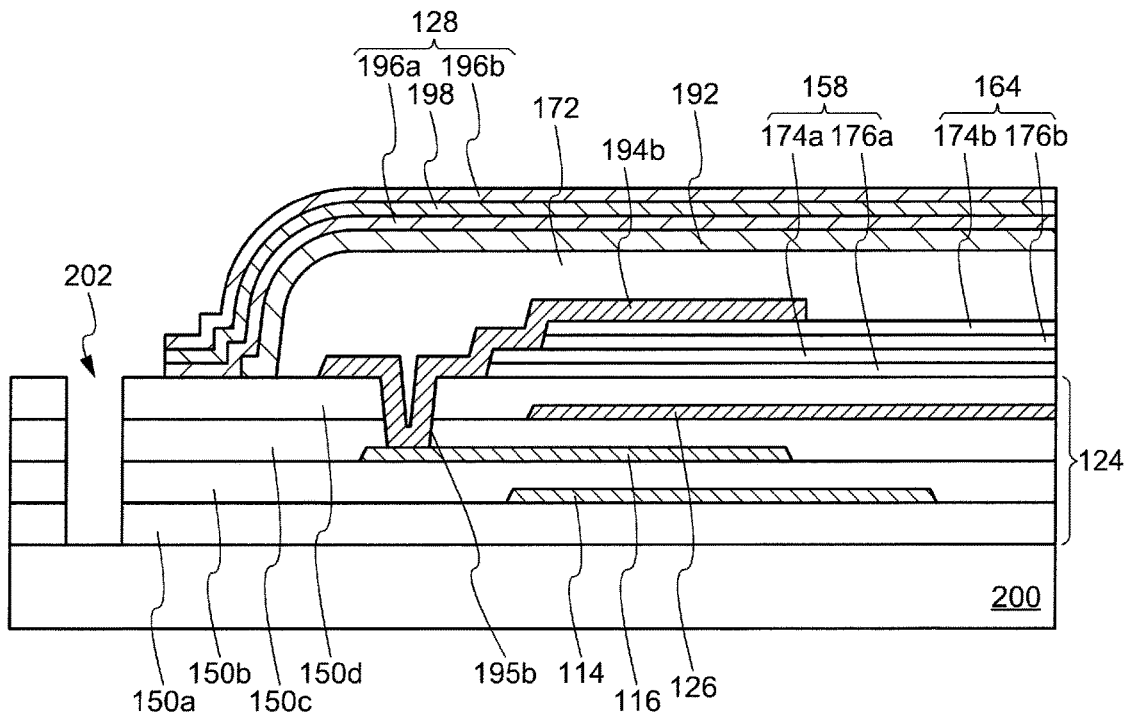

FIG. 47B shows an example of connection structure between the second sensor electrode 116 and a second drawing wire 194b. The second sensor electrode 116 is connected with the second drawing wire 194b in a region outer to the display portion 102. The second sensor electrode 116 is provided between the second transparent resin layer 150b and the third transparent resin layer 150c, and the second drawing wire 194b is provided on the fourth transparent resin layer 150d. It is preferred that the fourth transparent resin layer 150d is formed of a transparent para-polyamide resin from the point of view of gas barrier property of preventing permeation of water vapor.

The second drawing wire 194b is electrically connected with the second sensor electrode 116 via a contact hole 195b running through the third transparent resin layer 150c and the fourth transparent resin layer 150d. The second drawing wire 194b is drawn onto the second information layer 164 so as to be connected with the third driving circuit 112c. In FIG. 47B, the third driving circuit 112c is omitted.

Figure 48A:
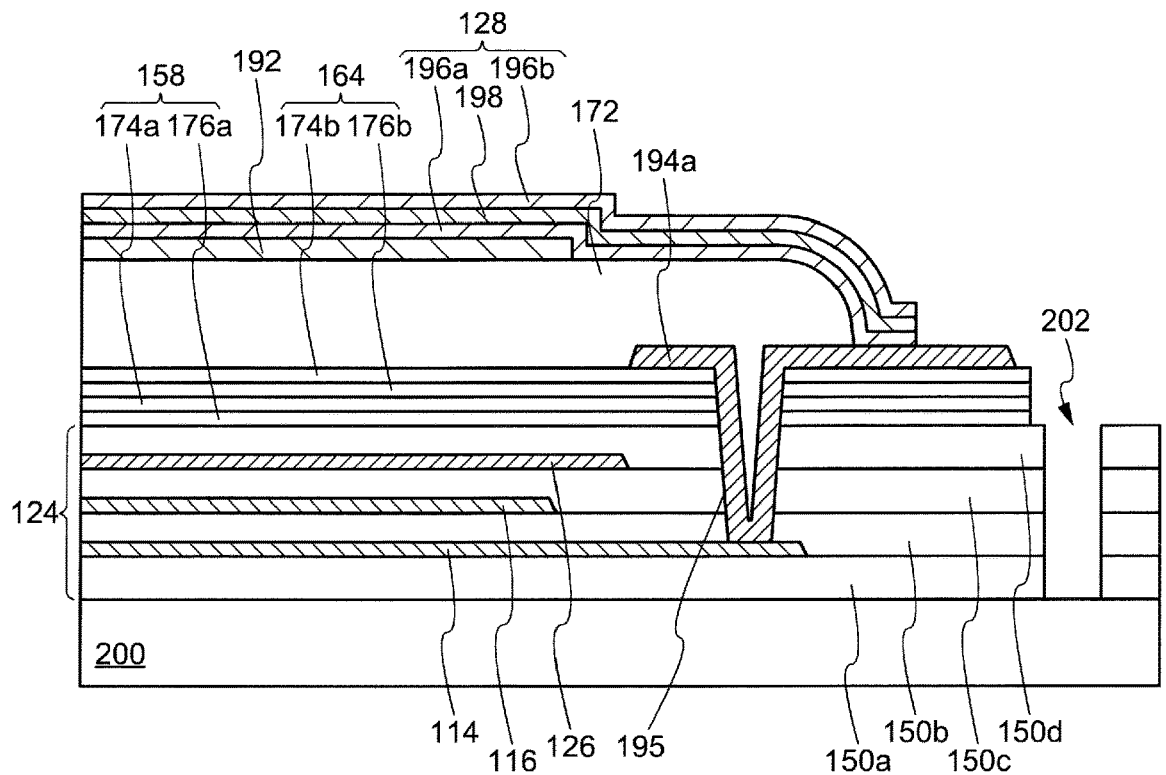
FIG. 48A and FIG. 48B are each a cross-sectional view showing an example of structure connecting a sensor electrode and a drawing wire in the touch panel display in an embodiment according to the present invention.
Figure 48B:
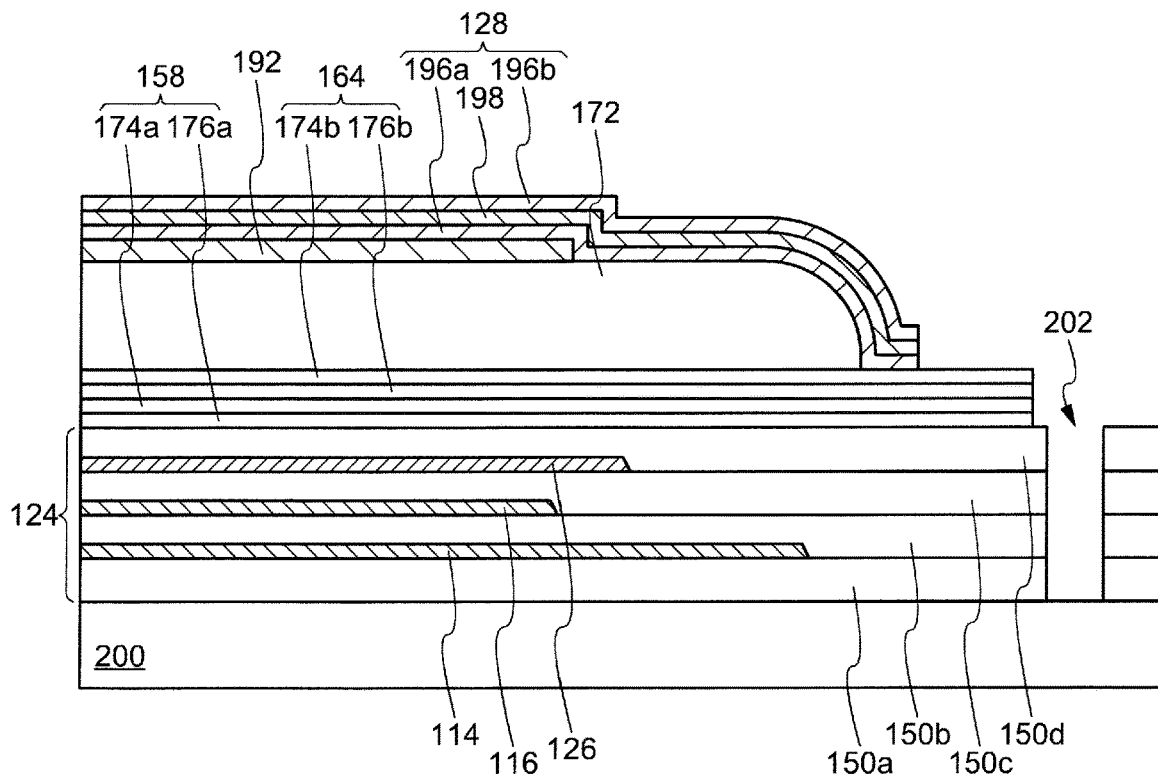

As shown in FIG. 48A, the first insulating layer 158 and the second insulating layer 164 may be extended to the outside of the flattening layer 172. With such a structure, in a region where the first drawing wire 194a is not provided as shown in FIG. 48B, the second insulating layer 164 formed of an inorganic insulating film and the sealing layer 128 formed of an inorganic insulating film are provided in close contact with each other. The second insulating layer 164 and the sealing layer 128 are in close contact with each other in a region outer to the flattening layer 172, so that entrance of moisture is prevented and the sealing capability is improved.

Figure 49:
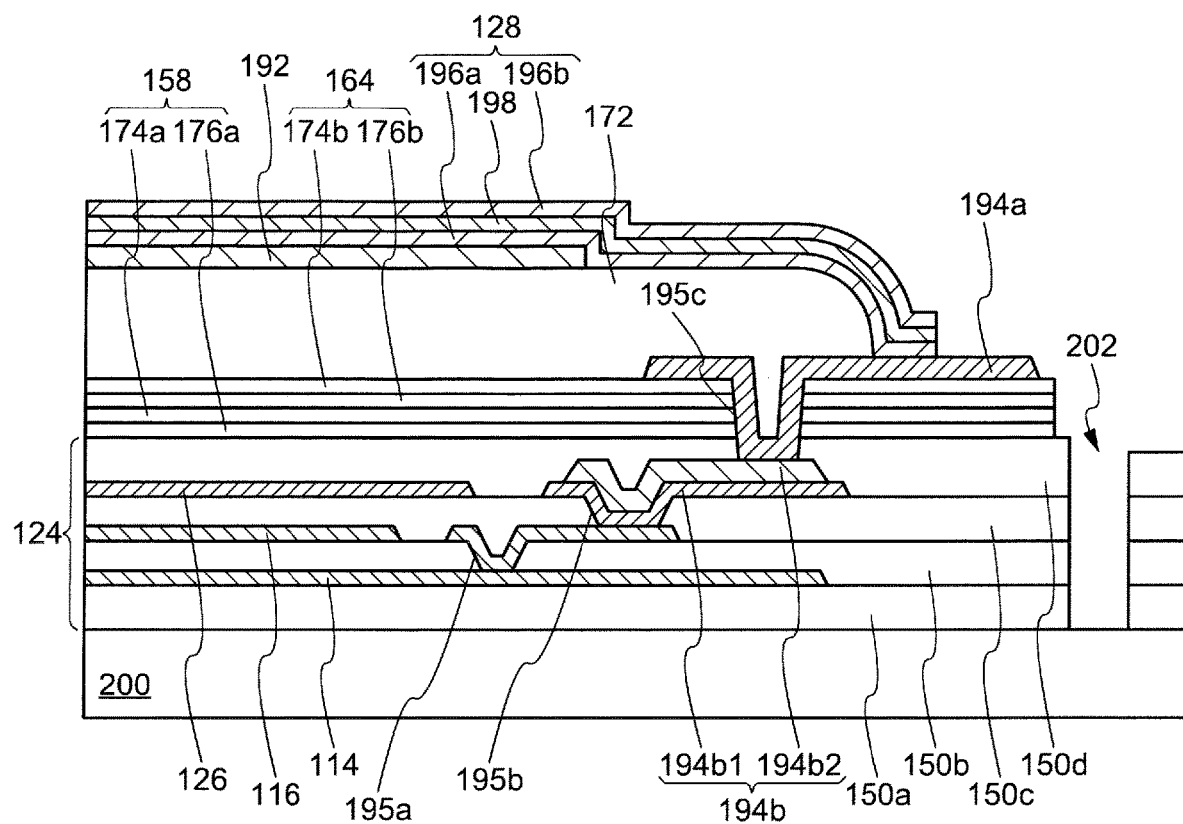
FIG. 49 is a cross-sectional view showing an example of structure connecting a sensor electrode and a drawing wire in the touch panel display in an embodiment according to the present invention.

As shown in FIG. 49, the first drawing wire 194a may be electrically connected with the second drawing wire 194b (including a transparent conductive film 194b1 and a metal film 194b2) via a contact hole 195c formed in the second insulating layer 164, the first insulating layer 158 and the fourth transparent resin layer 150d. The second drawing wire 194b may be electrically connected with a drawing wire 194c via the contact hole 195b formed in the third transparent resin layer 150c. The drawing wire 194c may be electrically connected with the first sensor electrode 114 via the first contact hole 195a formed in the second transparent resin layer 150b. The drawing wires 194 are coupled with each other via the contact holes formed in the transparent resin layers 150, so that each of the contact holes is made shallow and thus the electrical connection is guaranteed.

In this embodiment, the contact holes 195 running through the transparent resin layers 150 are provided. Therefore, even in the case where the first sensor electrodes 114 and the second sensor electrodes 116 forming the touch sensor 108 are embedded in the transparent resin substrate 124, the drawing wires 194 are drawn to an upper level and are connected with the terminal electrode 118 and the driving circuit 112.

Supplementary Notes

The entirety of, or a part of, the illustrative embodiments disclosed above may be defined by the following supplementary notes. Any embodiment of the present invention is not limited to any of the following.

Supplementary Note 1

A method for manufacturing a touch panel display, the method include forming a transparent resin substrate including a touch sensor including a first sensor electrode extending in a first direction and a second sensor electrode extending in a second direction crossing the first direction, forming a shield electrode covering the touch sensor; and forming, on the transparent resin substrate, a display portion including pixels each including a transistor and an organic electroluminescence element electrically connected with the transistor.

Supplementary Note 2

The method for manufacturing a touch panel display according to supplementary note 1, in which the formation of the transparent resin substrate includes: forming a first transparent resin layer on a support substrate, forming the first sensor electrode extending in the first direction on the first transparent resin layer, forming a second transparent resin layer on the first transparent resin layer and the first sensor electrode, forming the second sensor electrode, extending in the second direction crossing the first direction, on the second transparent resin layer, forming a third transparent resin layer on the second transparent resin layer and the second sensor electrode, forming the shield electrode on the third transparent resin layer, and forming a fourth transparent resin layer on the shield electrode.

Supplementary Note 3

The method for manufacturing a touch panel display according to supplementary note 2, in which the first transparent resin layer, the second transparent resin layer, the third transparent resin layer and the fourth transparent resin layer are formed of a transparent para-polyamide resin or a transparent polyimide resin.

Supplementary Note 4

The method for manufacturing a touch panel display according to supplementary note 2, in which the first transparent resin layer is formed of a transparent polyimide resin, the fourth transparent resin layer is formed of a transparent para-polyamide resin, and the second transparent resin layer and the third transparent resin layer are formed of a transparent para-polyamide resin or a transparent polyimide resin.

Supplementary Note 5

The method for manufacturing a touch panel display according to supplementary note 2, in which the first transparent resin layer and the third transparent resin layer are formed of a para-polyamide resin or a polyimide resin, and the second transparent resin layer is formed of a silicon nitride film or an aluminum oxide film.

Supplementary Note 6

The method for manufacturing a touch panel display according to supplementary note 1, in which the first sensor electrode and the second first sensor electrode are each formed of a transparent conductive film.

Supplementary Note 7

The method for manufacturing a touch panel display according to supplementary note 1, in which the first sensor electrode and the second first sensor electrode are each formed of a transparent conductive film and formed to have a stripe pattern or a mesh pattern having openings at positions different from positions of the pixels.

Supplementary Note 8

The method for manufacturing a touch panel display according to supplementary note 1, in which the shield electrode is formed of a transparent conducive film.

Supplementary Note 9

The method for manufacturing a touch panel display according to supplementary note 1, in which the transistor is formed to include a first gate electrode, a first insulating layer on the first gate electrode, a semiconductor layer on the first insulating layer, a second insulating layer on the semiconductor layer, and a second gate electrode on the second insulating layer.

Supplementary Note 10

The method for manufacturing a touch panel display according to supplementary note 9, further including forming an opening in the shield electrode in a region overlapping the transistor, and forming the first gate electrode in the opening.

Supplementary Note 11

The method for manufacturing a touch panel display according to supplementary note 9, in which the first gate electrode is formed in contact with the shield electrode.

Supplementary Note 12

The method for manufacturing a touch panel display according to supplementary note 10, in which the opening of the shield electrode and the first gate electrode are formed by patterning by use of one photomask.

Supplementary Note 13

The method for manufacturing a touch panel display according to supplementary note 12, in which a multiple tone mask is used as the photomask.

Supplementary Note 14

The method for manufacturing a touch panel display according to supplemental note 2, further including an opening in the second sensor electrode in a region overlapping the transistor.

Supplementary Note 15

A touch panel display, including a display portion including a video signal line and a scanning signal line, a touch sensor electrode including a first sensor electrode (receiver electrode) and a second sensor electrode (transmitter electrode), and a driving circuit located outer to the display portion and the touch sensor. the driving circuit includes a video signal line driving circuit outputting a video signal to the video signal line, a scanning signal line driving circuit outputting a timing signal, synchronized to the video signal, to the scanning signal line, a sensing circuit receiving a detection signal output from the first sensor electrode (receiver electrode) and outputting a sensing signal, and a scanning circuit outputting a driving signal to the second sensor electrode (transmitter electrode). The driving circuit includes the video signal line driving circuit, the scanning signal line driving circuit, the sensing circuit and the scanning circuit in an integrated manner.

Supplementary Note 16

The touch panel display according to supplementary note 15, in which the driving circuit is included in a single semiconductor chip in an integrated manner.

Supplementary Note 17

The touch panel display according to supplementary note 15, in which the driving circuit includes the video signal line driving circuit, the scanning signal line driving circuit, the sensing circuit and the scanning circuit in an integrated manner as blocks.

Supplementary Note 18

The touch panel display according to supplementary note 15, in which the display portion includes a plurality of pixels, and the plurality of pixels each include an organic electroluminescence element.

What is claimed is:

1. A touch panel display, comprising:
   a transparent substrate;
   a touch sensor including a first sensor electrode and a second sensor electrode embedded in the transparent substrate;
   a display portion disposed on the transparent substrate and including a plurality of pixels, a plurality of scanning signal lines, and a plurality of video signal lines;
   a driver IC;
   a first driving circuit disposed on the transparent substrate and connected with the plurality of scanning signal lines;
   a second driving circuit disposed on the transparent substrate and connected with the second sensor electrode, and
   a sealing layer covering the display portion, the first driving circuit, and the second driving circuit,
   wherein
   the touch sensor and the display portion overlap each other in a plan view,
   the transparent substrate comprises a plurality of transparent insulating layers,
   the first sensor electrode and the second sensor electrode are disposed between different layers of the plurality of transparent insulating layers,
   the first sensor electrode is electrically connected to the driver IC by a first drawing wiring via a first contact hole through at least one transparent insulating layer of the plurality of transparent insulating layers,
   the second sensor electrode is electrically connected to the second driving circuit by a second drawing wiring via a second contact hole through at least one transparent insulating layer of the plurality of transparent insulating layers,
   the first drawing wiring, and the second drawing wiring are disposed over the plurality of transparent insulating layers, and
   the first contact hole and the second contact hole are covered with the sealing layer.

2. The touch panel display according to claim 1, wherein the plurality of transparent insulating layers comprises a first transparent insulating layer, a second transparent insulating layer, and a third transparent insulating layer,
   the first sensor electrode is disposed between the first transparent insulating layer and the second transparent insulating layer, and
   the second sensor electrode is disposed between the second transparent insulating layer and the third transparent insulating layer.

3. The touch panel display according to claim 2, wherein each of the plurality of pixels includes a bottom emission type organic electroluminescence element.

4. The touch panel display according to claim 1, further comprising a light transmissive shield electrode between the touch sensor and the display portion,
   wherein the first contact hole and the second contact hole are disposed outside the light transmissive shield electrode.

5. The touch panel display according to claim 4, wherein the light transmissive shield electrode is disposed on the third transparent insulating layer, and
   the light transmissive shield electrode is covered with a fourth transparent insulating layer.

6. The touch panel display according to claim 5, wherein the transparent substrate comprises the first transparent insulating layer, the second transparent insulating layer, and the third transparent insulating layer.

7. The touch panel display according to claim 1, wherein the sealing layer is formed of two different layers of a carbon nitride film and a silicon nitride thin film.

8. The touch panel display according to claim 1, wherein the sealing layer is formed of a carbon nitride film, a first silicon nitride film, and a second carbon nitride film.

9. The touch panel display according to claim 1, wherein the second driving circuit is disposed between an end portion of the transparent substrate and the display portion, and the first driving circuit is disposed between the second driving circuit and the display portion, in a plan view.

10. The touch panel display according to claim 1, wherein the first driving circuit and the second driving circuit are disposed on a first side of the display portion and a second side opposite to the first side of the display portion, in a plan view.

11. The touch panel display according to claim 1, further comprising a driver IC,
wherein the driver IC includes a video signal processing circuit and a sensor signal processing circuit.

12. A touch panel display, comprising:
a transparent substrate;
a touch sensor including a first sensor electrode and a second sensor electrode embedded in the transparent substrate;
a display portion disposed on the transparent substrate and including a plurality of pixels, a plurality of scanning signal lines, and a plurality of video signal lines;
a driver IC;
a first driving circuit connected with the plurality of scanning signal lines;
a second driving circuit connected with the second sensor electrode, and
a sealing layer covering the display portion, the first driving circuit, and the second driving circuit,
wherein
the touch sensor and the display portion overlap each other in a plan view,
the transparent substrate comprises a plurality of transparent insulating layers,
the first sensor electrode and the second sensor electrode are disposed between different layers of the plurality of transparent insulating layers,
the first sensor electrode includes a first electrode portion overlapping the display portion, and at least one first connection portion not overlapping the display portion,
the first sensor electrodes are connected to the driver IC by a first lead wiring via a first contact hole through at least one transparent insulating layer of the plurality of transparent insulating layers,
the second sensor electrodes are connected to the second driving circuit by a second lead wiring via a second contact hole through at least one transparent insulating layer of the plurality of transparent insulating layers,
the first drawing wiring, and the second drawing wiring are disposed over the plurality of transparent insulating layers, and
the first contact hole and the second contact hole are covered with the sealing layer.

13. The touch panel display according to claim 12, wherein the plurality of transparent insulating layers comprises a first transparent insulating layer, a second transparent insulating layer, and a third transparent insulating layer,
the first sensor electrode is disposed between the first transparent insulating layer and the second transparent insulating layer,
the second sensor electrode is disposed between the second transparent insulating layer and the third transparent insulating layer, and
the contact hole is through the third transparent insulating layer.

14. The touch panel display according to claim 13, wherein the transparent substrate comprises the first transparent insulating layer, the second transparent insulating layer, and the third transparent insulating layer.

15. The touch panel display according to claim 12, wherein the first electrode portion and the second electrode portion have a lattice pattern, and the at least one first connection portion have a solid pattern.

16. The touch panel display according to claim 15, wherein the lattice pattern overlaps the plurality of scanning signal lines and the plurality of video signal lines.

17. The touch panel display according to claim 16, wherein each of the plurality of pixels includes a bottom emission type organic electroluminescence element.

18. The touch panel display according to claim 17, wherein openings of the lattice pattern are arranged to overlap the light emitting portions of the bottom emission type organic electroluminescence element of the plurality of pixels.

19. The touch panel display according to claim 15, wherein the first sensor electrode and the second sensor electrode are formed of at least one metal selected from aluminum (Al), titanium (Ti), molybdenum (Mo) and copper (Cu).

* * * * *